(12) United States Patent
Nakano et al.

(10) Patent No.: US 9,406,757 B2
(45) Date of Patent: *Aug. 2, 2016

(54) SEMICONDUCTOR DEVICE AND METHOD OF MANUFACTURING SEMICONDUCTOR DEVICE

(71) Applicant: ROHM CO., LTD., Kyoto (JP)

(72) Inventors: Yuki Nakano, Kyoto (JP); Ryota Nakamura, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/493,715

(22) Filed: Sep. 23, 2014

(65) Prior Publication Data

US 2015/0194492 A1    Jul. 9, 2015

Related U.S. Application Data

(60) Continuation of application No. 13/366,966, filed on Feb. 6, 2012, now Pat. No. 8,872,263, which is a division of application No. 12/654,620, filed on Dec. 24, 2009, now Pat. No. 8,188,538.

(30) Foreign Application Priority Data

Dec. 25, 2008  (JP) ................................. 2008-330318
Dec. 26, 2008  (JP) ................................. 2008-334480
Dec. 24, 2009  (JP) ................................. 2009-293362

(51) Int. Cl.
*H01L 29/16* (2006.01)
*H01L 29/78* (2006.01)
*H01L 29/423* (2006.01)
(Continued)

(52) U.S. Cl.
CPC ........ *H01L 29/1608* (2013.01); *H01L 29/4236* (2013.01); *H01L 29/42368* (2013.01); *H01L 29/66068* (2013.01); *H01L 29/7802* (2013.01); *H01L 29/7803* (2013.01); *H01L 29/7805* (2013.01); *H01L 29/7813* (2013.01);
(Continued)

(58) Field of Classification Search
CPC ..... H01L 29/16; H01L 29/161; H01L 29/165; H01L 29/45; H01L 29/7802; H01L 29/7803; H01L 29/7805; H01L 29/7813; H01L 29/42368; H01L 29/1608; H01L 29/78; H01L 29/423; H01L 29/4236
See application file for complete search history.

(56) References Cited

U.S. PATENT DOCUMENTS 5,466,971 A   11/1995   Higuchi
5,831,288 A   11/1998   Singh et al.
(Continued)

FOREIGN PATENT DOCUMENTS

CN   101174569 A   5/2008
JP   60-123060     7/1985
(Continued)

*Primary Examiner* — Davienne Monbleau
*Assistant Examiner* — Fazli Erdem
(74) *Attorney, Agent, or Firm* — Rabin & Berdo, P.C.

(57) ABSTRACT

The semiconductor device according to the present invention includes: a semiconductor layer of a first conductivity type made of SiC having an Si surface; a gate trench dug down from the surface of the semiconductor layer; a gate insulating film formed on a bottom surface and a side surface of the gate trench so that the ratio of the thickness of a portion located on the bottom surface to the thickness of a portion located on the side surface is 0.3 to 1.0; and a gate electrode embedded in the gate trench through the gate insulating film.

10 Claims, 38 Drawing Sheets

(51) Int. Cl.
*H01L 29/66* (2006.01)
*H01L 29/06* (2006.01)
*H01L 29/417* (2006.01)
*H01L 29/45* (2006.01)

(52) U.S. Cl.
CPC ....... *H01L29/0696* (2013.01); *H01L 29/41766* (2013.01); *H01L 29/45* (2013.01)

(56) References Cited

U.S. PATENT DOCUMENTS

| | | | |
|---|---|---|---|
| 6,228,720 | B1 | 5/2001 | Kitabatake et al. |
| 6,342,709 | B1 | 1/2002 | Sugawara et al. |
| 6,362,495 | B1* | 3/2002 | Schoen et al. ................... 257/77 |
| 6,599,644 | B1 | 7/2003 | Zekentes et al. |
| 6,649,973 | B2 | 11/2003 | Takaishi |
| 6,822,288 | B2 | 11/2004 | Hshieh et al. |
| 7,645,658 | B2 | 1/2010 | Nakamura et al. |
| 7,714,352 | B2 | 5/2010 | Shimoida et al. |
| 7,824,995 | B2 | 11/2010 | Endo et al. |
| 8,035,112 | B1 | 10/2011 | Cooper et al. |
| 8,044,434 | B2* | 10/2011 | Ohta et al. ..................... 257/194 |
| 8,415,250 | B2* | 4/2013 | Alptekin et al. ............... 438/666 |
| 8,487,318 | B2 | 7/2013 | Nakano |
| 8,623,752 | B2 | 1/2014 | Fujikawa et al. |
| 2002/0132473 | A1 | 9/2002 | Chiang et al. |
| 2002/0175383 | A1 | 11/2002 | Kocon et al. |
| 2004/0079989 | A1 | 4/2004 | Kaneko et al. |
| 2004/0145011 | A1 | 7/2004 | Hsu et al. |
| 2004/0217358 | A1 | 11/2004 | Kaneko |
| 2005/0012143 | A1 | 1/2005 | Tanaka et al. |
| 2005/0045892 | A1 | 3/2005 | Hayashi et al. |
| 2005/0062048 | A1* | 3/2005 | Hayashi et al. ................ 257/77 |
| 2005/0077569 | A1 | 4/2005 | Yamashita et al. |
| 2005/0133794 | A1 | 6/2005 | Hayashi et al. |
| 2005/0167742 | A1* | 8/2005 | Challa et al. .................. 257/328 |
| 2005/0173739 | A1 | 8/2005 | Kusumoto et al. |
| 2005/0199873 | A1 | 9/2005 | Tanaka et al. |
| 2005/0199953 | A1 | 9/2005 | Kawamura et al. |
| 2005/0218472 | A1 | 10/2005 | Okada et al. |
| 2006/0267090 | A1* | 11/2006 | Sapp ................ H01L 29/7827 257/341 |
| 2006/0273382 | A1 | 12/2006 | Hshieh |
| 2007/0007537 | A1 | 1/2007 | Ogura et al. |
| 2007/0138545 | A1 | 6/2007 | Lin et al. |
| 2007/0138548 | A1 | 6/2007 | Kocon et al. |
| 2007/0181886 | A1 | 8/2007 | Shimoida et al. |
| 2007/0241338 | A1* | 10/2007 | Yamamoto et al. ............. 257/77 |
| 2007/0262324 | A1 | 11/2007 | Kaneko |
| 2008/0081422 | A1 | 4/2008 | Kobayashi et al. |
| 2008/0099768 | A1 | 5/2008 | Scarsbrook et al. |
| 2008/0102585 | A1 | 5/2008 | Nakamura et al. |
| 2008/0197361 | A1 | 8/2008 | Ueno |
| 2008/0197407 | A1* | 8/2008 | Challa ................ H01L 21/3065 257/330 |
| 2008/0203402 | A1 | 8/2008 | Endo et al. |
| 2008/0246086 | A1 | 10/2008 | Korec et al. |
| 2009/0032821 | A1* | 2/2009 | Onose et al. .................... 257/77 |
| 2009/0066589 | A1 | 3/2009 | Yamazaki et al. |
| 2009/0072301 | A1* | 3/2009 | Bhalla ................ H01L 29/407 257/328 |
| 2009/0140262 | A1 | 6/2009 | Ohki et al. |
| 2009/0140326 | A1* | 6/2009 | Konstantinov ...... H01L 29/7828 257/328 |
| 2009/0140327 | A1 | 6/2009 | Hirao et al. |
| 2009/0179264 | A1* | 7/2009 | Korec ................ H01L 27/0727 257/336 |
| 2009/0212359 | A1* | 8/2009 | Hsieh ................ H01L 29/1095 257/331 |
| 2009/0272982 | A1* | 11/2009 | Nakamura et al. .............. 257/77 |
| 2009/0283776 | A1* | 11/2009 | Iwamuro ......................... 257/76 |
| 2009/0315106 | A1 | 12/2009 | Hsieh |
| 2009/0315107 | A1 | 12/2009 | Hsieh |
| 2010/0006861 | A1* | 1/2010 | Yamamoto et al. ............. 257/77 |
| 2010/0025730 | A1 | 2/2010 | Heikman et al. |
| 2010/0052014 | A1 | 3/2010 | Matsushita |
| 2010/0102331 | A1 | 4/2010 | Fujikawa et al. |
| 2010/0193796 | A1 | 8/2010 | Nakano |
| 2010/0193799 | A1 | 8/2010 | Nakano et al. |
| 2010/0224884 | A1 | 9/2010 | Seki et al. |
| 2010/0224886 | A1* | 9/2010 | Iwamuro ......................... 257/77 |
| 2011/0042727 | A1* | 2/2011 | Pan ................ H01L 29/1037 257/281 |
| 2011/0175111 | A1 | 7/2011 | Harada et al. |
| 2011/0207321 | A1 | 8/2011 | Fujiwara et al. |
| 2012/0012861 | A1 | 1/2012 | Nakano et al. |
| 2012/0049202 | A1 | 3/2012 | Nakano |
| 2013/0119483 | A1* | 5/2013 | Alptekin et al. ............... 257/408 |
| 2013/0234159 | A1* | 9/2013 | Tsuchiya ......................... 257/77 |
| 2013/0285072 | A1 | 10/2013 | Iwamuro |
| 2014/0015019 | A1 | 1/2014 | Okamoto et al. |

FOREIGN PATENT DOCUMENTS

| | | |
|---|---|---|
| JP | 60-169169 | 9/1985 |
| JP | 63-229852 A | 9/1988 |
| JP | H1-094672 A | 4/1989 |
| JP | 03-163832 | 7/1991 |
| JP | H06-077163 A | 3/1994 |
| JP | H10-098188 A | 4/1998 |
| JP | 2000-312003 A | 11/2000 |
| JP | 2001-119025 A | 4/2001 |
| JP | 2003-318388 A | 11/2003 |
| JP | 2004-031471 A | 1/2004 |
| JP | 2005-101255 A | 4/2005 |
| JP | 2005-183563 A | 7/2005 |
| JP | 2005-285913 A | 10/2005 |
| JP | 2006-066770 A | 3/2006 |
| JP | 2006-332358 A | 12/2006 |
| JP | 2007-214355 A | 8/2007 |
| JP | 2007-258465 A | 10/2007 |
| JP | 2008-017237 A | 1/2008 |
| JP | 2008-117923 A | 5/2008 |
| JP | 2008-530800 A | 8/2008 |
| JP | 2008-244455 A | 10/2008 |
| JP | 2009-088326 A | 4/2009 |
| JP | 2009-135360 A | 6/2009 |
| JP | 2010-171417 A | 8/2010 |
| WO | WO-2006/086636 A2 | 8/2006 |

* cited by examiner

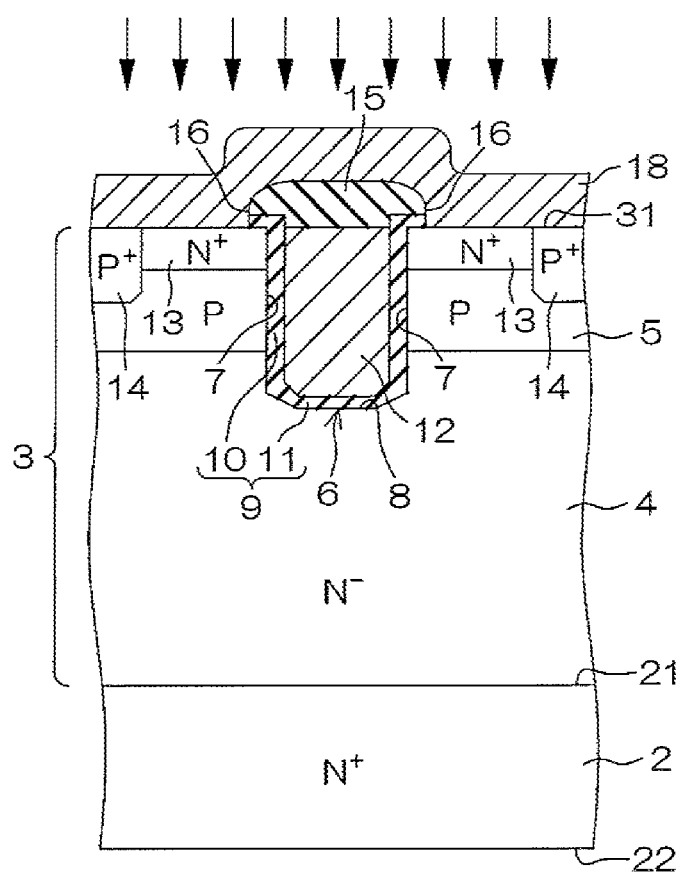

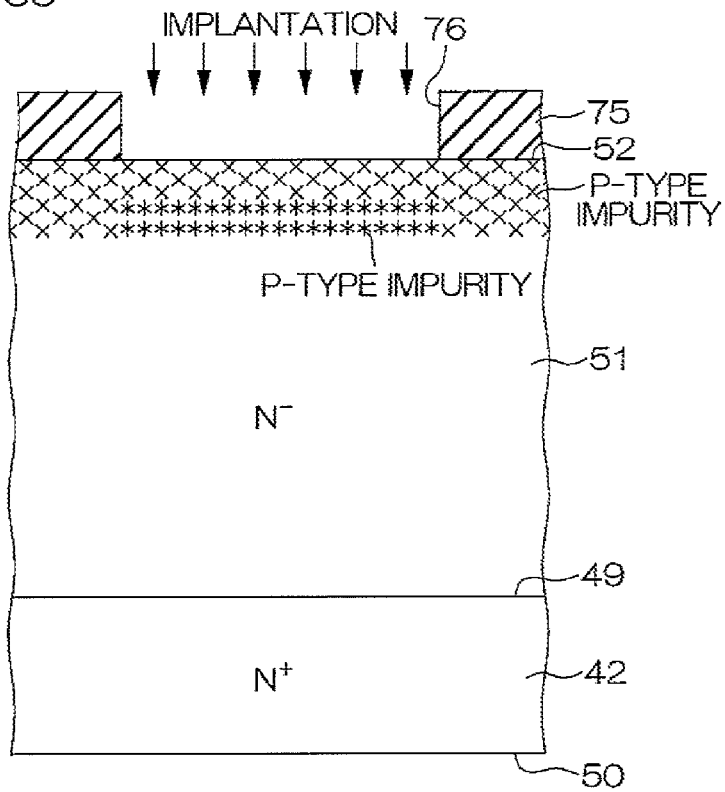
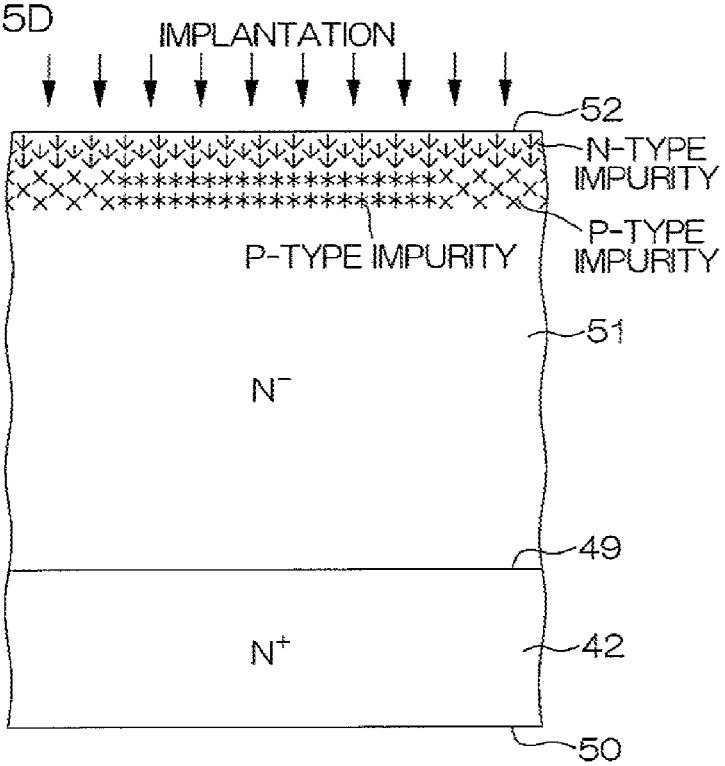

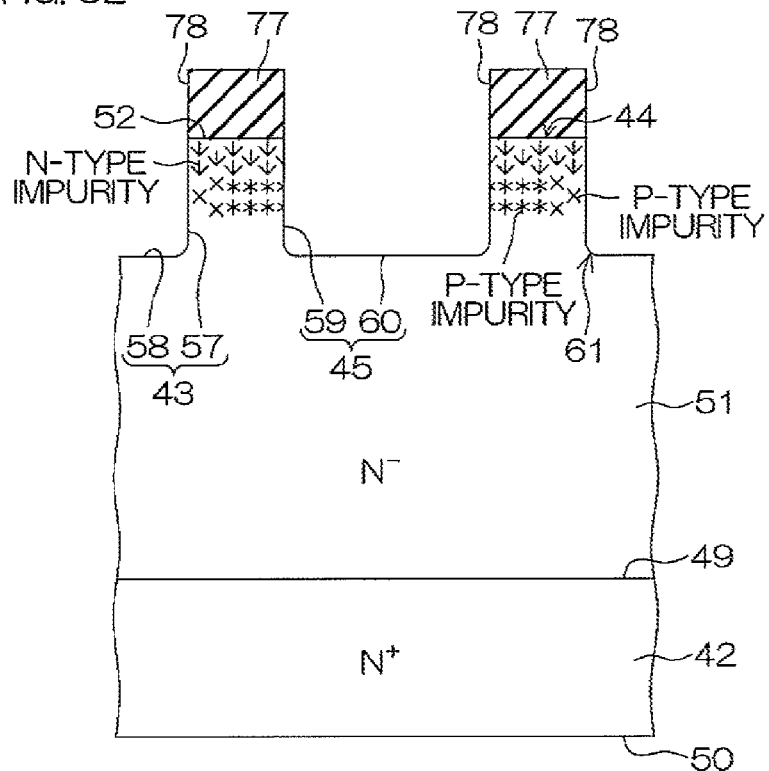
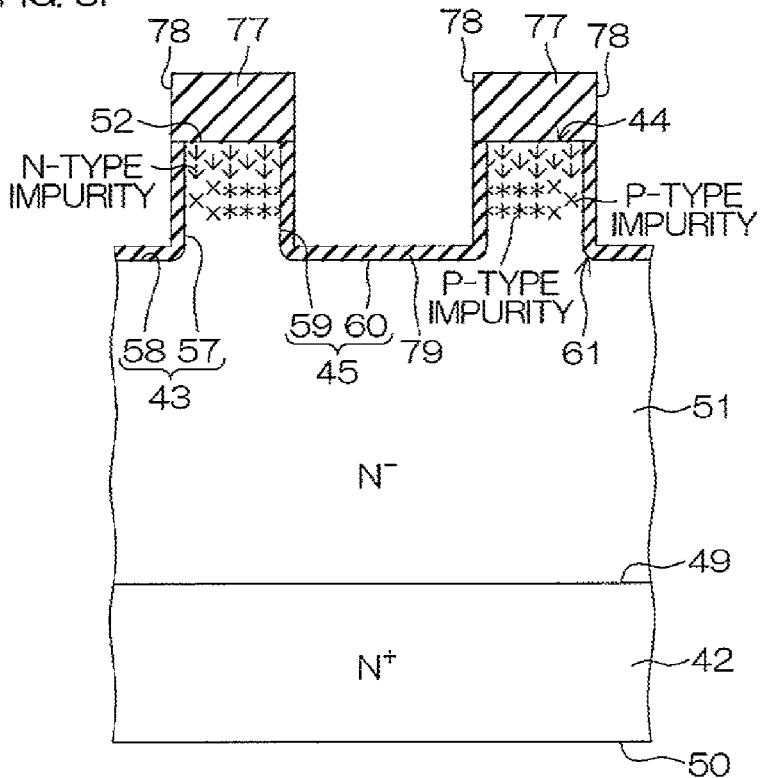

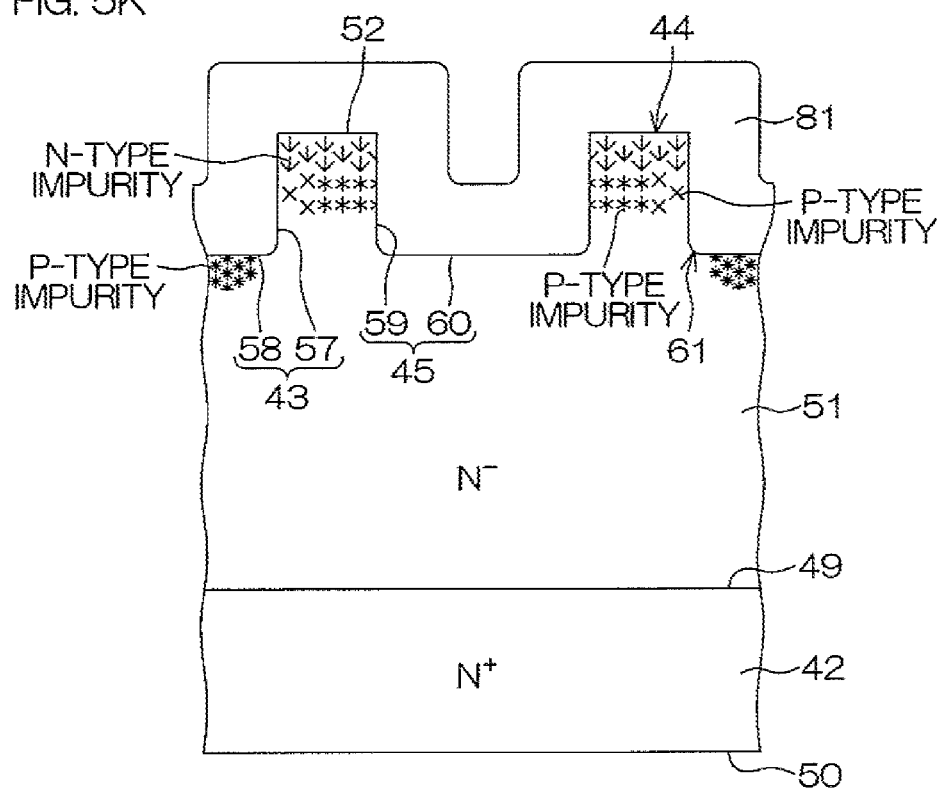

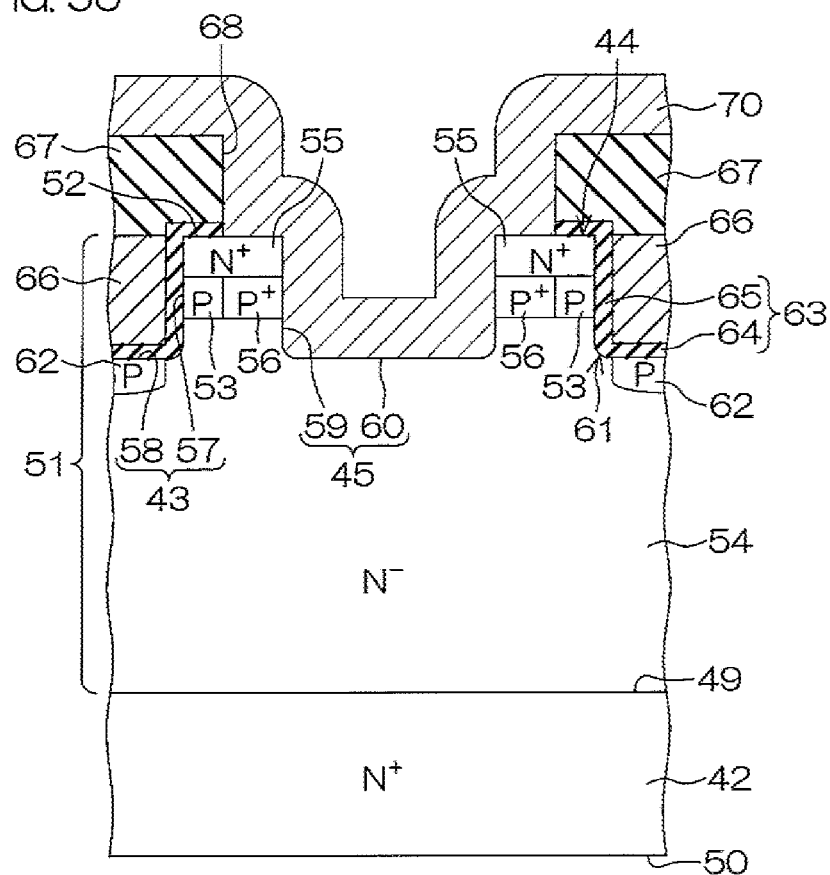

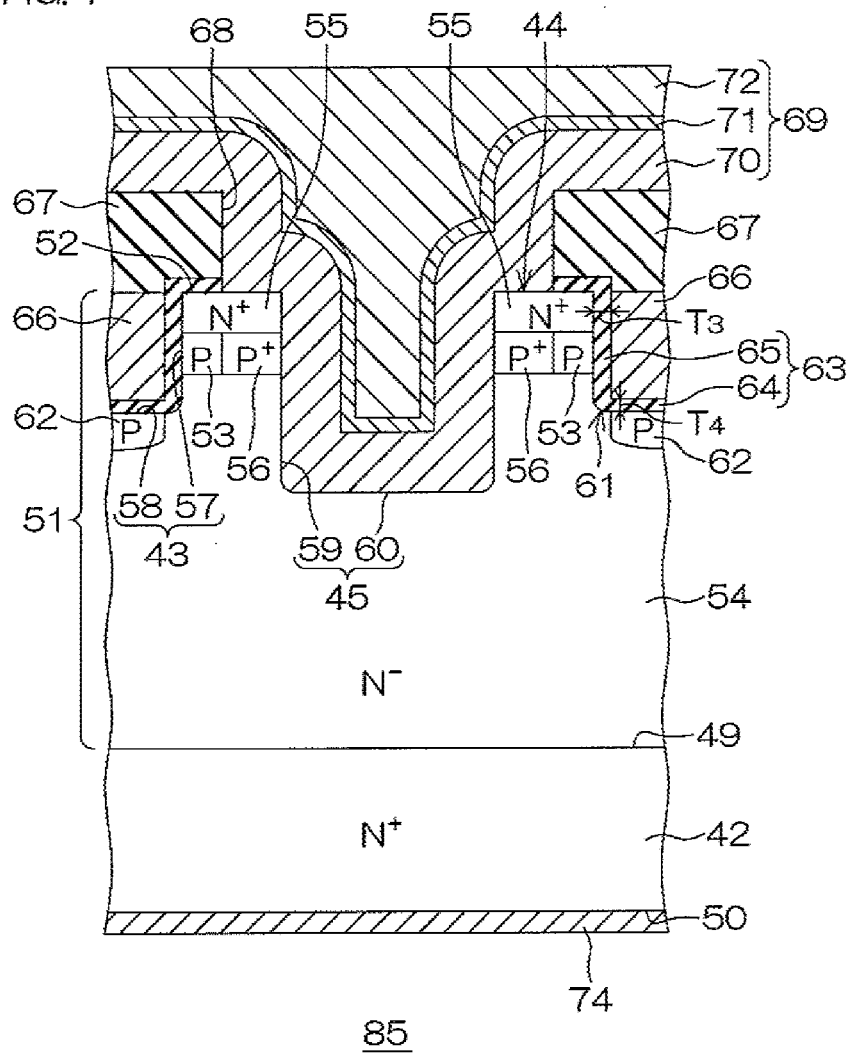

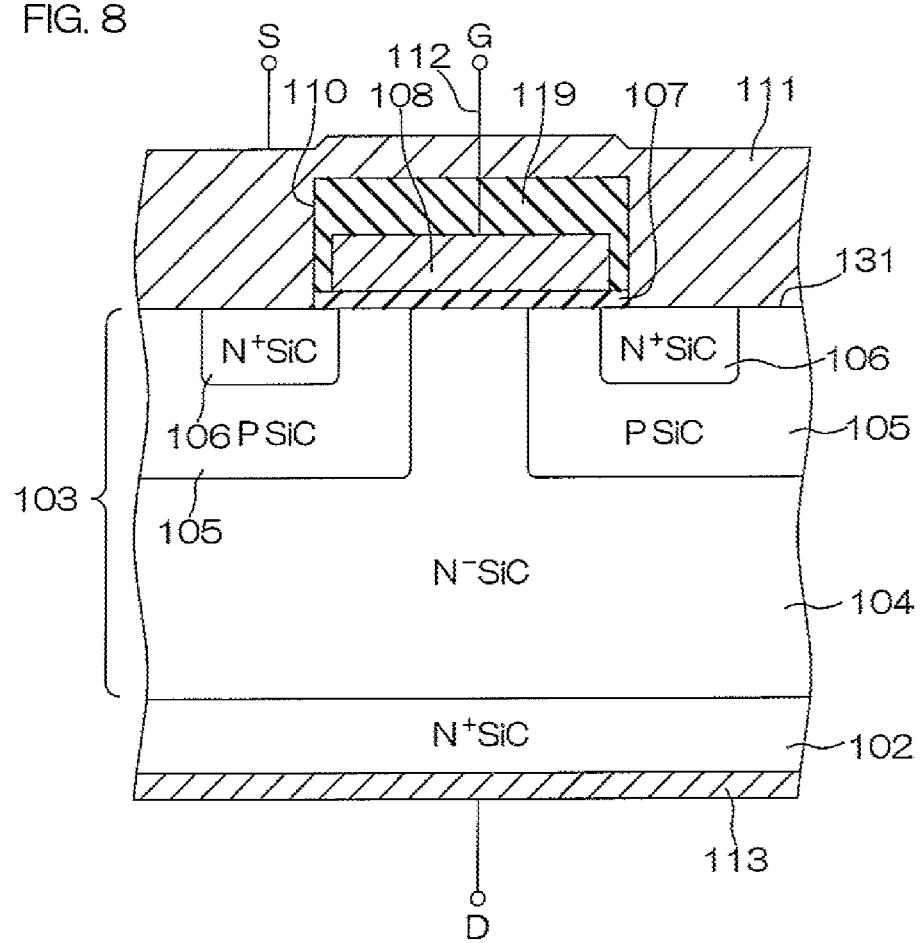

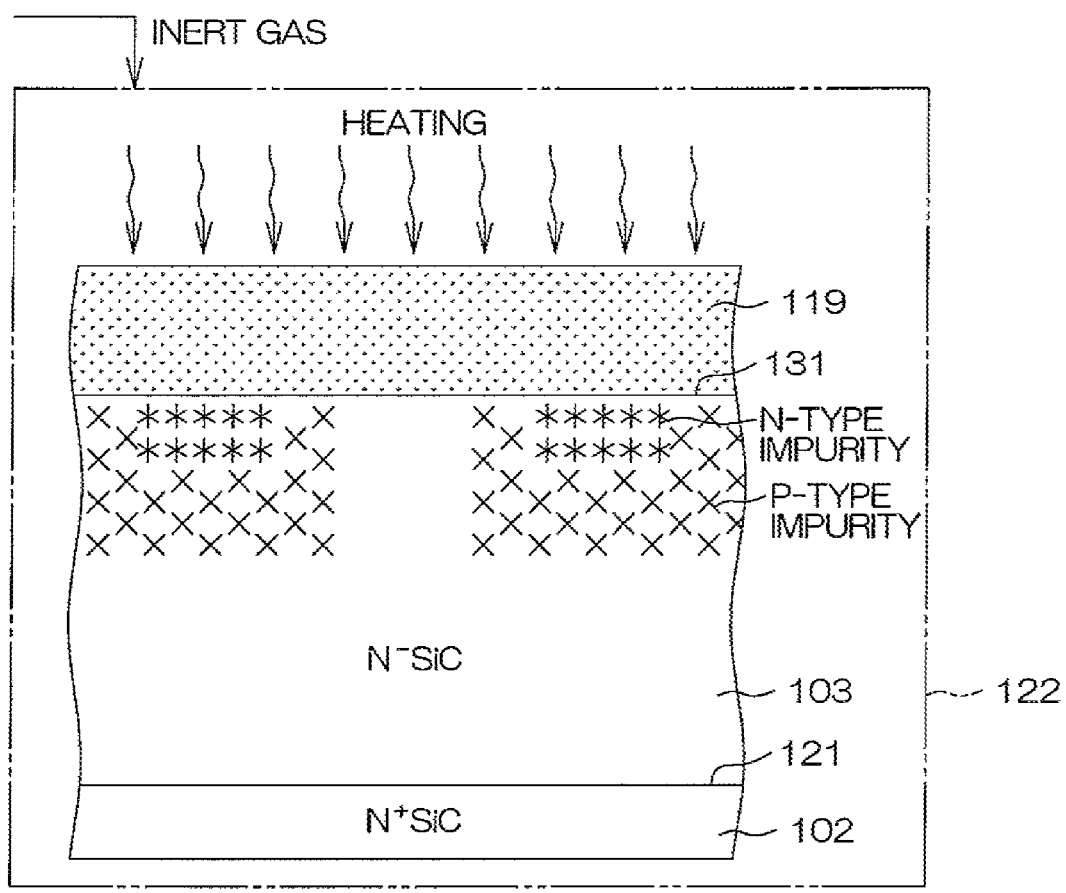

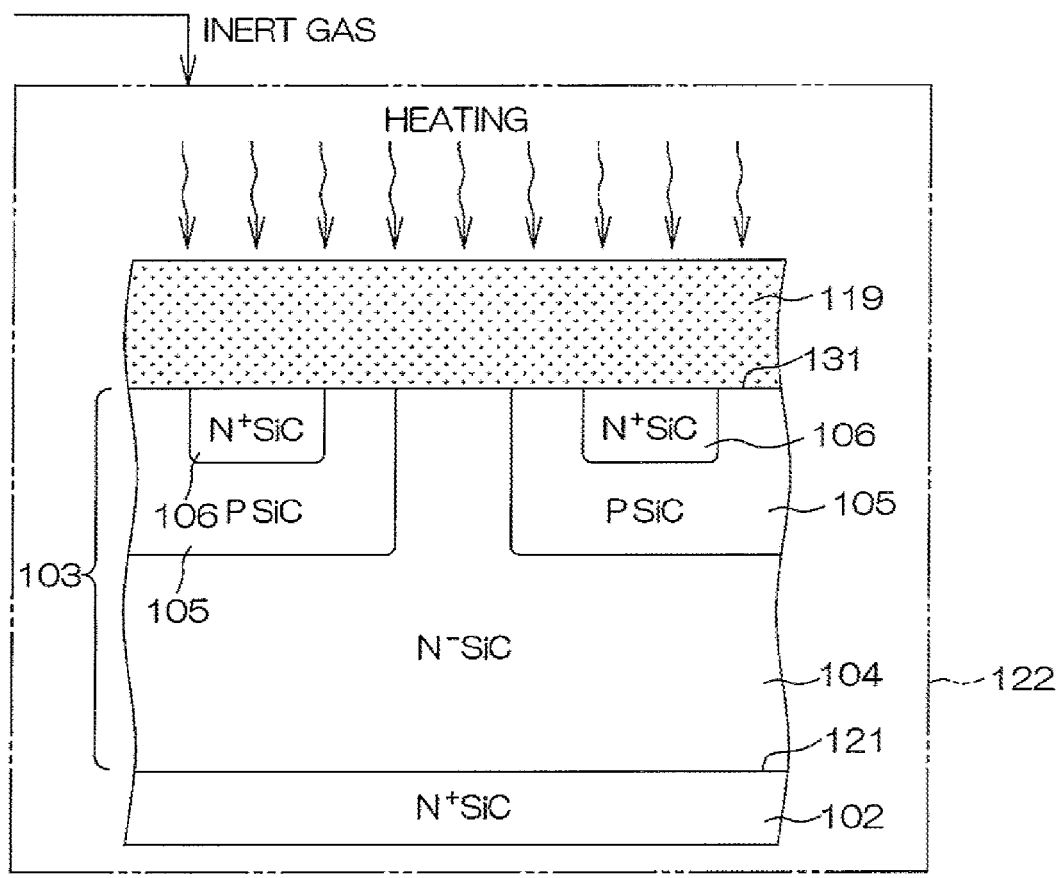

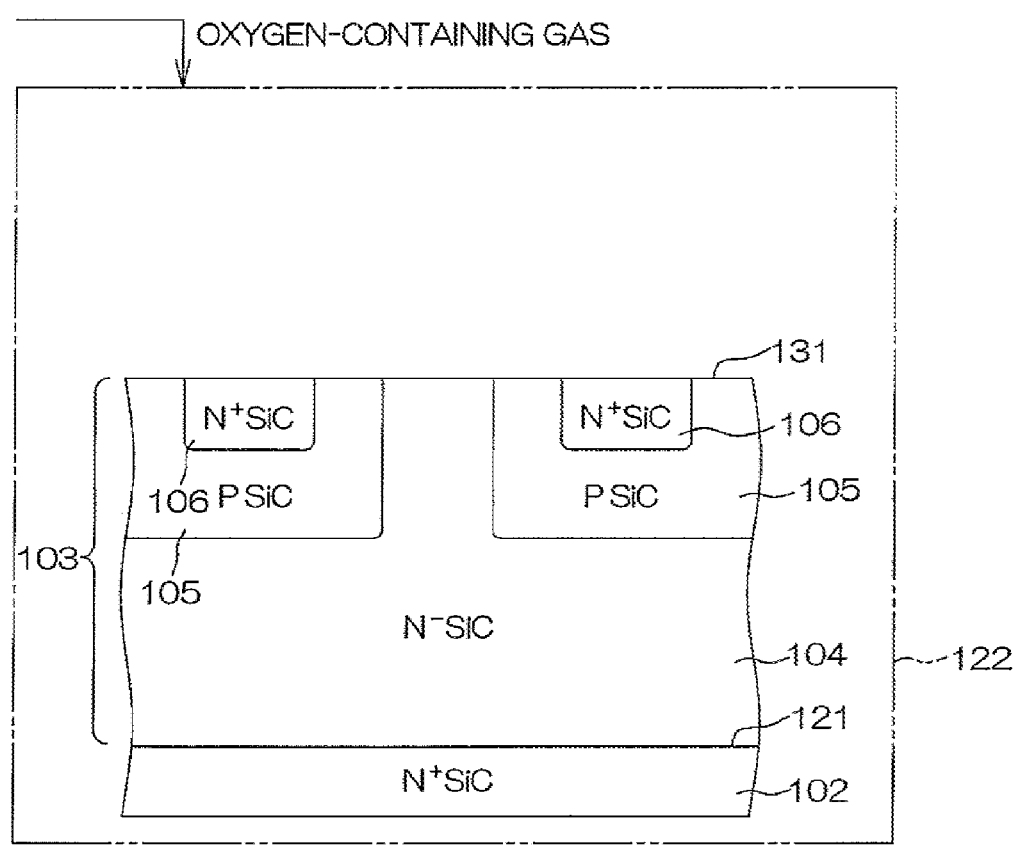

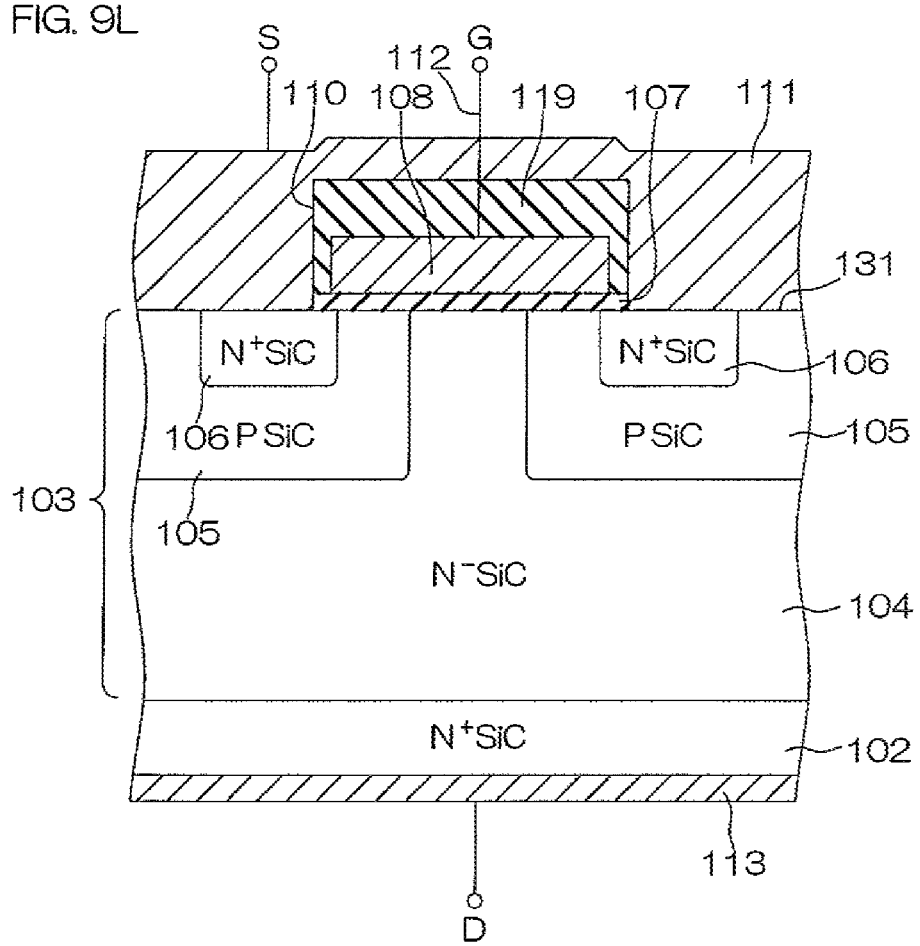

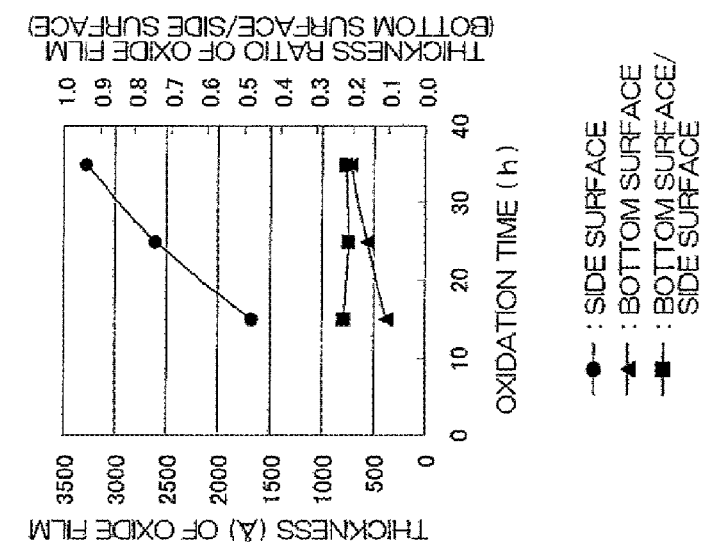
FIG. 10A  EXAMPLE 1 (1275°C N2O OXIDATION)
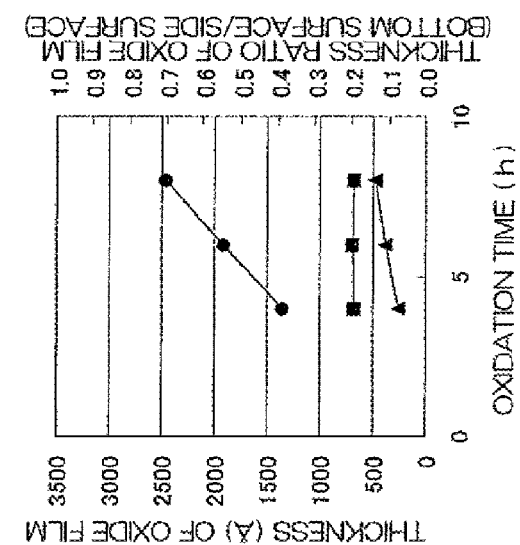
FIG. 10B  COMPARATIVE EXAMPLE 1 (1150°C Dry OXIDATION)
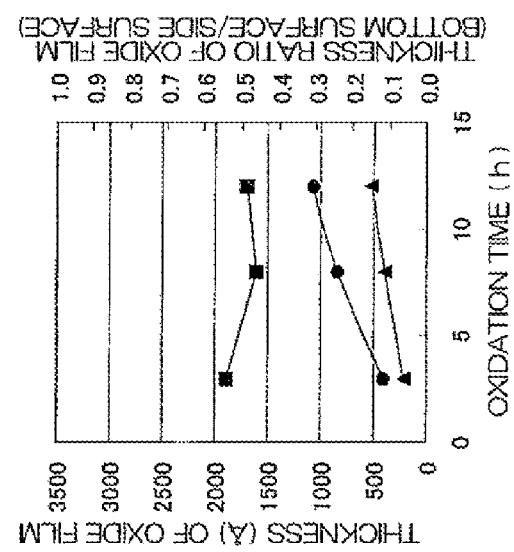
FIG. 10C  COMPARATIVE EXAMPLE 2 (1275°C WET OXIDATION)

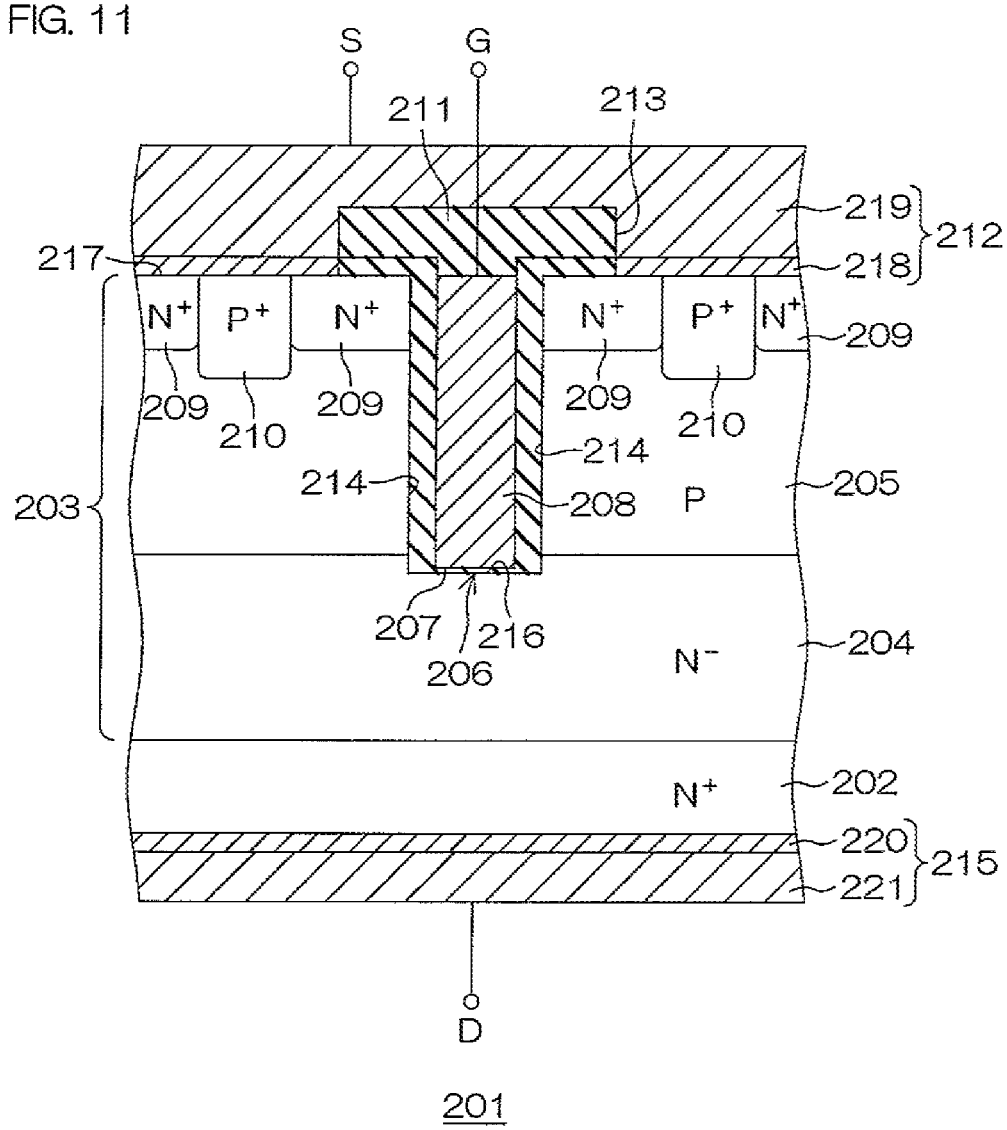

SEMICONDUCTOR DEVICE AND METHOD OF MANUFACTURING SEMICONDUCTOR DEVICE

CROSS-REFERENCE TO RELATED APPLICATION

This application is a continuation of application Ser. No. 13/366,966, filed on Feb. 6, 2012, which is a divisional of application Ser. No. 12/654,620, filed on Dec. 24, 2009. Furthermore, this application claims the benefit of priority of Japanese applications 2008-330318, filed on Dec. 25, 2008, 2008-334480, filed on Dec. 26, 2008 and 2009-293362, filed on Dec. 24, 2009. The disclosures of these prior U.S. and Japanese applications are incorporated herein by reference.

BACKGROUND OF THE INVENTION

1. Field of the Invention

The present invention relates to a semiconductor device employing SiC and a method of manufacturing the same.

2. Description of Related Art

In recent years, employment of SiC (silicon carbide) as the next-generation power device material implementing low on-resistance has been examined.

A trench gate structure is known as a structure for refining a power device and reducing on-resistance. For example, a power MOSFET employing the trench gate structure is increasingly forming the mainstream.

FIG. 11 is a schematic sectional view of a conventional semiconductor device having a trench gate VDMOSFET employing SiC.

A semiconductor device 201 has a structure obtained by arranging a plurality of unit cells of a trench gate VDMOSFET in the form of a matrix.

The semiconductor device 201 includes an $N^+$-type SiC substrate 202 forming the base of the semiconductor device 201. An $N^-$-type epitaxial layer 203 made of SiC (silicon carbide) doped with an N-type impurity in a lower concentration than the SiC substrate 202 is laminated on an Si surface (a silicon surface) of the SiC substrate 202. A base layer portion of the epitaxial layer 203 forms an $N^-$-type drain region 204 maintaining a state after epitaxy. In the epitaxial layer 203, a P-type body region 205 is formed on the drain region 204 in contact with the drain region 204.

A gate trench 206 is dug down in the epitaxial layer 203 from a surface 217 (an Si surface) thereof. The gate trench 206 passes through the body region 205 in the thickness direction, and the deepest portion (a bottom surface 216) thereof reaches the drain region 204.

In the gate trench 206, a gate insulating film 207 made of $SiO_2$ is formed on the overall regions of the inner surfaces of the gate trench 206 by thermally oxidizing side surfaces 214 and the bottom surface 216 of the gate trench 206.

A gate electrode 208 is embedded in the gate trench 206 by filling up the inner side of the gate insulating film 207 with a polysilicon material doped with an N-type impurity in a high concentration.

On a surface layer portion of the epitaxial layer 203, $N^+$-type source regions 209 are formed on both sides of the gate trench 206 in a direction (the right-and-left direction in FIG. 11) orthogonal to the gate width. The source regions 209 extend along the gate trench 206 in a direction along the gate width, and bottom portions thereof are in contact with the body region 205 from the side of the surface 217 of the epitaxial layer 203.

The epitaxial layer 203 is further provided with $P^+$-type body contact regions 210 passing through central portions of the source regions 209 in the direction orthogonal to the gate width from the surface 217 thereof to be connected to the body region 205.

An interlayer dielectric film 211 made of $SiO_2$ is laminated on the epitaxial layer 203. A source wire 212 is formed on the interlayer dielectric film 211. The source wire 212 has a nickel silicide layer 218 in contact with the source regions 209 and the body contact regions 210 through a contact hole 213 formed in the interlayer dielectric film 211 and an aluminum layer 219 formed on the nickel silicide layer 218.

A drain wire 215 is formed on the rear surface (a carbon surface: a C surface) of the SiC substrate 202. The drain wire 215 has a nickel silicide layer 220 in contact with the SiC substrate 202 and an aluminum layer 221 formed on the nickel silicide layer 220.

A prescribed voltage (a voltage of not less than a gate threshold voltage) is applied to the gate electrode 208 while a prescribed potential difference is caused between the source wire 212 and the drain wire 215 (between a source and a drain), whereby a channel is formed in the vicinity of the interface between the body region 205 and the gate insulating film 207 due to an electric field from the gate electrode 208. Thus, a current flows between the source wire 212 and the drain wire 215, and the VDMOSFET is turned on.

SUMMARY OF THE INVENTION

The surface 217 of the epitaxial layer 203 is the Si surface, and hence the bottom surface 216 of the gate trench 206 dug down from the surface 217 is also an Si surface.

When the gate insulating film 207 is formed by dry oxidation or wet oxidation, therefore, the ratio (oxidation rate for bottom surface 216/oxidation rate for side surface 214) of the oxidation rate for the bottom surface 216 to that for the side surfaces 214 is 0.2 or less. In the gate insulating film 207, therefore, the thickness of a portion located on the bottom surface 216 is smaller than that of portions located on the side surfaces 214.

When the VDMOSFET is turned off in the semiconductor device 201, on the other hand, a high potential difference is caused between the gate electrode 208 and the drain wire 215 (between a gate and a drain), and an electric field concentrates on the bottom surface 216 of the gate trench 206. When the portion of the gate insulating film 207 located on the bottom surface 216 has a small thickness as described above, dielectric breakdown is easily caused due to the concentration of the electric field.

Therefore, the thickness of the portion located on the bottom surface 216 may be increased by lengthening the oxidation time for forming the gate insulating film 207. However, oxidation of the side surfaces 214 progresses in parallel with the oxidation of the bottom surface 216, and hence the thickness of the portions located on the side surfaces 214 is remarkably increased due to the aforementioned difference between the oxidation rates.

An object of the present invention is to provide a semiconductor device capable of suppressing dielectric breakdown of a portion located on the bottom surface of a gate trench while suppressing increase in the thickness of portions located on the side surfaces of the gate trench and a method of manufacturing the same.

The foregoing and other objects, features and effects of the present invention will become more apparent from the fol-

BRIEF DESCRIPTION OF THE DRAWINGS

FIG. 7 is a schematic sectional view for illustrating a modification of the semiconductor device shown in FIG. 4.

FIG. 8 is a schematic sectional view of a planar gate semiconductor device.

FIGS. 9A to 9L are schematic sectional views for illustrating a method of manufacturing the semiconductor device shown in FIG. 8 in step order.

FIGS. 10A, 10B and 10C are graphs of thicknesses of oxide films plotted every feeding time for oxidizing gas in Example 1, comparative example 1 and comparative example 2 respectively.

FIG. 11 is a schematic sectional view of a conventional semiconductor device having a trench gate VDMOSFET employing SiC.

DETAILED DESCRIPTION OF PREFERRED EMBODIMENTS

Figure 1:
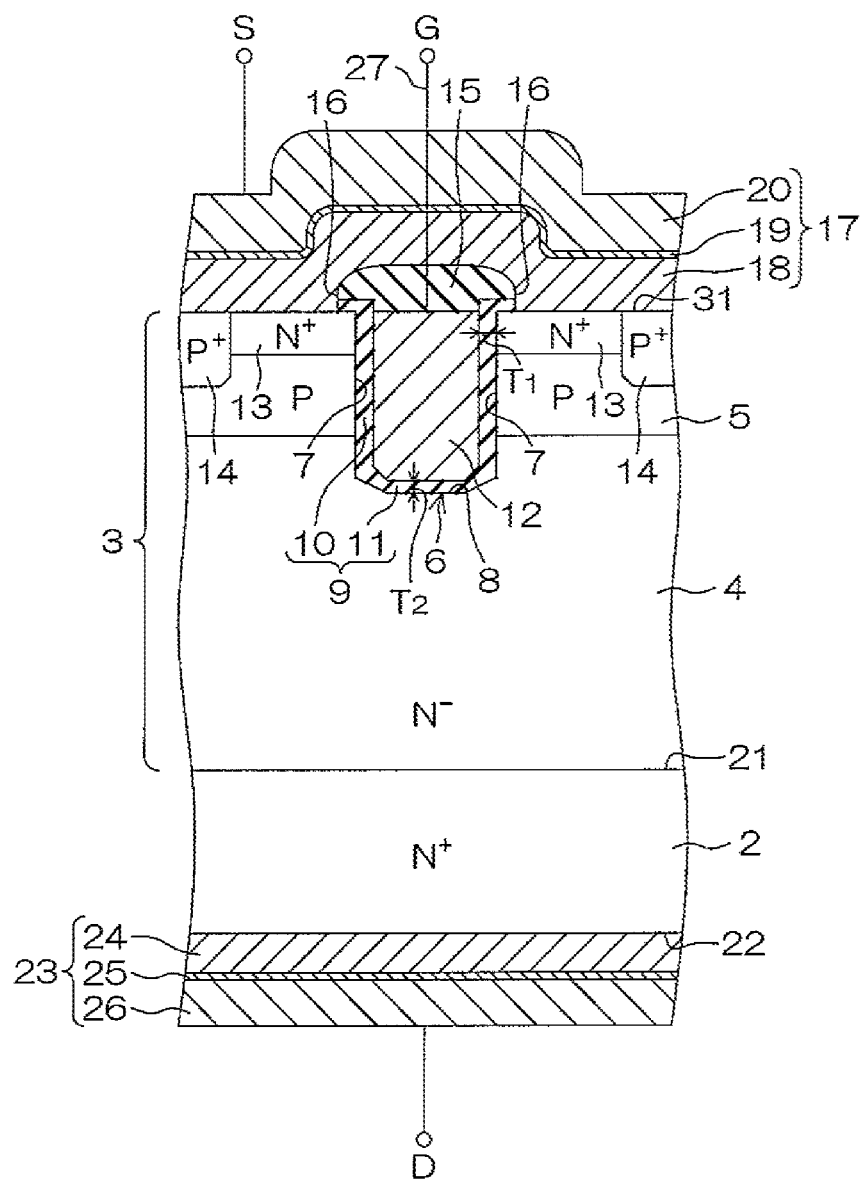
FIG. 1 is a schematic sectional view of a semiconductor device according to a first embodiment of the present invention.

A semiconductor device according to an embodiment of the present invention includes: a semiconductor layer of a first conductivity type made of SiC having an Si surface; a gate trench dug down from the surface of the semiconductor layer; a gate insulating film formed on a bottom surface and a side surface of the gate trench so that the ratio of the thickness of a portion located on the bottom surface to the thickness of a portion located on the side surface is 0.3 to 1.0; and a gate electrode embedded in the gate trench through the gate insulating film.

According to the structure, the gate trench is dug down from the surface of the semiconductor layer of the first conductivity type made of SiC having the Si surface. The gate insulating film is formed on the bottom surface and the side surface of the gate trench. The gate electrode is embedded in the gate trench through the gate insulating film.

Thus, a trench gate MOSFET having such a MOS (Metal Oxide Semiconductor) structure that the gate electrode (Metal) is opposed to the semiconductor layer (Semiconductor) through the portion (Oxide) of the gate insulating film located on the side surface of the gate trench is formed in the semiconductor device.

In the MOSFET, the ratio of the thickness of the portion of the gate insulating film located on the bottom surface to the thickness of the portion located on the side surface is 0.3 to 1.0. Even if the thickness of the portion located on the bottom surface is increased so that dielectric breakdown can be suppressed, excessive increase in the thickness of the portion located on the side surface can be suppressed due to the lower limit of 0.3 of the ratio (thickness of portion located on bottom surface/thickness of portion located on side surface). When the thickness of the portion located on the bottom surface is designed to a proper value, on the other hand, the thickness of the portion located on the side surface is not excessively reduced, due to the upper limit of 1.0. Consequently, dielectric breakdown of the portion located on the bottom surface can be suppressed while suppressing increase in the thickness of the portion located on the side surface by properly designing the thickness of the portion located on the bottom surface.

Preferably, the semiconductor device further includes a body region of a second conductivity type formed in the semiconductor layer on a side portion of the gate trench and in contact with the gate insulating film on the side surface of the gate trench and a source region of a first conductivity type formed on a surface layer portion of the body region adjacently to the gate trench, and the gate insulating film contains nitrogen.

According to the structure, the body region of the second conductivity type in contact with the gate insulating film on the side surface of the gate trench is formed in the semiconductor layer on the side portion of the gate trench. On the surface layer portion of the body region, the source region of the first conductivity type is formed adjacently to the gate trench. In the trench gate MOSFET in the semiconductor device, therefore, a portion in the vicinity of the interface between the body region and the gate insulating film is a channel portion in which a channel is formed due to an electric field from the gate electrode. In the semiconductor device, the gate insulating film contains nitrogen, whereby channel mobility of the MOSFET can be improved.

Preferably in the semiconductor device, the concentration of an impurity of the second conductivity type in the body region is not more than $10^{19}$ cm$^{-3}$.

If the impurity concentration in the body region on the side portion of the gate trench is in excess of $10^{19}$ cm$^{-3}$, the side surface of the trench is oxidized at a relatively extremely high oxidation rate with respect to the bottom surface of the trench when the bottom surface and the side surface of the gate trench are oxidized, and the portion of the gate insulating film located on the side surface is remarkably thickened.

When the impurity concentration in the body region is not more than $10^{19}$ cm$^{-3}$, on the other hand, the ratio of the oxidation rate for the side surface of the trench to the oxidation rate for the bottom surface of the trench can be maintained at a proper value when the bottom surface and the side surface of the gate trench are oxidized. Consequently, increase in the thickness of the portion of the gate insulating film located on the side surface can be suppressed.

Preferably, the semiconductor device further includes an implantation layer formed by implantation of an impurity in a portion of the semiconductor layer reaching an intermediate portion of the semiconductor layer in the thickness direction from the bottom surface of the gate trench.

The implantation layer is so formed immediately under the bottom surface of the gate trench that the ratio of the thickness of the portion of the gate insulating film located on the bottom surface to the thickness of the portion located on the side surface can be set to 0.3 to 1.0 by oxidizing the bottom surface of the trench at a relatively high oxidation rate with respect to the side surface of the trench when the bottom surface and the side surface of the gate trench are oxidized after the formation of the implantation layer.

Preferably, the implantation layer is formed by implantation of an impurity of the second conductivity type.

When the implantation layer is formed by implantation of the impurity of the second conductivity type different from the conductivity type of the semiconductor layer, an energy barrier formed between the implantation layer and the semiconductor layer can be enlarged. Therefore, a current can be rendered hardly flowable to the implantation layer. Consequently, the electric field concentration on the bottom surface of the gate trench can be suppressed.

Preferably in the semiconductor device, the thickness of the portion of the gate insulating film located on the side surface of the gate trench is not more than 2000 Å.

If the thickness of the portion located on the side surface of the gate trench is in excess of 2000 Å, the semiconductor device must be operated with a high gate-on voltage (about 20 V, for example), and an efficient transistor operation may not be executable.

When the thickness of the portion located on the side surface of the gate trench is not more than 2000 Å, on the other hand, the semiconductor device can be operated with a proper gate-on voltage, and an efficient transistor operation can be achieved.

Preferably, an end portion of the bottom portion of the gate trench in a direction orthogonal to the gate width is bent outward.

According to the structure, the end portion of the bottom portion of the gate trench on which an electric field easily concentrates at a turn-off time is so bent that the electric field applied to the end portion can be dispersed to portions other than the end portion. Consequently, dielectric breakdown of the portion of the gate insulating film located on the bottom surface can be suppressed.

Preferably, the semiconductor device further includes a source wire formed on the semiconductor layer and in contact with the source region, and the source wire has a polysilicon layer in the portion in contact with the source region, and has a metal layer on the polysilicon layer.

In order to form the source wire 212 in the semiconductor device 201 shown in FIG. 11, for example, Ni is first deposited by sputtering on the surfaces (the surfaces of the source regions 209 and the body contact regions 210) of regions (impurity regions) of the epitaxial layer 203 doped with impurities. Then, Ni is silicified by reacting with Si contained in SiC through a heat treatment at a high temperature (about 1000° C., for example), to be brought into ohmic contact with the impurity regions. Thus, the nickel silicide layer 218 is formed. Thereafter Al is deposited on the nickel silicide layer 218 by sputtering. Thus, the aluminum layer 219 is formed, to form the source wire 212.

When the nickel silicide layer 218 is formed, however, carbon (C) remaining in SiC is deposited on the surface of the nickel silicide layer 218 and in the vicinity of the interface between the nickel silicide layer 218 and the impurity regions, to form a carbon layer containing a large quantity of C. The carbon layer is so poor in adhesiveness to a metal or SiC that the nickel silicide layer 218 is easily peeled from the aluminum layer 219 or the impurity regions.

Preferably in the semiconductor device, therefore, the source wire brought into contact with the source region has the polysilicon layer in the portion in contact with the source region, and has the metal layer on the polysilicon layer.

Polysilicon can form excellent ohmic contact with the region (the impurity region) of SiC doped with the impurity. Therefore, silicification indispensable for a structure having a metal layer directly in contact with a source region can be omitted. Thus, formation of a carbon layer can be prevented on the surface of the polysilicon layer and in the vicinity of the interface between the polysilicon layer and the source region. Consequently, layer peeling can be suppressed between the polysilicon layer and the metal layer as well as between the polysilicon layer and the source region. Thus, connection reliability of the source wire can be improved.

Preferably in the semiconductor device, an intermediate layer containing Ti is interposed between the polysilicon layer and the metal layer.

A material containing titanium has excellent adhesiveness with respect to both of a polysilicon material and a metal material. In the semiconductor device having the layer containing titanium interposed between the polysilicon layer and the metal layer, therefore, adhesiveness between the polysilicon layer and the metal layer can be improved. Consequently, the connection reliability of the contact wire can be further improved.

Preferably in the semiconductor device, the metal layer has a layer containing Al, and the intermediate layer has a structure obtained by laminating a Ti layer and a TiN layer in this order from the side of the polysilicon layer.

While Al can be utilized as an impurity for providing the polysilicon layer with conductivity, the resistance of the polysilicon layer utilized as the source wire may be unstabilized unless Al is mixed into the polysilicon layer in a proper quantity.

In the structure of the semiconductor device, therefore, the TiN layer is interposed between the layer containing Al and the polysilicon layer, as a barrier layer for preventing diffusion of Al into the polysilicon layer. Thus, no excessive Al diffuses into the polysilicon layer, whereby the impurity concentration in the polysilicon layer can be stabilized. Consequently, the resistance of the polysilicon layer can be stabilized.

A method of manufacturing a semiconductor device according to the embodiment of the present invention includes the steps of: forming a gate trench on a surface layer portion of a semiconductor layer of a first conductivity type made of SiC having an Si surface to be dug down from the surface; forming a gate insulating film on a bottom surface and a side surface of the gate trench by oxidizing the bottom surface and the side surface of the gate trench in gas containing nitrogen and oxygen at a heat treatment temperature of not less than 1200° C.; and forming a gate electrode on the gate insulating film to fill up the gate trench.

When the bottom surface and the side surface of the gate trench are oxidized under the conditions (the atmosphere gas and the heat treatment temperature) in the method, the ratio of the thickness of a portion of the gate insulating film located on the bottom surface to the thickness of a portion located on the side surface can be set to 0.3 to 1.0.

Preferably, the bottom surface and the side surface of the gate trench are oxidized in gas containing at least $N_2O$ in the step of forming the gate insulating film, and $N_2O$ gas is fed at a flow rate of not more than 30% with respect to the total flow rate of fed gas in the step of forming the gate insulating film.

The step of forming the gate insulating film may include the steps of charging the semiconductor layer into a resistance heating furnace, producing a nitrogen-and-oxygen-containing gas atmosphere by introducing gas containing nitrogen and oxygen into the resistance heating furnace, and controlling the heating temperature in the resistance heating furnace to not less than 1200° C. while maintaining the gas atmosphere.

The following is known as the background technique related to heating of a semiconductor layer made of SiC, for example:

More specifically, a MOSFET having a MOS (Metal Oxide Semiconductor) structure formed by an SiC layer having an activated ion region on a surface layer portion thereof, a gate oxide film formed on the surface of the SiC layer and a gate electrode formed on the gate oxide film and opposed to the ion region through the gate oxide film, for example, is known as a semiconductor device employing SiC.

In order to prepare such a MOS structure, impurity ions are first implanted into the surface layer portion of the SiC layer, for example. Then, the SiC layer is heated in a resistance heating furnace, whereby the implanted ions are activated. After the activation of the ions, the gate oxide film is formed on the surface of the SiC layer by feeding oxygen-containing gas in a CVD (Chemical Vapor Deposition) apparatus. Then, the gate electrode is formed on the gate oxide film by sputtering. Thus, a layered structure (the MOS structure) of the gate electrode (Metal), the gate oxide film (Oxide) and the SiC layer (Semiconductor) is produced.

In order to activate the ions in the SiC layer, the SiC layer must be annealed at a temperature of 1600 to 1700° C., for example. In the resistance heating furnace, it takes a long time to heat the SiC layer up to a high temperature range, and hence Si sublimates from the surface of the SiC layer by the so-called Si escape, to roughen the surface of the SiC layer. Consequently, the interface between the SiC layer and the gate oxide film is irregularized, to reduce channel mobility of the MOSFET.

Therefore, a technique of suppressing surface roughening of the SiC layer by utilizing a high-frequency induction heater for reducing the time for heating the SiC layer up to the high temperature range and thereafter forming the gate oxide film through a gate oxidation furnace is employed.

However, such a technique separately requires two apparatuses, i.e., the high-frequency induction heater and the gate oxidation furnace, and hence the device cost is disadvantageously increased.

Another technique of forming a carbon film on the surface of the SiC layer in advance of the activation of the ions and preventing the Si escape with the carbon film thereby maintaining planarity on the surface of the SiC layer is proposed.

The carbon film is prepared by forming a film containing carbon on the surface of the SiC layer and heating the film containing carbon in the high-frequency induction heater thereby evaporating elements other than carbon from the film, for example.

According to studies made by the inventors, however, a heating temperature for forming the carbon film may be about 1000° C., which is lower than the temperature (1600 to 1700° C.) for activating the ions. Therefore, the heating temperature must be controlled in two stages, while it has been recognized difficult to precisely temperature-control the high-frequency induction heater.

After the activation of the ions, the carbon film is no longer required. The unrequited carbon film is oxidized and removed with oxidizing gas in an apparatus different from the high-frequency induction heater. While the oxidizing gas may be introduced into the high-frequency induction heater to remove the carbon film subsequently to the activation of the ions, a carbon material is used for a heating element of the high-frequency induction heater and hence the carbon material is oxidized when fed with the oxidizing gas. Therefore, a carbon film removing apparatus is inevitably additionally required, to unavoidably increase the device cost.

In order to attain an object of providing a method of manufacturing a semiconductor device capable of suppressing roughening on the surface of an SiC layer through simple temperature control without increasing the device cost, the inventors have provided the following invention:

More specifically, the method of manufacturing a semiconductor device according to the invention includes the steps of forming an organic material film on the surface of an SiC layer having a surface layer portion into which ions have been implanted, altering the organic material film into a carbon film by heating the organic material in a resistance heating furnace after the formation of the organic material film, activating the ions in the SiC layer by heating the SiC layer provided with the carbon film in the resistance heating furnace, oxidizing and removing the carbon film by introducing oxygen-containing gas into the resistance heating furnace, and forming an oxide film by oxidizing the surface of the SiC layer with the oxygen-containing gas in the resistance heating furnace continuously after the removal of the carbon film.

According to the method, the organic material film is heated in the resistance heating furnace after the formation of the organic material film, whereby the organic material film is altered into the carbon film, and the carbon film is formed on the surface of the SiC layer. After the formation of the carbon film, the SiC layer is heated in order to activate the ions in the SiC layer. Thereafter the carbon film is oxidized and removed by introducing the oxygen-containing gas into the resistance heating furnace. After the removal of the carbon film, the surface of the SiC layer is oxidized with the oxygen-containing gas continuously in the resistance heating furnace, so that the surface of the SiC layer is oxidized with the oxygen-containing gas and the oxide film is formed.

The carbon film is formed on the surface of the SiC layer in advance of the heating for activating the ions, whereby Si escape from the surface of the SiC layer can be prevented when the SiC layer is heated. Therefore, roughening on the surface of the SiC layer can be suppressed, and planarity on the surface of the SiC layer can be maintained. Consequently, the interface between the SiC layer and the oxide film can be smoothed, whereby channel mobility of the semiconductor device can be improved.

Further, the four steps of altering the organic material film into the carbon film by heating the same, activating the ions by heating the SiC layer, oxidizing and removing the carbon film with the oxygen-containing gas, and forming the oxide film by oxidizing the surface of the SiC layer can be continuously carried out in a single resistance heating furnace. No apparatus for removing the carbon film or the like is additionally required, whereby increase in the device cost can also be suppressed. Further, the resistance heating furnace is so employed that the heating temperature for forming the carbon film and that for activating the ions can be precisely and simply controlled.

The oxygen-containing gas may be gas containing oxygen and nitrogen. When the oxygen-containing gas for forming the oxide film contains oxygen and nitrogen, the channel mobility of the semiconductor device can be further improved.

Gas containing NO (nitrogen monoxide), $N_2O$ (dinitrogen oxide) or the like, for example, can be employed as the gas containing oxygen and nitrogen.

Preferably, the surface of the SiC layer is defined by a (0001) plane, i.e., an Si surface.

As hereinabove described, the inventors have provided the invention utilizing the resistance heating furnace as the invention related to heating of the semiconductor layer made of SiC.

When the step of forming the gate insulating film includes the steps of charging the semiconductor layer into a resistance heating furnace, producing a nitrogen-and-oxygen-containing gas atmosphere by introducing gas containing nitrogen and oxygen into the resistance heating furnace, and controlling the heating temperature in the resistance heating furnace to not less than 1200° C. while maintaining the gas atmosphere, therefore, functions/effects of the aforementioned invention utilizing the resistance heating furnace can be attained in addition to those of the present invention.

Embodiments of the present invention are now described in detail with reference to the attached drawings.

FIG. 1 is a schematic sectional view of a semiconductor device according to a first embodiment of the present invention.

A semiconductor device 1 has a structure obtained by arranging a plurality of unit cells of a trench gate VDMOS-FET in the form of a matrix. FIG. 1 shows only part of the plurality of unit cells.

The semiconductor device 1 includes an SiC substrate 2 forming the base thereof. The SiC substrate 2 is doped with an N-type impurity in a high concentration ($10^{18}$ to $10^{21}$ cm$^{-3}$, for example). The SiC substrate 2 has a surface 21 (an upper surface) formed by an Si surface and a rear surface (a lower surface) 22 formed by a C surface.

An N$^-$-type epitaxial layer 3 made of SiC (silicon carbide) doped with an N-type impurity in a lower concentration than the SiC substrate 2 is laminated on the surface 21 of the SiC substrate 2. The epitaxial layer 3 as a semiconductor layer is formed on the SiC substrate 2 by the so-called epitaxy. The epitaxial layer 3 formed on the surface 21, i.e., the Si surface, is grown on a major growth surface formed by an Si surface. Therefore, a surface 31 of the epitaxial layer 3 formed by the growth is an Si surface, similarly to the surface 21 of the SiC substrate 2.

A portion (a base layer portion) on the side of the C surface of the epitaxial layer 3 opposite to a portion (a surface layer portion) on the side of the Si surface forms an N$^-$-type drain region 4 entirely maintaining the state after the epitaxy. The drain region 4 has an N-type impurity concentration of $10^{15}$ to $10^{17}$ cm$^{-3}$, for example.

On the other hand, a P-type body region 5 is formed on the surface layer portion of the epitaxial layer 3. The body region 5 is in contact with the drain region 4 from the side (the Si surface side) of the surface 31 of the epitaxial layer 3. The body region 5 has a P-type impurity concentration of $10^{16}$ to $10^{19}$ cm$^{-3}$, for example.

A gate trench 6 is dug down in the epitaxial layer 3 from the surface 31 thereof. A plurality of such gate trenches 6 (not shown in FIG. 1) are formed at regular intervals to parallelly extend in the same direction (a direction orthogonal to the plane of FIG. 1: the direction may hereinafter be referred to as a "direction along the gate width"), thereby forming a striped structure, for example.

Each gate trench 6 has a pair of planar side surfaces 7 opposed to each other at an interval and orthogonal to the surface 31 respectively and a bottom surface 8 having a portion parallel to the surface 31. The gate trench 6 passes through the body region 5 in the thickness direction, and the deepest portion (the bottom surface 8) thereof reaches the drain region 4.

A gate insulating film 9 is formed on the inner surfaces of the gate trench 6 and the surface 31 of the epitaxial layer 3, to cover the overall regions of the inner surfaces (the side surfaces 7 and the bottom surface 8) of the gate trench 6. The gate insulating film 9 consists of an oxide film containing nitrogen, such as a silicon oxynitride film formed by thermal oxidation with nitrogen-containing gas, for example. The nitrogen content (the nitrogen concentration) in the gate insulating film 9 is 0.1 to 10%, for example.

In the gate insulating film 9, the thickness $T_2$ of a portion (an insulating film bottom portion 11) located on the bottom surface 8 is smaller than the thickness $T_1$ of portions (insulating film side portions 10) located on the side surfaces 7. More specifically, the ratio (thickness $T_2$ of insulating film bottom portion 11/thickness $T_1$ of insulating film side portion 10) of the thickness $T_2$ of the insulating film bottom portion 11 to the thickness $T_1$ of the insulating film side portions 10 is 0.3 to 1.0, preferably 0.5 to 1.0. Further specifically, the thickness $T_1$ of the insulating film side portions 10 is 300 to 1000 Å, and the thickness $T_2$ of the insulating film bottom portion 11 is 150 to 500 Å, for example.

A gate electrode 12 is embedded in the gate trench 6 by filling up the inner side of the gate insulating film 9 with a polysilicon material doped with an N-type impurity in a high concentration.

On a surface layer portion of the body region 5, N$^+$-type source regions 13 are formed on both sides of the gate trench 6 in a direction (the right-and-left direction in FIG. 1) orthogonal to the gate width. The source regions 13 are doped with an N-type impurity in a higher concentration than the drain region 4. The source regions 13 have an N-type impurity concentration of $10^{18}$ to $10^{21}$ cm$^{-3}$, for example. The source regions 13 extend in the direction along the gate width on positions adjacent to the gate trench 6.

The epitaxial layer 3 is provided with P$^+$-type body contact regions 14 passing through central portions of the source regions 13 in the direction orthogonal to the gate width from the surface 31 thereof to be connected to the body region 5. The body contact regions 14 are doped with a P-type impurity in a higher concentration than the body region 5. The body contact regions 14 have a P-type impurity concentration of $10^{18}$ to $10^{21}$ cm$^{-3}$, for example.

In other words, the gate trench 6 and the source regions 13 are alternately provided in the direction orthogonal to the gate width, and extend in the direction along the gate width respectively. Boundaries between the unit cells adjacent to one another in the direction orthogonal to the gate width are set on the source regions 13 along the source regions 13. At least one or more body contact regions 14 are provided over two unit cells adjacent to each other in the direction orthogonal to the gate width. The boundaries between the unit cells adjacent to one another in the direction along the gate width are so set that the gate electrode 12 included in each unit cell has a constant gate width.

An interlayer dielectric film 15 made of SiO$_2$ is laminated on the epitaxial layer 3. A contact hole 16 exposing the surfaces of the source regions 13 and the body contact regions 14 is formed in the interlayer dielectric film 15 and the gate insulating film 9.

A source wire 17 is formed on the interlayer dielectric film 15. The source wire 17 is in contact (electrically connected) with the source regions 13 and the body contact regions 14 through the contact hole 16. The source wire 17 has a polysilicon layer 18 in the portion in contact with the source regions 13 and the body contact regions 14, and has a metal layer 20 on the polysilicon layer 18.

The polysilicon layer 18 is a doped layer made of doped polysilicon doped with an impurity, and preferably a high-concentration doped layer doped with the impurity in a high concentration of $10^{19}$ to $10^{21}$ cm$^{-3}$, for example. The impurity for forming the polysilicon layer 18 as the doped layer (including the high-concentration doped layer) can be prepared from an N-type impurity such as P (phosphorus) or As (arsenic) or a P-type impurity such as B (boron). The polysilicon layer 18 fills up the contact hole 16. The thickness of the polysilicon layer 18 is 5000 to 10000 Å, for example, depending on the depth of the contact hole 16.

The metal layer 20 is made of aluminum (Al), gold (Au), silver (Ag) or copper (Cu), an alloy thereof, or a metal material containing the same, for example. The metal layer 20 forms the outermost layer of the source wire 17, and a metal wire or the like, for example, is connected (bonded) thereto. The thickness of the metal layer 20 is 1 to 5 μm, for example.

In the source wire 17, an intermediate layer 19 containing titanium is interposed between the polysilicon layer 18 and the metal layer 20. The intermediate layer 19 is formed by a single layer containing titanium (Ti) or a plurality of layers including the layer. The layer containing titanium can be prepared from titanium, titanium nitride or the like. The thickness of the intermediate layer 19 is 200 to 500 nm, for example.

The aforementioned source wire 17 having the polysilicon layer 18, the intermediate layer 19 and the metal layer 20 preferably has a multilayer structure (Poly-Si/Ti/TiN/Al) obtained by successively laminating polysilicon (the polysilicon layer 18), titanium (the intermediate layer 19), titanium nitride (the intermediate layer 19) and aluminum (the metal layer 20).

A drain wire 23 is formed on the rear surface 22 of the SiC substrate 2. The drain wire 23 is in contact (electrically connected) with the SiC substrate 2. The drain wire 23 has a polysilicon layer 24 in the portion in contact with the SiC substrate 2, and has a metal layer 26 on the polysilicon layer 24.

The polysilicon layer 24 can be made of a material similar to that constituting the aforementioned polysilicon layer 18. The thickness of the polysilicon layer 24 is 1000 to 2000 Å, for example.

The metal layer 26 can be made of a material similar to that constituting the aforementioned metal layer 20. The metal layer 26 forms the outermost layer of the drain wire 23, and is bonded to a die pad of a lead frame when the SiC substrate 2 is bonded to the die pad, for example. The thickness of the metal layer 26 is 0.5 to 1 μm, for example.

In the drain wire 23, an intermediate layer 25 containing titanium is interposed between the polysilicon layer 24 and the metal layer 26. The intermediate layer 25 can be made of a material similar to that constituting the aforementioned intermediate layer 19.

A gate wire 27 is in contact (electrically connected) with the gate electrode 12 through a contact hole (not shown) formed in the interlayer dielectric film 15.

A prescribed voltage (a voltage of not less than a gate threshold voltage) is applied to the gate wire 27 while a prescribed potential difference is caused between the source wire 17 and the drain wire 23 (between a source and a drain), whereby a channel is formed in the vicinity of the interface between the body region 5 and the gate insulating film 9 due to an electric field from the gate electrode 12. Thus, a current flows between the source wire 17 and the drain wire 23, and the VDMOSFET is turned on.

Figure 2A:
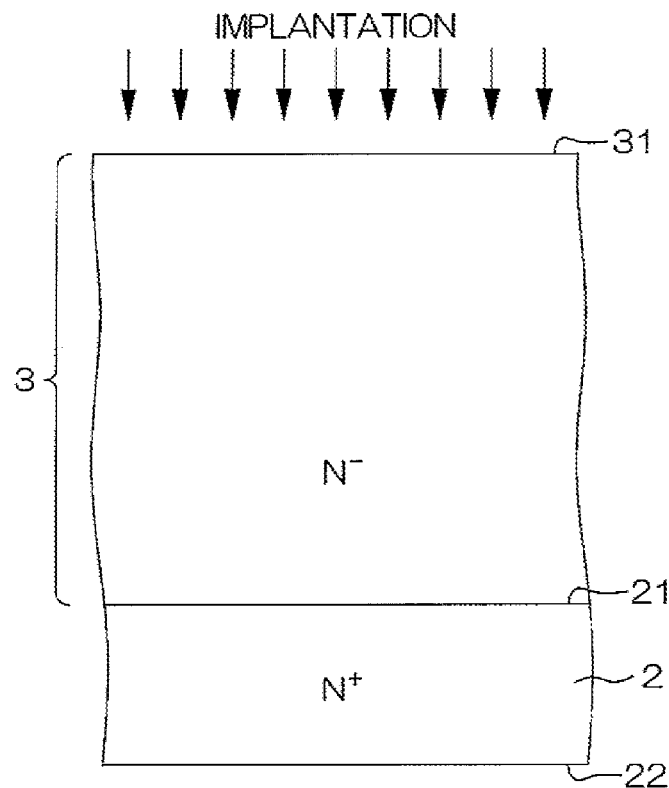
FIGS. 2A to 2N are schematic sectional views for illustrating a method of manufacturing the semiconductor device shown in FIG. 1 in step order.
Figure 2B:
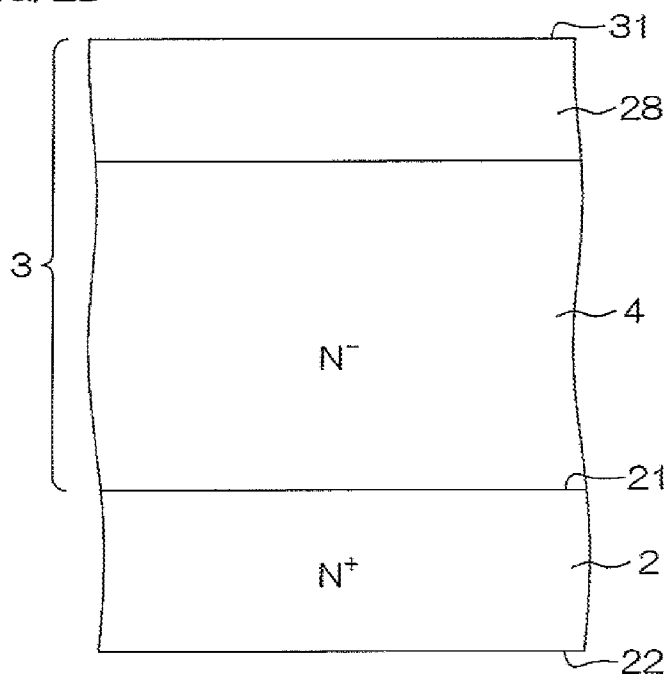
Figure 2C:
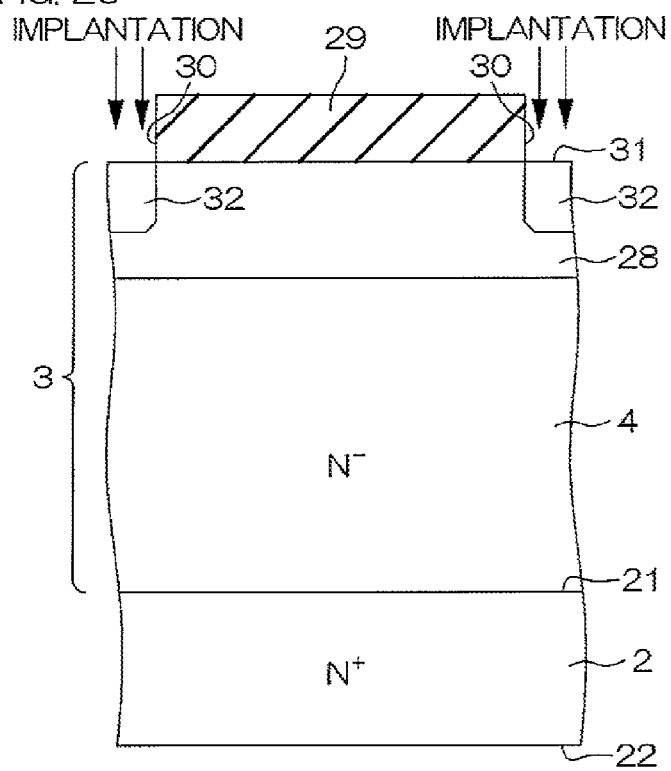
Figure 2D:
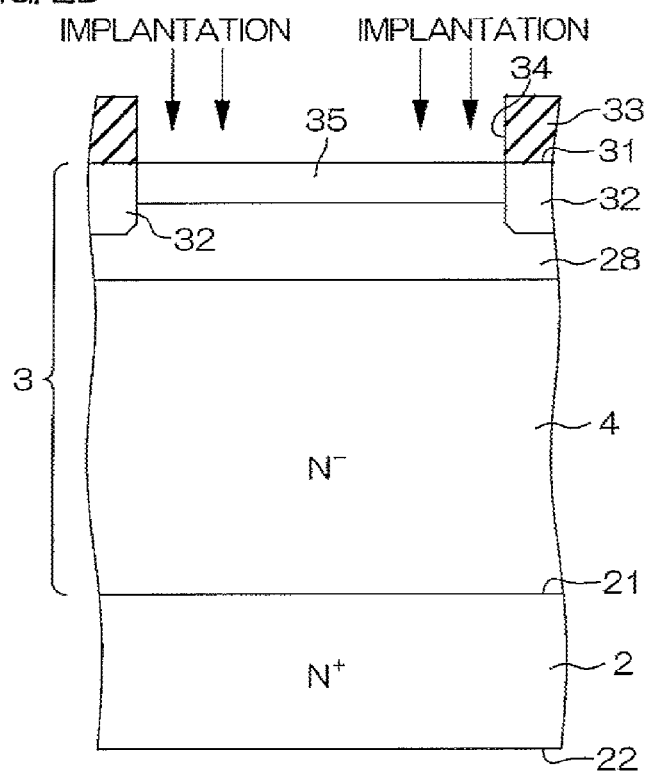
Figure 2E:
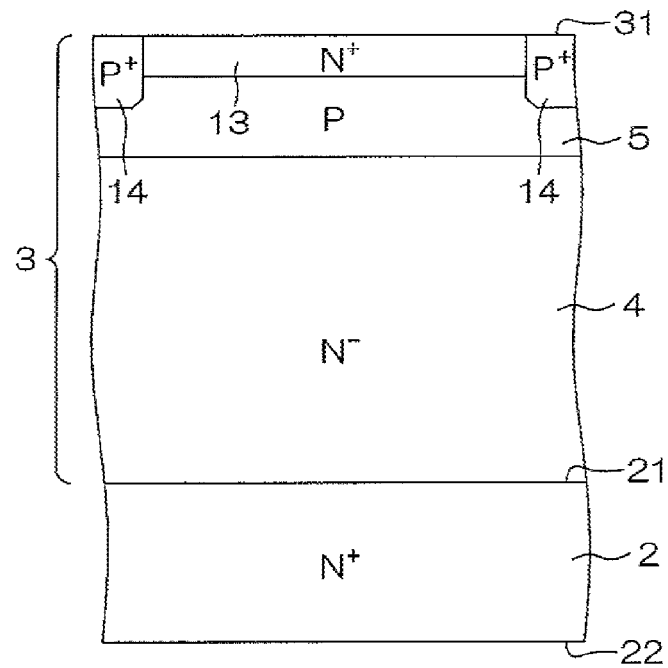
Figure 2F:
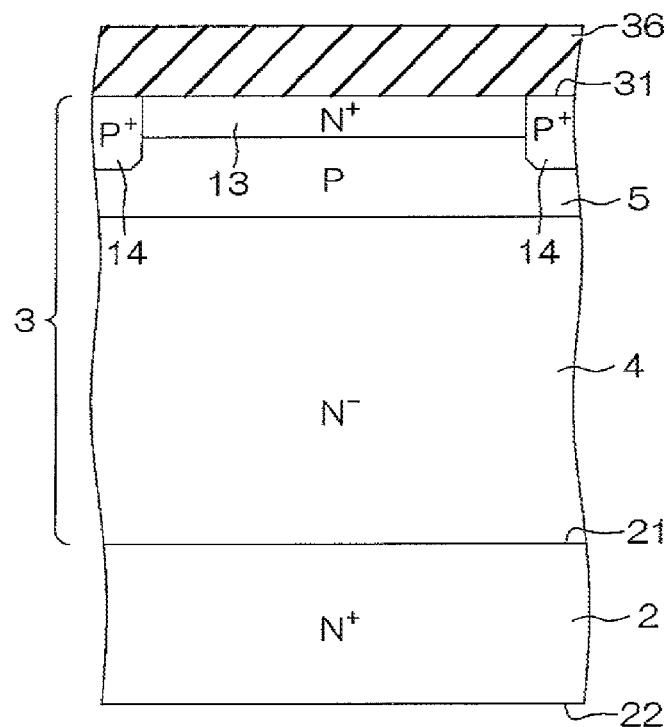
Figure 2G:
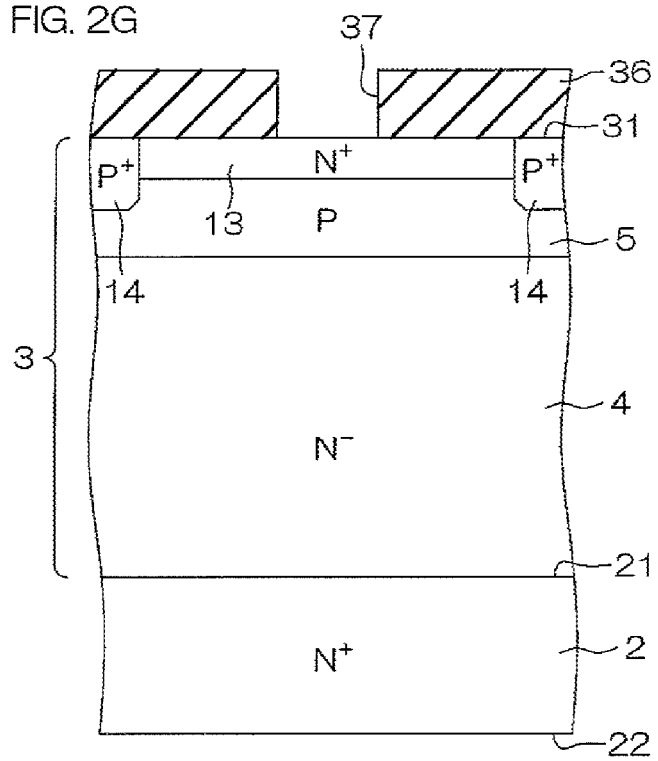
Figure 2H:
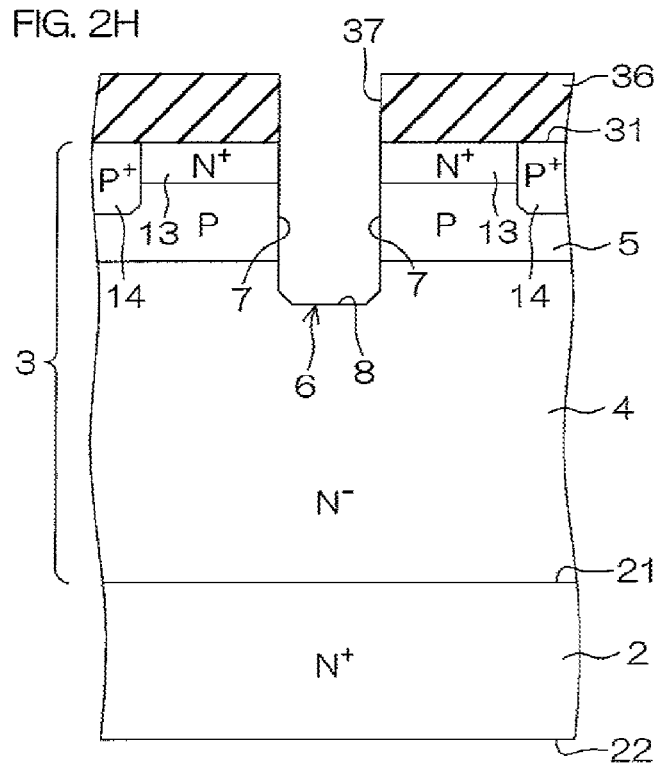
Figure 2:
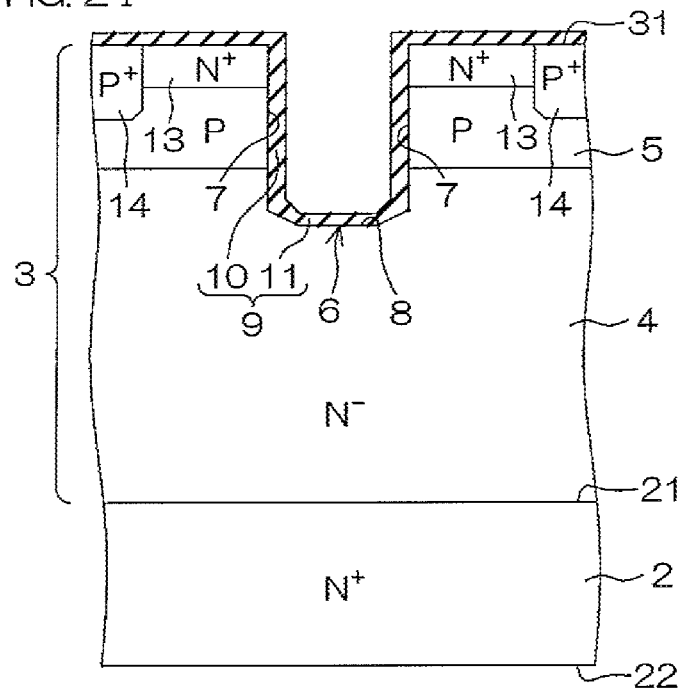
Figure 2J:
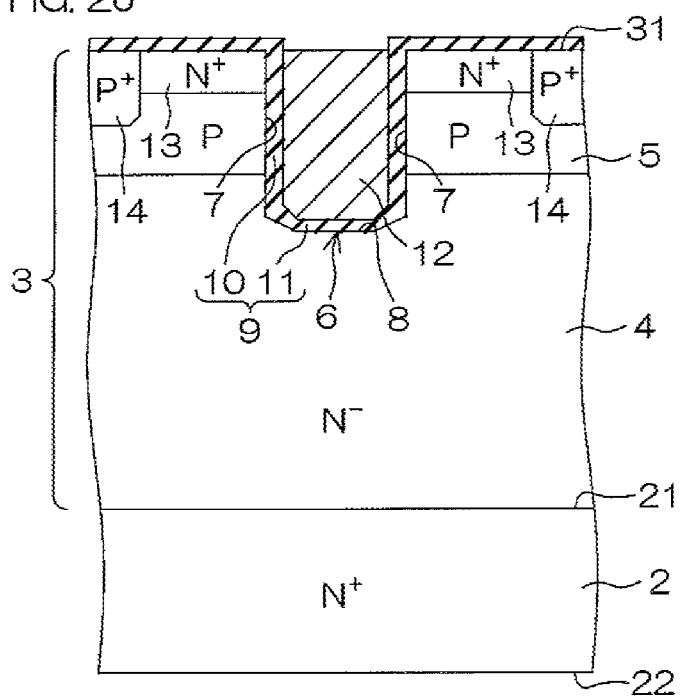
Figure 2K:
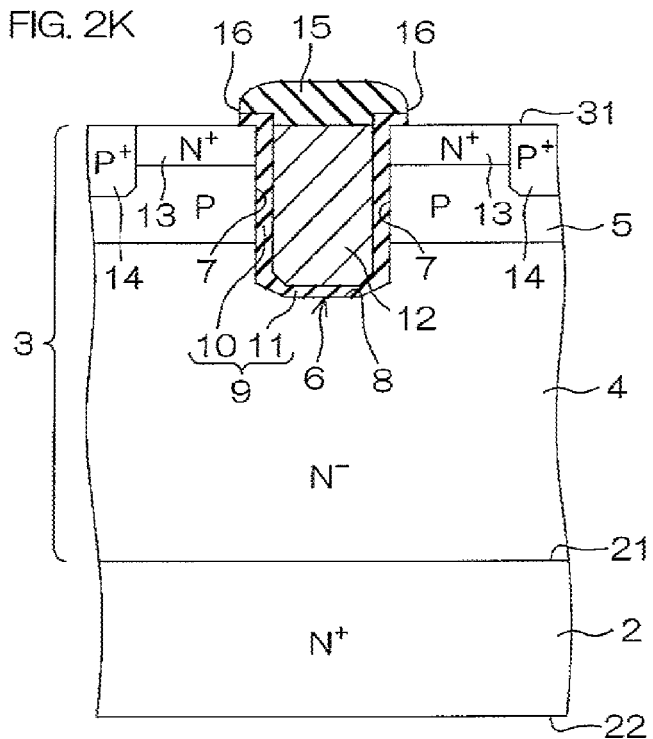
Figure 2L:
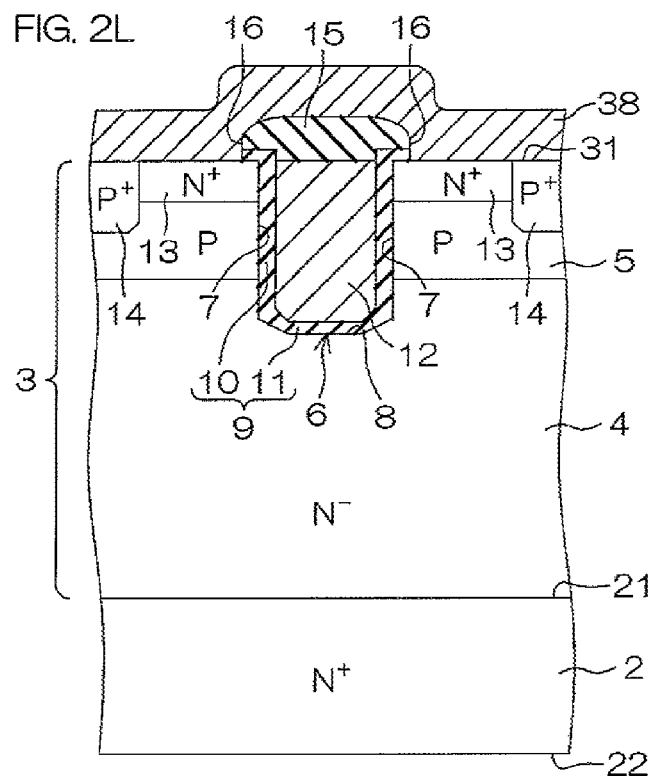
Figure 2N:
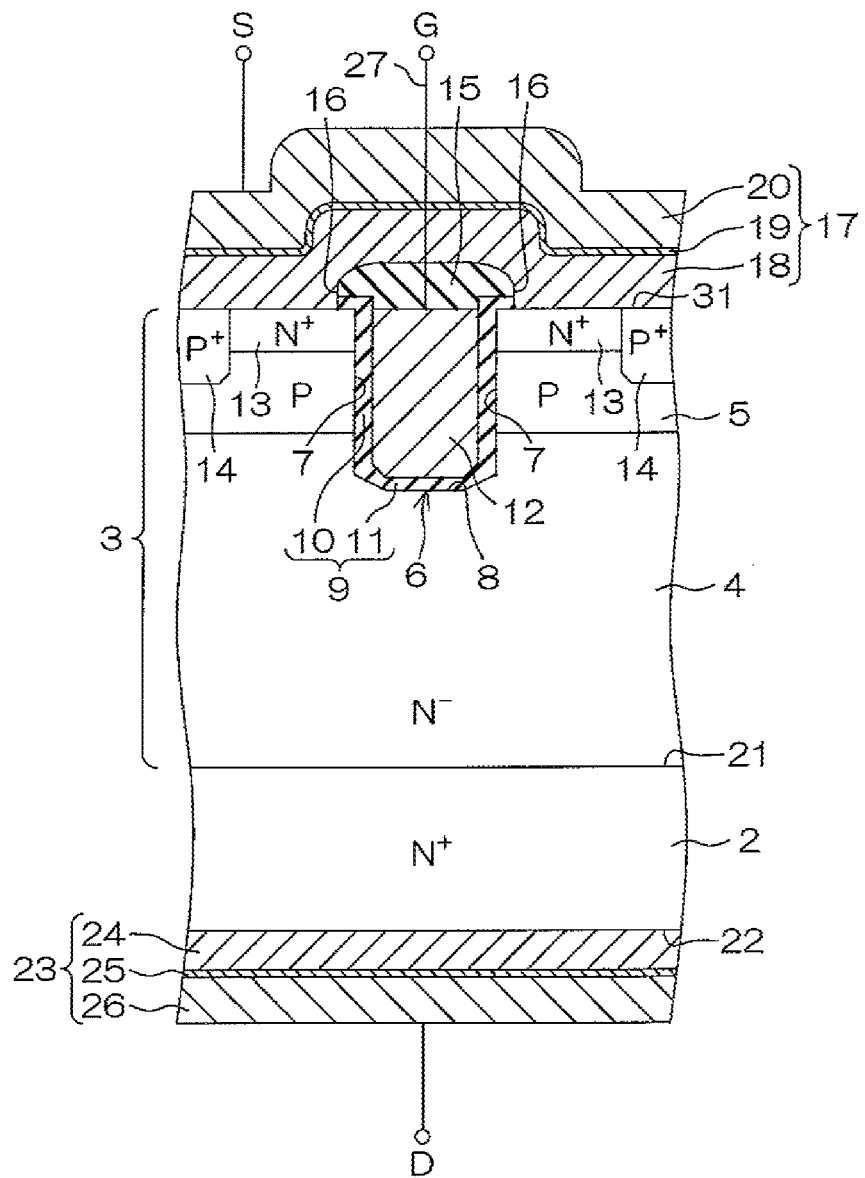

FIGS. 2A to 2N are schematic sectional views for illustrating a method of manufacturing the semiconductor device 1 shown in FIG. 1 in step order.

First, an SiC crystal is grown on the surface 21 (the Si surface) of the SiC substrate 2 by epitaxy such as CVD (Chemical Vapor Deposition), LPE (Liquid Phase Epitaxy) or MBE (Molecular Beam Epitaxy) while doping the same with an impurity, as shown in FIG. 2A. Thus, the N$^-$-type epitaxial layer 3 is formed on the SiC substrate 2. Then, a P-type impurity is implanted into the epitaxial layer 3 from the surface 31 thereof. While the implantation conditions vary with the type of the P-type impurity, acceleration energy is 200 to 400 keV, for example.

Thus, a region (a P-type implantation region 28) into which the P-type impurity has been implanted is formed on the surface layer portion of the epitaxial layer 3, as shown in FIG. 2B. Due to the formation of the P-type implantation region 28, the drain region 4 isolated from the P-type implantation region 28 while maintaining the state after the epitaxy is formed on the base layer portion of the epitaxial layer 3.

Then, a mask 29 made of SiO$_2$ is formed on the epitaxial layer 3 by CVD, as shown in FIG. 2C. Then, the mask 29 is etched through a photoresist film (not shown) into a pattern having openings 30 in regions for forming the body contact regions 14. After the formation of the openings 30, a P-type impurity is implanted into the epitaxial layer 3 from the surface 31 thereof. While the implantation conditions vary with the type of the P-type impurity, acceleration energy is 30 to 200 keV, for example. Thus, regions (P$^+$-type implantation regions 32) into which the P-type impurity has been implanted in a high concentration are formed on a surface layer portion of the P-type implantation region 28. After the implantation of the P-type impurity, the mask 29 is removed.

Then, a mask 33 made of SiO$_2$ is formed on the epitaxial layer 3 by CVD (Chemical Vapor Deposition), as shown in FIG. 2D. Then, the mask 33 is etched through a photoresist film (not shown) into a pattern having openings 34 in regions for forming the source regions 13. After the formation of the openings 34, an N-type impurity is implanted into the epitaxial layer 3 from the surface 31 thereof. While the implantation conditions vary with the type of the N-type impurity, acceleration energy is 30 to 200 keV, for example. After the implantation of the N-type impurity, the mask 33 is removed. Thus, a region (an N$^+$-type implantation region 35) into which the N-type impurity has been implanted in a high concentration is formed on the surface layer portion of the P-type implantation region 28.

Then, the epitaxial layer 3 is heat-treated at a temperature of 1400 to 2000° C., for example, as shown in FIG. 2E. Thus, the implanted N- and P-type impurities are activated, whereby the body region 5 is formed on the surface layer portion 3 of the epitaxial layer 3, while the source regions 13 and the body contact regions 14 are formed on the surface layer portion of the body region 5.

Then, a mask 36 made of SiO$_2$ is formed on the overall region of the surface 31 of the epitaxial layer 3 by CVD or thermal oxidation, as shown in FIG. 2F. The mask 36 may alternatively be made of SiN or the like through CVD.

Then, the mask 36 is etched through a photoresist film (not shown) into a pattern having an opening 37 in a region for forming the gate trench 6, as shown in FIG. 2G.

Then, mixed gas (SF$_6$/O$_2$ gas) containing SF$_6$ (sulfur hexafluoride) and O$_2$ (oxygen) is introduced into the surface 31 of the epitaxial layer 3 through the opening 37, as shown in FIG. 2H. Thus, the epitaxial layer 3 is dry-etched from the surface 31 (the Si surface), and the gate trench 6 having the bottom surface 8 having the portion (the Si surface) parallel to the surface 31 and the side surfaces 7 orthogonal to the Si surface is formed. After the formation of the gate trench 6, the mask 36 is removed.

Then, the SiC substrate 2 is introduced into a diffusion furnace, and the inner surfaces (the side surfaces 7 and the bottom surface 8) of the gate trench 6 and the surface 31 of the epitaxial layer 3 are thermally oxidized by feeding nitrogen-containing gas while heating the diffusion furnace, as shown in FIG. 2I. N$_2$O gas or NO gas, for example, can be employed as the nitrogen-containing gas. A heater temperature (a heating temperature) in the diffusion furnace is 1200 to 1350° C., for example, and a feeding time (an oxidation time) for the nitrogen-containing gas is 3 to 5 hours, for example. The gate trench 6 is formed in the epitaxial layer 3 made of SiC, and hence the oxidation of the inner surfaces of the gate trench 6 progresses under the condition that the oxidation rate for the bottom surface 8 having the Si surface and that for the side surfaces 7 orthogonal to the Si surface satisfy the following relational expression:

Oxidation rate for bottom surface 8/oxidation rate for side surface 7<0

Thus, the gate insulating film 9 is formed so that the thickness of the portion (the insulating film bottom portion 11) located on the bottom surface 8 is smaller than that of the portions (the insulating film side portions 10) located on the side surfaces 7.

Then, a doped polysilicon material is deposited on the epitaxial layer 3 by CVD, as shown in FIG. 2J. The deposited polysilicon material is etched back until the etched-back surface is flush with the surface 31 of the epitaxial layer 3. Thus, portions of the polysilicon layer located outside the gate trench 6 are removed, and the gate electrode 12 is formed by the polysilicon material remaining in the gate trench 6.

Then, the interlayer dielectric film 15 made of $SiO_2$ is laminated on the epitaxial layer 3 by CVD, as shown in FIG. 2K. Then, the interlayer dielectric film 15 and the gate insulating film 9 are so patterned that the contact hole 16 exposing the source regions 13 and the body contact regions 14 is formed in the interlayer dielectric film 15 and the gate insulating film 9.

Then, a polysilicon material 38 is laminated by CVD to fill up the contact hole 16, as shown in FIG. 2L.

Then, an N- or P-type impurity is implanted into the deposited polysilicon material, as shown in FIG. 2M. While the implantation conditions vary with the type of the N- or P-type impurity, acceleration energy is 10 to 100 keV, for example. Thus, the polysilicon layer 18 doped with the impurity in a high concentration is formed.

Then, titanium and titanium nitride are deposited in this order on the surface of the polysilicon layer 18 by a method such as sputtering or vapor deposition to form the intermediate layer 19, as shown in FIG. 2N. Then, aluminum is deposited on the surface of the intermediate layer 19 by a method such as sputtering or vapor deposition, to form the metal layer 20. Then, the metal layer 20, the intermediate layer 19 and the polysilicon layer 18 are worked into a prescribed pattern, to form the source wire 17. Then, the gate wire 27 connected to the gate electrode 12 is formed. Thereafter the drain wire 23 having the polysilicon layer 24, the intermediate layer 25 and the metal layer 26 is formed on the rear surface 22 of the SiC substrate 2 by a method similar to that for the source wire 17.

The semiconductor device 1 shown in FIG. 1 is obtained through the aforementioned steps.

In the semiconductor device 1, as hereinabove described, the gate trench 6 is dug down from the surface 31 (the Si surface) of the epitaxial layer 3 made of SiC. Therefore, oxidation of the inner surfaces of the gate trench 6 progresses under the condition that the oxidation rate for the bottom surface 8 having the Si surface and that for the side surfaces 7 orthogonal to the Si surface satisfy the following relational expression:

Oxidation rate for bottom surface 8/oxidation rate for side surface 7<0

In the aforementioned method, the inner surfaces of the gate trench 6 are thermally oxidized with the nitrogen-containing gas, dissimilarly to thermal oxidation (dry oxidation) employing oxygen gas or thermal oxidation (wet oxidation) employing water vapor ($H_2O$) gas. Therefore, the ratio (oxidation rate for bottom surface 8/oxidation rate for side surface 7) of the oxidation rate for the bottom surface 8 to that for the side surfaces 7 can be increased as compared with a case where the gate insulating film 9 is formed by dry oxidation or wet oxidation.

In the gate insulating film 9 formed in the aforementioned manner, the ratio (thickness $T_2$ of insulating film bottom portion 11/thickness $T_1$ of insulating film side portion 10) of the thickness $T_2$ of the insulating film bottom portion 11 to the thickness $T_1$ of the insulating film side portions 10 is in the range of 0.3 to 1.0.

Even if the thickness $T_2$ of the insulating film bottom portion 11 is increased so that dielectric breakdown can be suppressed, excessive increase in the thickness $T_1$ of the insulating film side portions 10 can be suppressed due to the lower limit of 0.3 of the ratio (thickness $T_2$ of insulating film bottom portion 11/thickness $T_1$ of insulating film side portion 10). When the thickness $T_2$ of the insulating film bottom portion 11 is designed to a proper value, on the other hand, the thickness $T_1$ of the insulating film side portions 10 is not excessively reduced, due to the upper limit of 1.0. Consequently, dielectric breakdown of the insulating film bottom portion 11 can be suppressed while suppressing increase in the thickness $T_1$ of the insulating film side portions 10 by properly designing the thickness $T_2$ of the insulating film bottom portion 11.

Further, the gate insulating film 9 consists of the silicon oxynitride film formed by thermal oxidation employing the nitrogen-containing gas, whereby channel mobility of the VDMOSFET can be improved.

Figure 3B:
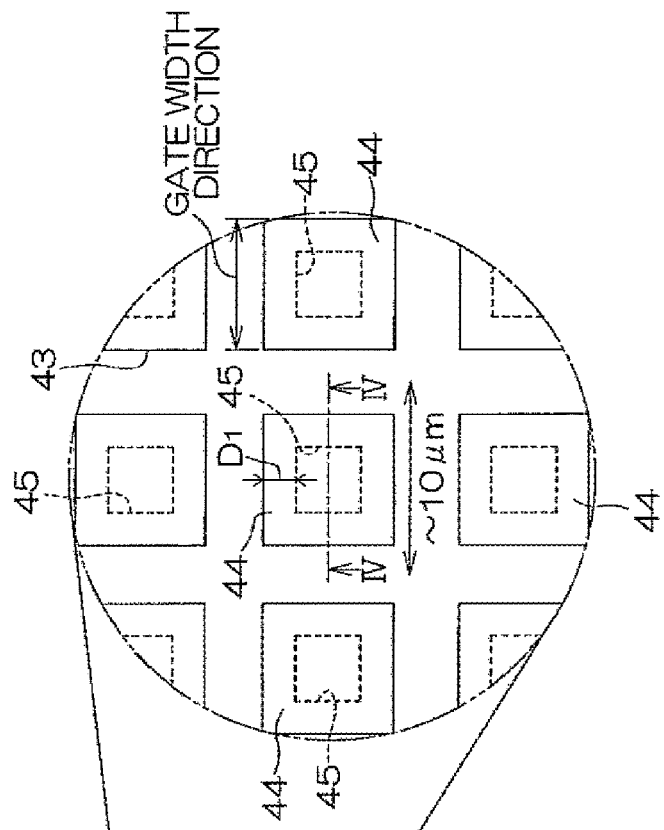
FIGS. 3A and 3B are schematic plan views of a semiconductor device according to a second embodiment of the present invention, with FIG. 3A showing the overall semiconductor device and FIG. 3B showing an inner portion thereof in an enlarged manner.
Figure 3A:
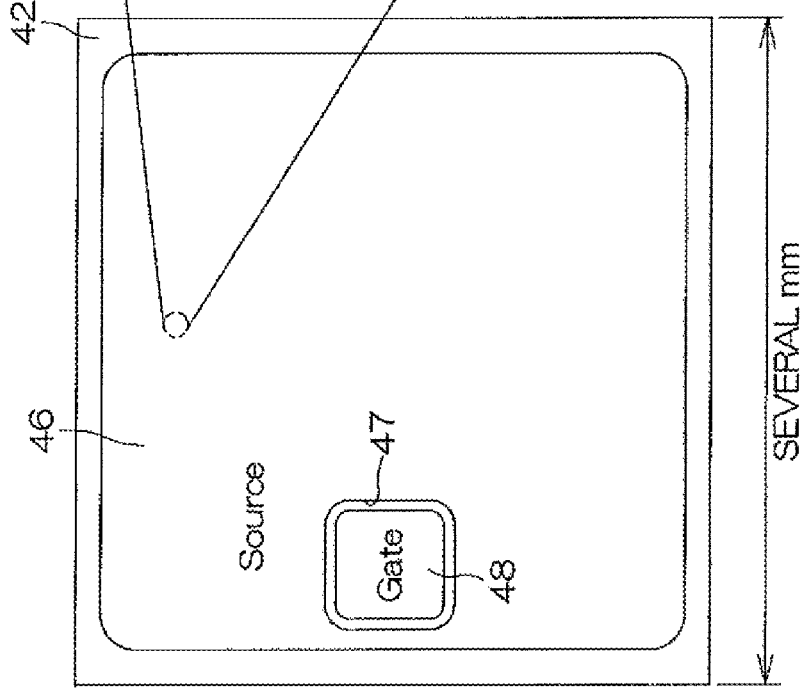

FIGS. 3A and 3B are schematic plan views of a semiconductor device according to a second embodiment of the present invention, with FIG. 3A showing the overall semiconductor device and FIG. 3B showing an inner portion thereof in an enlarged manner.

A semiconductor device 41 according to the second embodiment of the present invention is a trench gate power VDMOSFET (an individual device) employing SiC, in the form of a chip square in plan view, for example. The chip-like semiconductor device 41 has a length of about several mm in the right-and-left (vertical) direction in the plane of FIG. 3A.

The semiconductor device 41 has an SiC substrate 42 and a large number of unit cells 44 formed on the SiC substrate 42 and partitioned by a gate trench 43 latticed in plan view. In other words, the unit cells 44 in the form of rectangular parallelepipeds arranged in window portions of the latticed gate trench 43 respectively are aligned on the SiC substrate 42 in the form of a matrix. Each unit cell 44 has a length of not more than 10 μm in the right-and-left (vertical) direction in the plane of FIG. 3B, for example, and a source trench 45, square in plan view, dug down from the surface side toward the side of the SiC substrate 42 is formed at the center thereof.

A source pad 46 is formed on the surface of the semiconductor device 41. The source pad 46 is generally in the form of a square having outwardly bent four corners in plan view, and formed to generally cover the overall region of the surface of the semiconductor device 41. A removed region 47 is formed in the source pad 46 by partially removing the same in a generally square manner in plan view, on a position slightly leftward in the right-and-left direction in the plane of FIG. 3A.

A gate pad 48 is arranged on the removed region 47. An interval is provided between the gate pad 48 and the source pad 46, which are insulated from each other.

Figure 4:
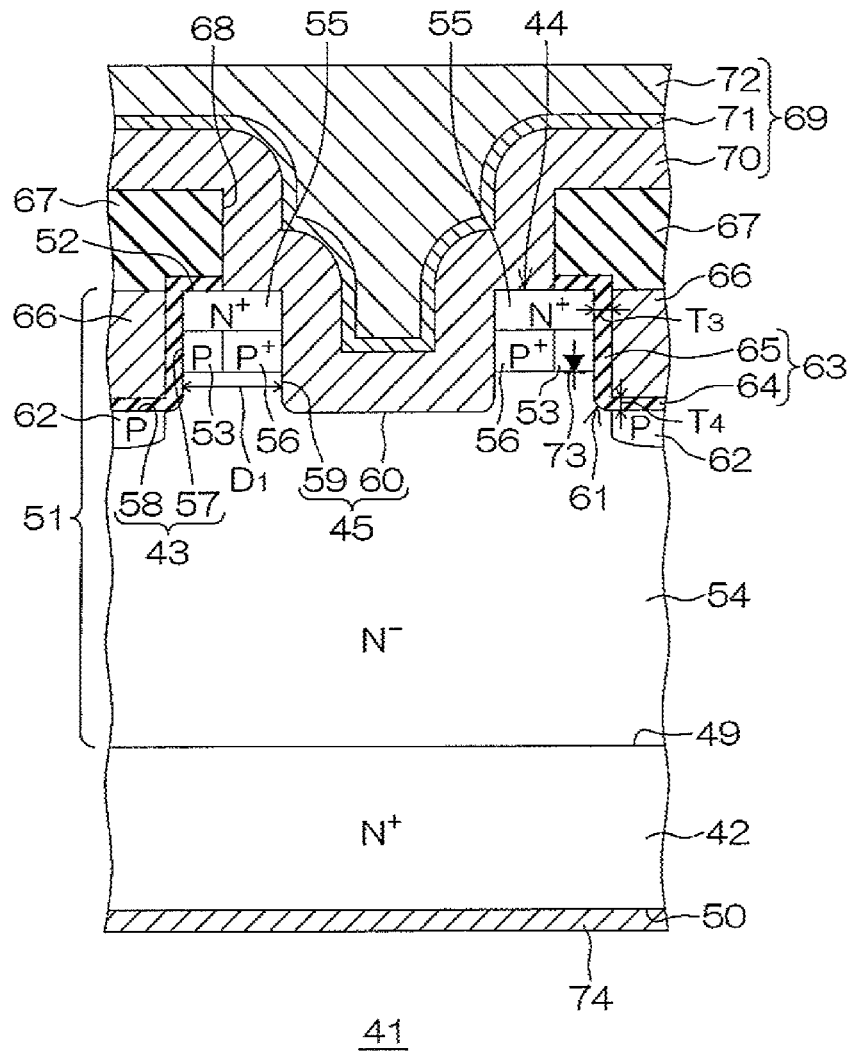
FIG. 4 is a schematic sectional view of the semiconductor device according to the second embodiment of the preset invention, taken along a line IV-IV in FIG. 3B.

FIG. 4 is a schematic sectional view of the semiconductor device 41 according to the second embodiment of the preset invention, taken along a line IV-IV in FIG. 3B.

The sectional structure of the semiconductor device 41 is described with reference to FIG. 4. The semiconductor device 4 includes the SiC substrate 41 of an N$^+$-type (having a concentration of $10^{18}$ to $10^{21}$ cm$^{-3}$, for example). The SiC substrate 42 has a surface 49 (an upper surface) formed by an Si surface and a rear surface 50 (a lower surface) formed by a C surface.

An N$^-$-type epitaxial layer 51 made of SiC having a lower concentration ($10^{15}$ to $10^{17}$ cm$^{-3}$, for example) than the SiC substrate 42 is laminated on the SiC substrate 42. The epitaxial layer 51 as a semiconductor layer is formed on the SiC substrate 42 by the so-called epitaxy. The epitaxial layer 51 formed on the surface 49, i.e., the Si surface, is grown on a major growth surface formed by an Si surface. Therefore, a surface 52 of the epitaxial layer 51 formed by the growth is an Si surface, similarly to the surface 49 of the SiC substrate 42.

On the side of the epitaxial layer 51 closer to the surface 52 (the Si surface), a P-type body region 53 is provided in the form of a well over a wide range, with a concentration of $10^{16}$ to $10^{19}$ cm$^{-3}$, for example. A region of the epitaxial layer 51 closer to the SiC substrate 42 (the C surface) than the body region 53 forms an N$^-$-type drain region 54 (a drift region) maintaining the state after the epitaxy.

In the body region 53, an N$^+$-type source region 55 (having a concentration of $10^{18}$ to $10^{21}$ cm$^{-3}$, for example) is formed generally on the overall region of the side closer to the surface 52, while a P$^+$-type body contact region 56 (having a concentration of $10^{18}$ to $10^{21}$ cm$^{-3}$, for example) is formed on a side (the lower side) closer to the SiC substrate 42 than the source region 55. A large number of such body contact regions 56 are provided in the form of a matrix.

Source trenches 45 are formed in the same number as the body contact regions 56 so that each source trench 45 passes through each body contact region 56, and the latticed gate trench 43 is formed to surround each body contact region 56 provided with the source trench 45. Thus, the large number of unit cells 44 functioning as field-effect transistors respectively are formed on the epitaxial layer 51. In other words, the body contact region 56 is formed to surround the corresponding source trench 45 and the body region 53 is formed to surround the body contact region 56 in each unit cell 44. A side of the body region 53 opposite to the side closer to the body contact region 56 is exposed on the side surfaces of the gate trench 43. In the unit cell 44, the depth direction of the gate trench 43 corresponds to a gate length direction, and the peripheral direction of each unit cell 44 orthogonal to the gate length direction corresponds to a gate width direction.

Both of the source trench 45 and the gate trench 43 pass through the body region 53 from the surface 52 of the epitaxial layer 51 to reach the drain region 54, and the depths thereof are identical to each other in the second embodiment. The distance $D_1$ between side surfaces 59 and 57 of the source trench 45 and the gate trench 43 is 0.5 to 3 μm, for example. When the distance $D_1$ is in this range, increase in resistance (on-resistance) can be suppressed when each unit cell 44 is turned on, and an electric field applied to the bottom portion of the gate trench 43 can be relaxed.

The gate trench 43 is U-shaped in section, such that both end corner portions 61 of the bottom portion thereof in a direction (a direction opposed to the adjacent unit cell 44) orthogonal to the gate width are bent toward the side of the drain region 54 and the side surfaces 57 opposed to each other and a bottom surface 58 are continuous through bent surfaces. The source trench 45 is also U-shaped in section, such that the side surfaces 59 opposed to each other and a bottom surface 60 are continuous through bent surfaces. When the unit cell 44 is turned off, therefore, the electric field applied to both end corner portions 61 of the bottom portion of the gate trench 43 can be dispersed to portions other than both end corner portions 61, whereby a portion (an insulating film bottom portion 64), described later, of the gate insulating film 63 located on the bottom surface 58 can be prevented from dielectric breakdown.

In the drain region 54, an implantation active layer 62 as an implantation layer formed by implantation of a P-type impurity (B (boron), Al (aluminum) or the like, for example) is formed in a portion reaching an intermediate portion of the gate trench 43 in the thickness direction from the bottom surface 58 thereof. The implantation active layer 62 is in the form of a lattice overlapping with the gate trench 43 in plan view, with a width smaller than the distance between the unit cells 44 adjacent to each other. According to the second embodiment, the depth of the implantation active layer 62 is 0.1 to 0.5 μm, for example.

The implantation active layer 62 is a high-resistance layer having higher resistance than the peripheral regions (the drain region 54, for example), and the resistance thereof is several 10 to several 100 kΩ/, for example. The implantation active layer 62 has a P-type impurity concentration of $10^{16}$ to $10^{21}$ cm$^{-3}$, for example.

A gate insulating film 63 is formed on the inner surfaces of the gate trench 43, to cover the overall regions thereof. The gate insulating film 63 consists of an oxide film containing nitrogen, such as a silicon oxynitride film formed by thermal oxidation with gas containing nitride and oxygen, for example. The nitrogen content (the nitrogen concentration) in the gate insulating film 63 is 0.1 to 10%, for example.

In the gate insulating film 63, the thickness $T_4$ of the portion (the insulating bottom portion 64) located on the bottom surface 58 of the gate trench 43 is smaller than the thickness $T_3$ of portions (insulating film side portions 65) located on the side surfaces 57 of the gate trench 43, and the ratio (thickness $T_4$/thickness $T_3$) of the thickness $T_4$ to the thickness $T_3$ is 0.3 to 1.0, preferably 0.5 to 1.0. More specifically, the thickness $T_3$ is 300 to 1000 Å, and the thickness $T_4$ is 150 to 500 Å, for example. If the thickness $T_3$ of the insulating film side portions 65 is in the aforementioned range, the semiconductor device 41 can be operated with a proper gate-on voltage, and an efficient transistor operation can be achieved.

A gate electrode 66 is embedded in the gate trench 43 by filling up the inner side of the gate insulating film 63 with a polysilicon material doped with an N-type impurity in a high concentration.

An interlayer dielectric film 67 made of SiO$_2$ is laminated on the epitaxial layer 51. A contact hole 68 exposing the surfaces of the source trench 45 and the source region 55 of each unit cell 44 is formed in the interlayer dielectric film 67 and the gate insulating film 63.

A source wire 69 is formed on the interlayer dielectric film 67. The source wire 69 collectively enters the source trench 45 of every unit cell 44 through each contact hole 68, and is in contact with the drain region 54, the body contact region 56 and the source region 55 successively from the bottom side of the source trench 45 in each unit cell 44. In other words, the source wire 69 is common to all unit cells 44. An interlayer dielectric film (not shown) is formed on the source wire 69, which in turn is electrically connected to the source pad 46 (see FIG. 3A) through the interlayer dielectric film (not shown). On the other hand, the gate pad 48 (see FIG. 3A) is electrically connected to the gate electrode 66 through a gate wire (not shown) drawn onto the interlayer dielectric film (not shown).

The source wire 69 has a polysilicon layer 70, an intermediate layer 71 and a metal layer 72 successively from the side in contact with the epitaxial layer 51.

The polysilicon layer 70 is a doped layer made of doped polysilicon doped with an impurity, such as a high-concentration doped layer doped with the impurity in a high concentration of $10^{19}$ to $10^{21}$ cm$^{-3}$, for example. The impurity for forming the polysilicon layer 70 as the doped layer (including the high-concentration doped layer) can be prepared from an N-type impurity such as N (nitrogen), P (phosphorus) or As (arsenic) or a P-type impurity such as Al (aluminum) or B (boron). The thickness of the polysilicon layer 70 is 5000 to 10000 Å, for example.

According to the second embodiment, the polysilicon layer 70 is formed to cover the overall region of the surface of the unit cell 44 exposed in the contact hole 68, and in contact with the drain region 54, the body contact region 56 and the source region 55 in the source trench 45.

The layer of the source wire 69 in contact with the drain region 54, the body contact region 56 and the source region 55 is made of polysilicon, whereby the source wire 69 can be brought into ohmic contact with both of the body contact region 56 and the source region 55, which are high-concentration impurity regions. On the other hand, a heterojunction having a smaller junction barrier than the diffusion potential of a body diode 73 (a PN diode formed by junction between the body region 53 and the drain region 54) intrinsic in the semiconductor device 41 can be formed with respect to the low-concentration drain region 54.

When a current flows to the body diode 73 intrinsic in the semiconductor device 41, positive holes (holes) moving from the body region 53 to the drain region 54 recombine with electrons in the drain region 54, and a defect of an SiC crystal in the epitaxial layer 51 may spread in the plane due to the resulting recombination energy. The resistance of the crystal defect is so high that the crystal defect may hinder an ordinary transistor operation to increase on-resistance when spreading toward the side of the gate trench 43.

When the heterojunction is formed due to the contact between the polysilicon layer 70 and the drain region 54 as in the second embodiment, on the other hand, a current can be fed to the side of the heterojunction in preference to the side of the body diode 73, even if a reverse voltage is applied between the source and the drain and the current flows to the aforementioned body diode 73. Consequently, the crystal defect of SiC can be prevented from spreading, and increase in the on-resistance can be suppressed.

The intermediate layer 71, laminated on the polysilicon layer 70, is formed by a single layer containing Ti (titanium) or a plurality of layers including the layer. The layer containing Ti can be prepared from Ti, TiN (titanium nitride) or the like. The thickness of the intermediate layer 71 is 200 to 500 nm, for example.

The metal layer 72, laminated on the intermediate layer 71, is made of Al (aluminum), Au (gold), Ag (silver), Cu (copper) or Mo (molybdenum), an alloy thereof, or a metal material containing the same, for example. The metal layer 72 forms the outermost layer of the source wire 69. The thickness of the metal layer 72 is 1 to 5 μm, for example.

More specifically, the polysilicon layer 70, the intermediate layer 71 and the metal layer 72 may be combined in a multilayer structure (Poly-Si/Ti/TiN/Al) obtained by successively laminating Poly-Si (the polysilicon layer 70), Ti (the intermediate layer 71), TiN (the intermediate layer 71) and Al (the metal layer 72).

A drain electrode 74 is formed on the rear surface 50 of the SiC substrate 42, to cover the overall region thereof. The drain electrode 74 is common to all unit cells 44. The drain electrode 74 has a multilayer structure (Ti/Al) obtained by laminating Ti and Al successively from the side of the SiC substrate 42, for example.

A prescribed voltage (a voltage of not less than a gate threshold voltage) is applied to the gate pad 48 while a prescribed potential difference is caused between the source pad 46 (the source wire 69) and the drain electrode 74 (between a source and a drain), whereby a channel is formed in the vicinity of the interface between the body region 53 and the gate insulating film 63 due to an electric field from the gate electrode 66. Thus, a current flows between the source wire 69 and the drain wire 74, and the VDMOSFET is turned on.

Figure 5A:
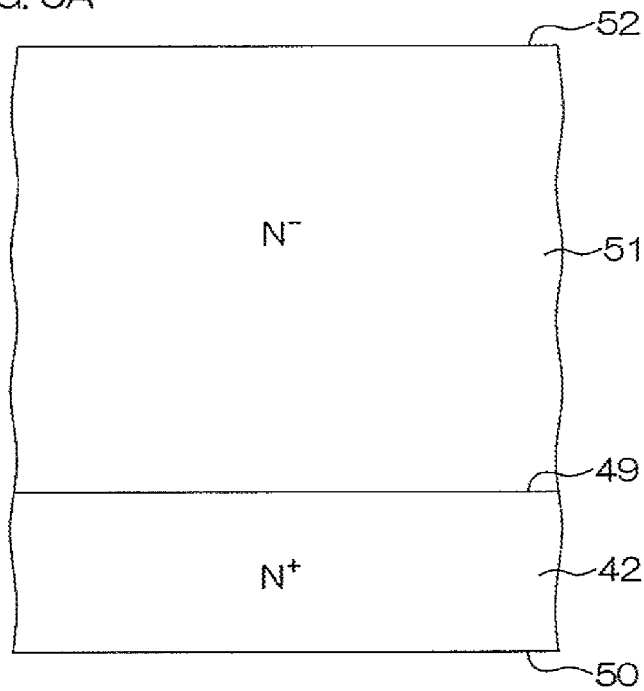
FIGS. 5A to 5U are schematic sectional views for illustrating a method of manufacturing the semiconductor device shown in FIG. 4 in step order.

FIGS. 5A to 5U are schematic sectional views for illustrating a method of manufacturing the semiconductor device 41 shown in FIG. 4 in step order.

First, an SiC crystal is grown on the surface 49 (the Si surface) of the SiC substrate 42 by epitaxy such as CVD (Chemical Vapor Deposition), LPE (Liquid Phase Epitaxy) or MBE (Molecular Beam Epitaxy) while doping the same with an impurity, as shown in FIG. 5A. Thus, the N$^-$-type epitaxial layer 51 is formed on the SiC substrate 42.

Figure 5B:
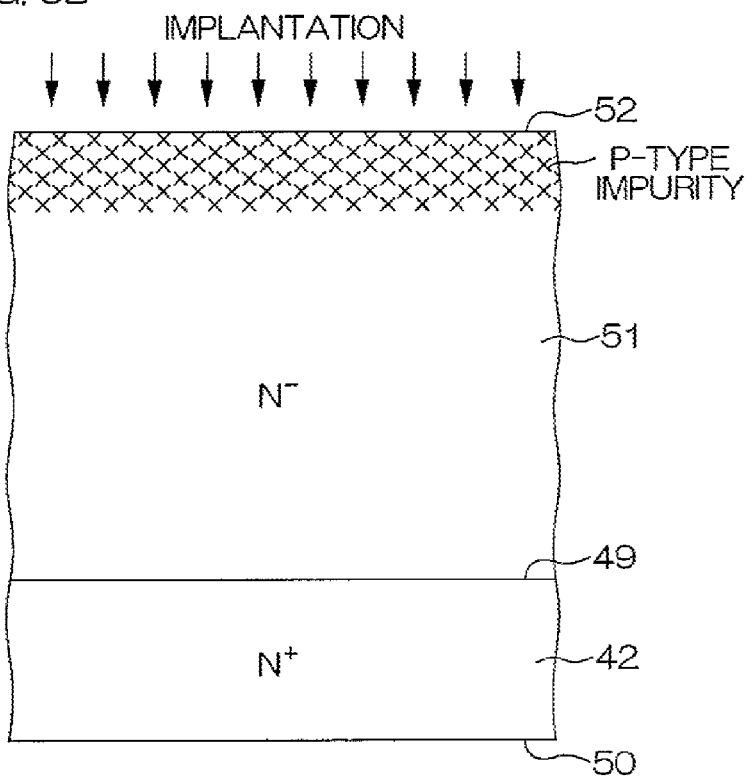

Then, a P-type impurity is implanted into the epitaxial layer 51 from the surface 52 thereof, as shown in FIG. 5B. While the implantation conditions vary with the type of the P-type impurity, acceleration energy is 200 to 3000 keV, for example.

Then, a mask 75 made of SiO$_2$ is formed on the epitaxial layer 51 by CVD, as shown in FIG. 5C. Then, the mask 75 is etched through a photoresist film (not shown) into a pattern having an opening 76 in a region for forming the body contact region 56. After the formation of the opening 76, a P-type impurity is implanted into the epitaxial layer 51 from the surface 52 thereof. While the implantation conditions vary with the type of the P-type impurity, acceleration energy is 30 to 400 keV, for example. After the implantation of the P-type impurity, the mask 75 is removed.

Then, an N-type impurity is implanted into the epitaxial layer 51 from the surface 52 thereof, as shown in FIG. 5D. While the implantation conditions vary with the type of the N-type impurity, acceleration energy is 30 to 400 keV, for example.

Then, a mask 77 made of SiO$_2$ is formed on the overall region of the surface 52 of the epitaxial layer 51 by CVD or thermal oxidation, as shown in FIG. 5E. The mask 77 may alternatively be made of SiN or the like through CVD. Then, the mask 77 is etched through a photoresist film (not shown) into a pattern having openings 78 in regions for forming the gate trench 43 and the source trench 45. After the formation of the openings 78, mixed gas (SF$_6$/O$_2$ gas) containing SF$_6$ (sulfur hexafluoride) and O$_2$ (oxygen) or mixed gas (SF$_6$/O$_2$/HBr gas) containing SF$_6$, O$_2$ and HBr (hydrogen bromide), for example, is introduced into the surface 52 of the epitaxial layer 51 through the openings 78. Thus, the epitaxial layer 51 is dry-etched from the surface 52 (the Si surface), and the gate trench 43 and the source trench 45 are formed at the same time. Further, the large number of unit cells 44 are formed on the epitaxial layer 51.

Then, the inner surfaces of the gate trench 43 and the source trench 45 are oxidized by thermal oxidation (dry oxidation) employing O$_2$ gas, as shown in FIG. 5F. Thus, a stopper film 79 is formed. While the thickness of the stopper film 79 may not be entirely uniform, FIGS. 5F to 5I illustrate the stopper film 79 having a uniform thickness, for the purpose of convenience.

Figure 5G:
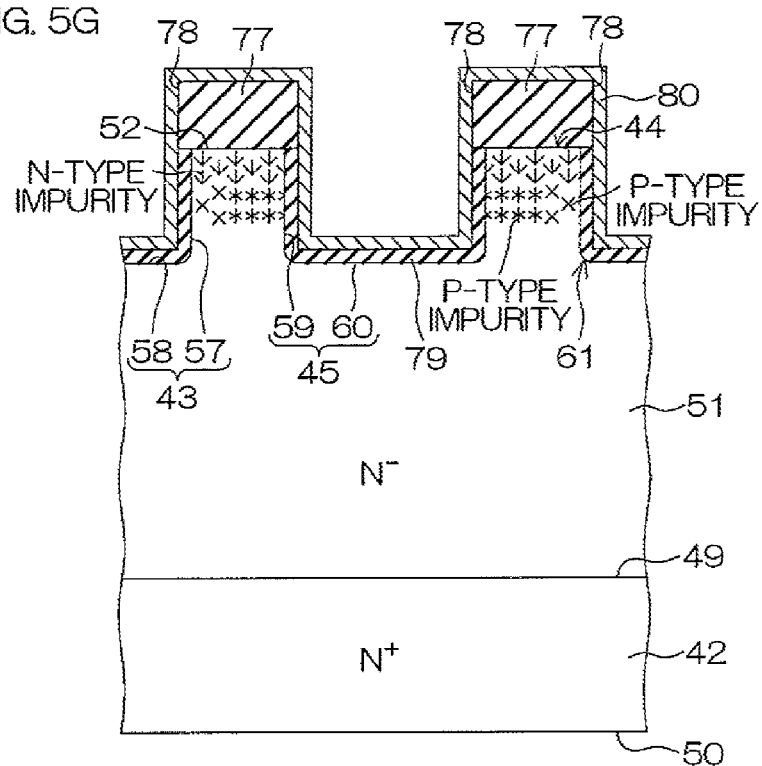

Then, a polysilicon material, different from the material ($SiO_2$) for the mask 77 for forming the gate trench 43 and the source trench 45, is deposited on the epitaxial layer 51 by CVD to completely fill up the overall regions of the surfaces of the stopper film 79 and the mask 77, as shown in FIG. 5G. Thus, a protective mask 80 is formed on the stopper film 79 and the mask 77. The thickness of the protective mask 80 is controlled to be 0.1 to 0.5 µm, for example.

Figure 5H:
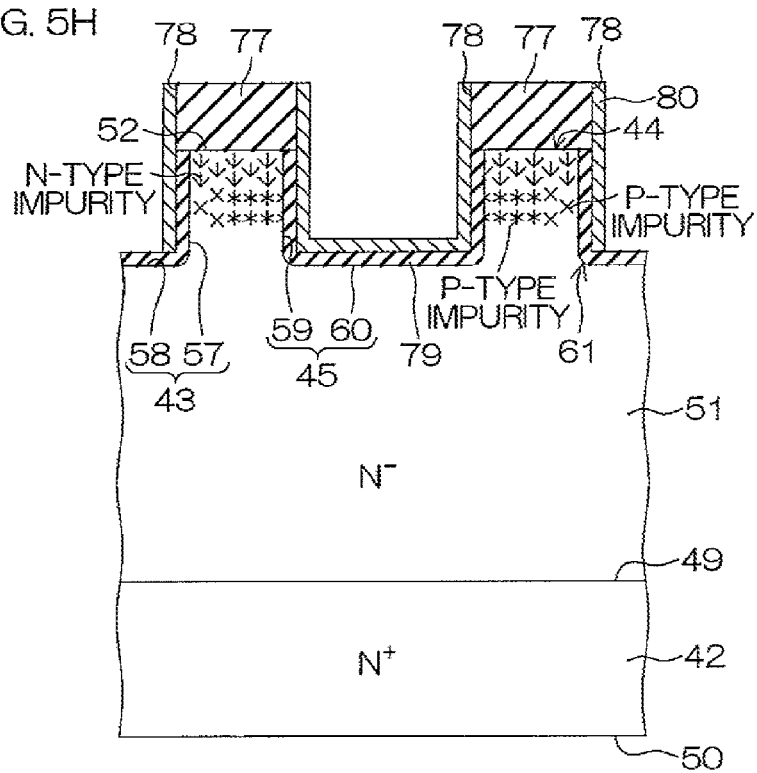

Then, the protective mask 80 is etched back from above the epitaxial layer 51, as shown in FIG. 5H. The protective mask 80 is etched back while a portion of the protective mask 80 located on the bottom surface 60 of the source trench 45 is masked, until the etching is stopped by the stopper film 79 and the mask 77. Thus, only a portion of the protective mask 80 located on the bottom surface 58 of the gate trench 43 is removed, while those covering the side surfaces 57 of the gate trench 43 and the bottom surface 60 and the side surfaces 59 of the source trench 45 remain.

Figure 5I:
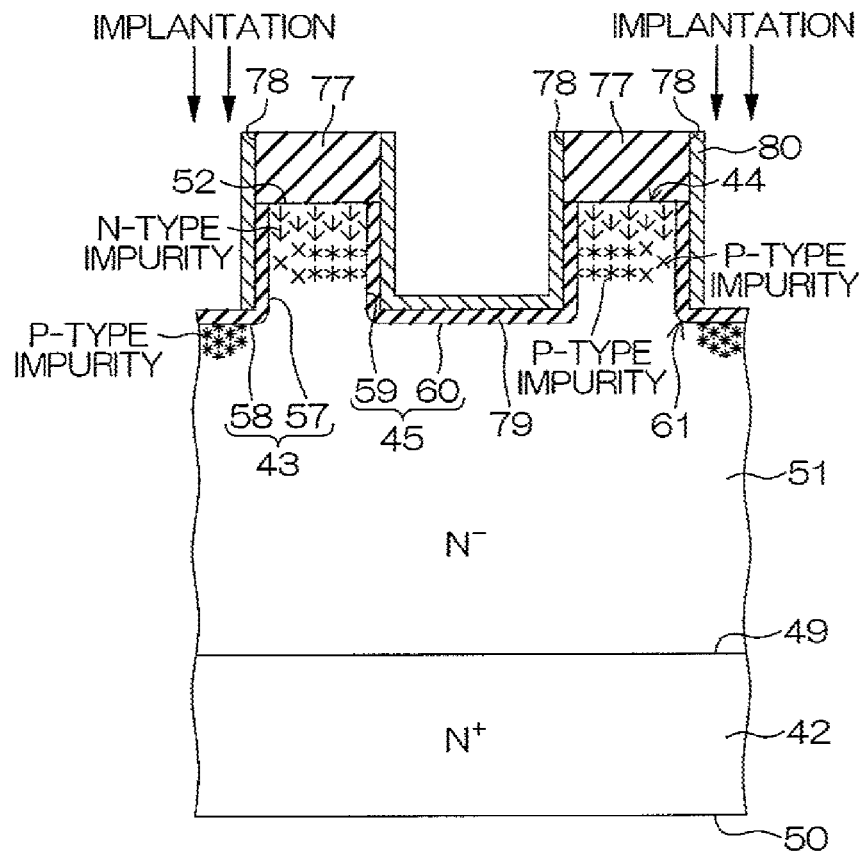

Then, a P-type impurity is implanted into the epitaxial layer 51 from the bottom surface 58 of the gate trench 43 through the stopper film 79, as shown in FIG. 5I. While the implantation conditions vary with the type of the P-type impurity, acceleration energy is 30 to 400 keV, for example.

Figure 5J:
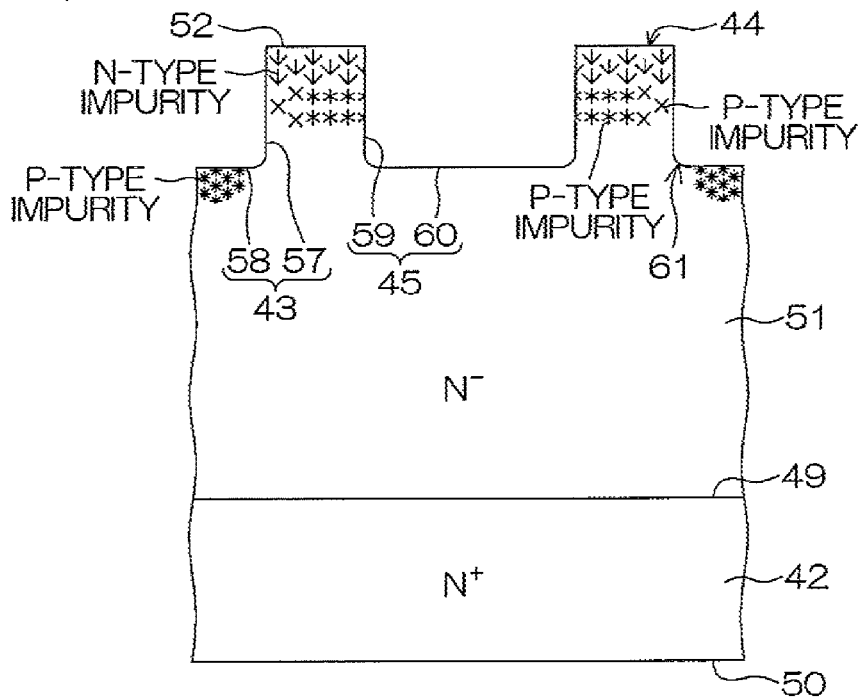

Then, the protective mask 80 is removed and the mask 77 as well as the stopper film 79 are subsequently removed by wet etching, as shown in FIG. 5J.

Thereafter an organic material film 81 is formed on the overall region of the surface 52 of the epitaxial layer 51, as shown in FIG. 5K. The organic material film 81 is made of a material containing carbon, to which an organic material (polyimide or the like, for example) employed as a photoresist material or the like can be applied, for example. The organic material film 81 is formed with a spin coater or the like, for example.

After the formation of the organic material film 81, the SiC substrate 42 is charged into a resistance heating furnace 82. The resistance heating furnace 82 is not particularly restricted, so far as airtightness in the resistance heating furnace 82 in which a heated object is set can be ensured and gas can be introduced thereinto. Further, the heating system of the resistance heating furnace 82 may be either direct heating or indirect heating.

When the SiC substrate 42 is set in the resistance heating furnace 82, inert gas ($N_2$, Ar or the like, for example) is introduced into the resistance heating furnace 82, which in turn is subjected to temperature-rise control (first temperature-rise control).

Figure 5L:
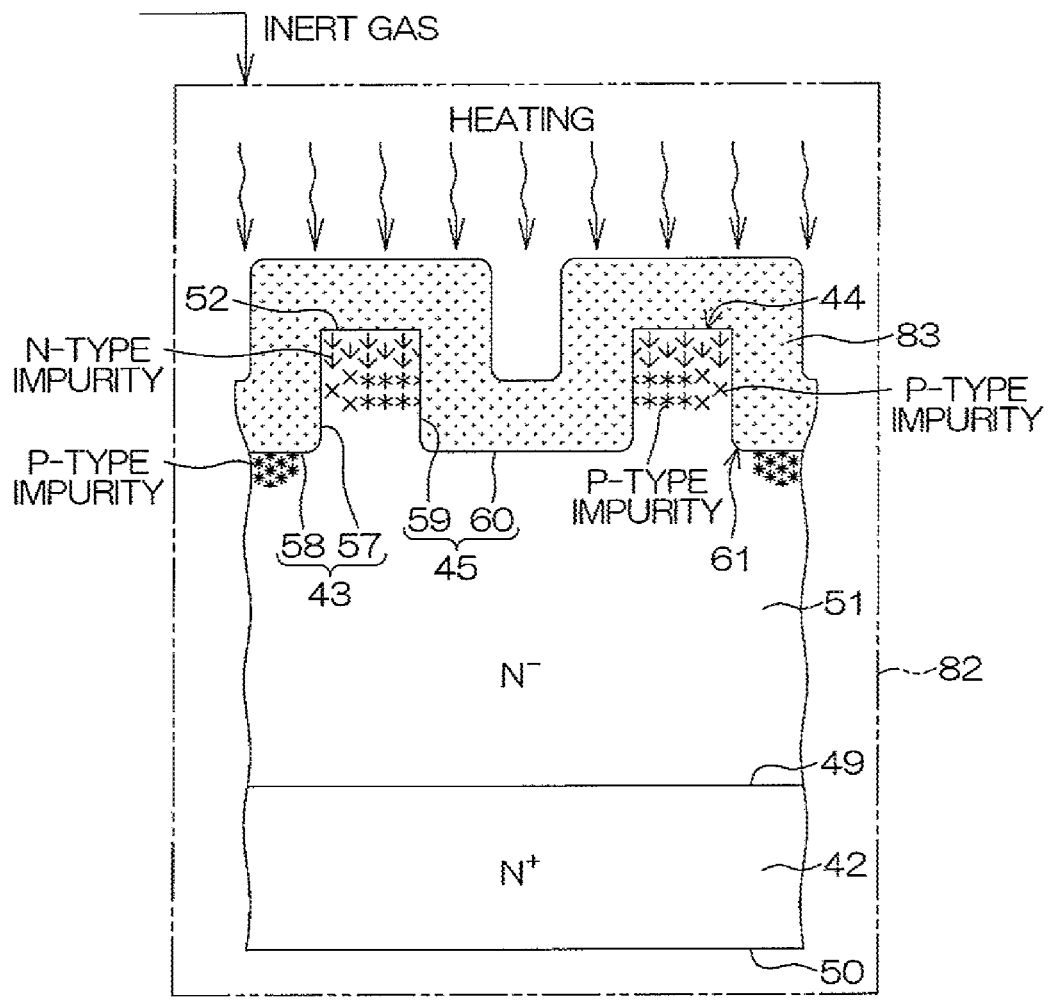
Figure 6:
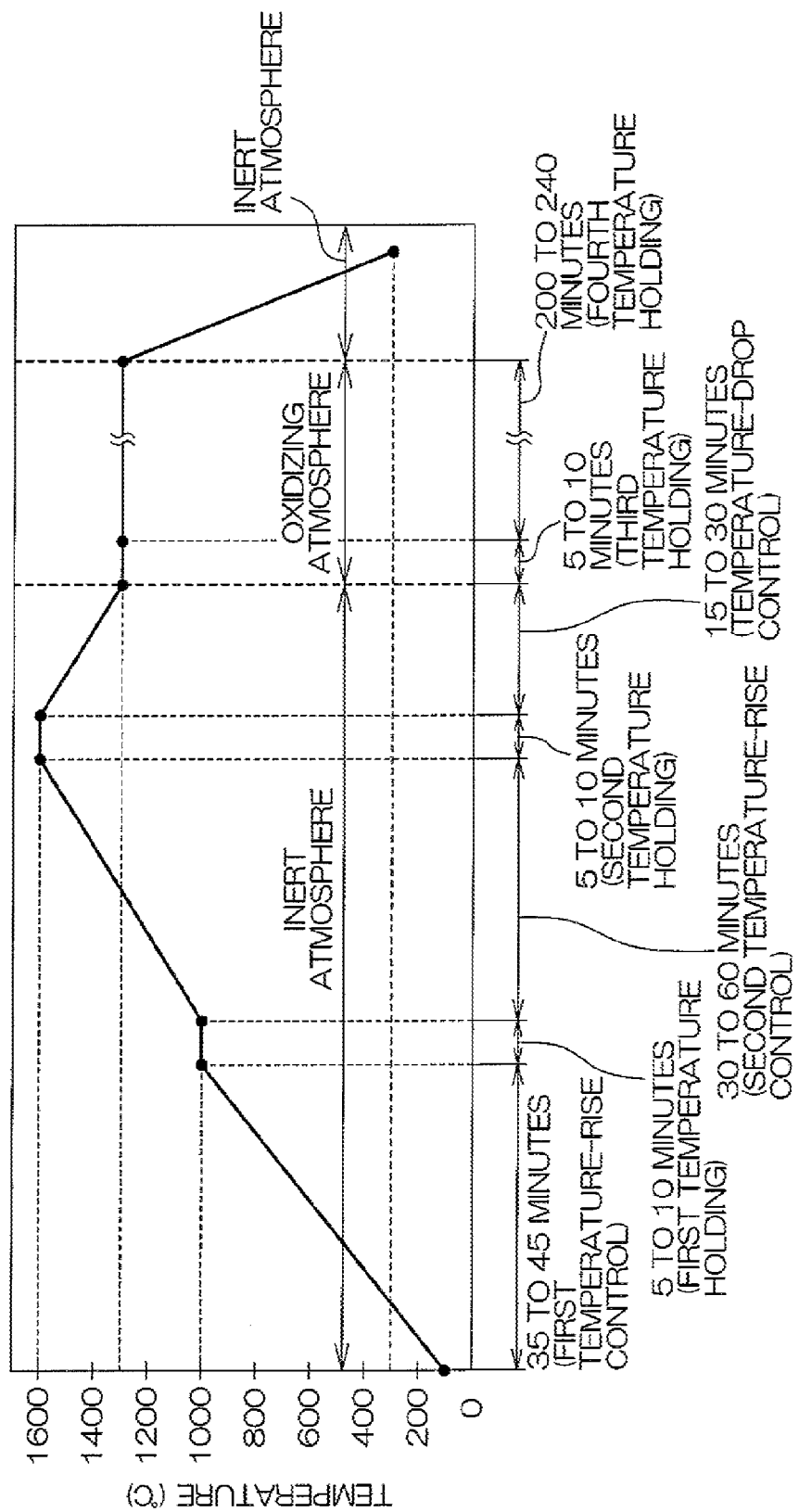
FIG. 6 is a graph showing temperature changes in a resistance heating furnace.

In the first temperature-rise control, the heating temperature is controlled to rise from 100° C. to 1000° C. over 35 to 45 minutes, for example, and thereafter held at 1000° C. (first temperature holding) for 5 to 10 minutes, for example, as shown in FIG. 6. Due to the temperature rise and the temperature holding, elements other than carbon evaporate from the organic material film 81, which in turn is altered into a carbon film 83, as shown in FIG. 5L. Therefore, the overall region of the surface 52 of the epitaxial layer 51 is covered with the carbon film 83.

Then, the resistance heating furnace 82 is subjected to further temperature-rise control (second temperature-rise control) while the inner portion thereof is kept in the inert atmosphere.

Figure 5M:
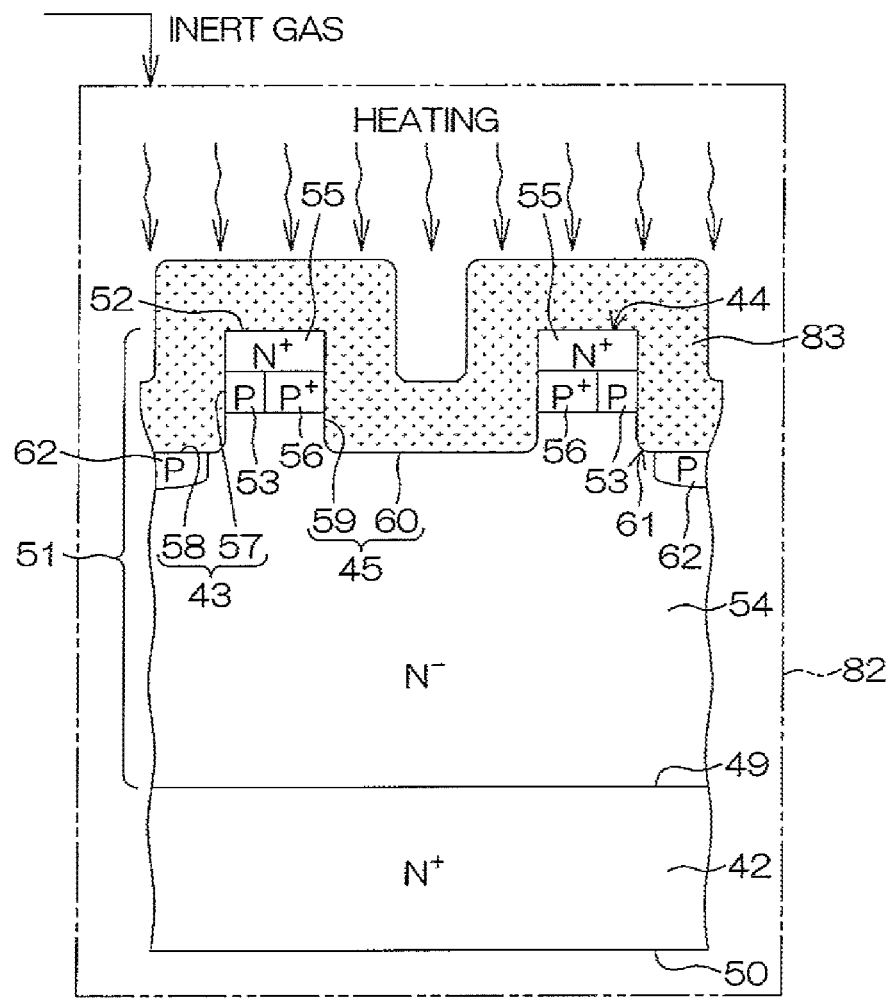

In the second temperature-rise control, the heating temperature is controlled to rise from 1000° C. to 1600° C. over 30 to 60 minutes, for example, as shown in FIG. 6. After the temperature rise, the heating temperature is held at 1600° C. (second temperature holding) for 5 to 10 minutes, for example. Due to the temperature rise and the temperature holding, ions of the individual N- and P-type impurities implanted into a surface layer portion of the epitaxial layer 51 are activated, and the body region 53, the source region 55 and the body contact region 56 are formed in response to the implanted portions respectively, as shown in FIG. 5M. Further, the drain region 54 maintaining the state after the epitaxy is formed on a base layer portion of the epitaxial layer 51.

Then, the resistance heating furnace 82 is subjected to temperature-drop control while the inner portion thereof is kept in the inert atmosphere.

Figure 5N:
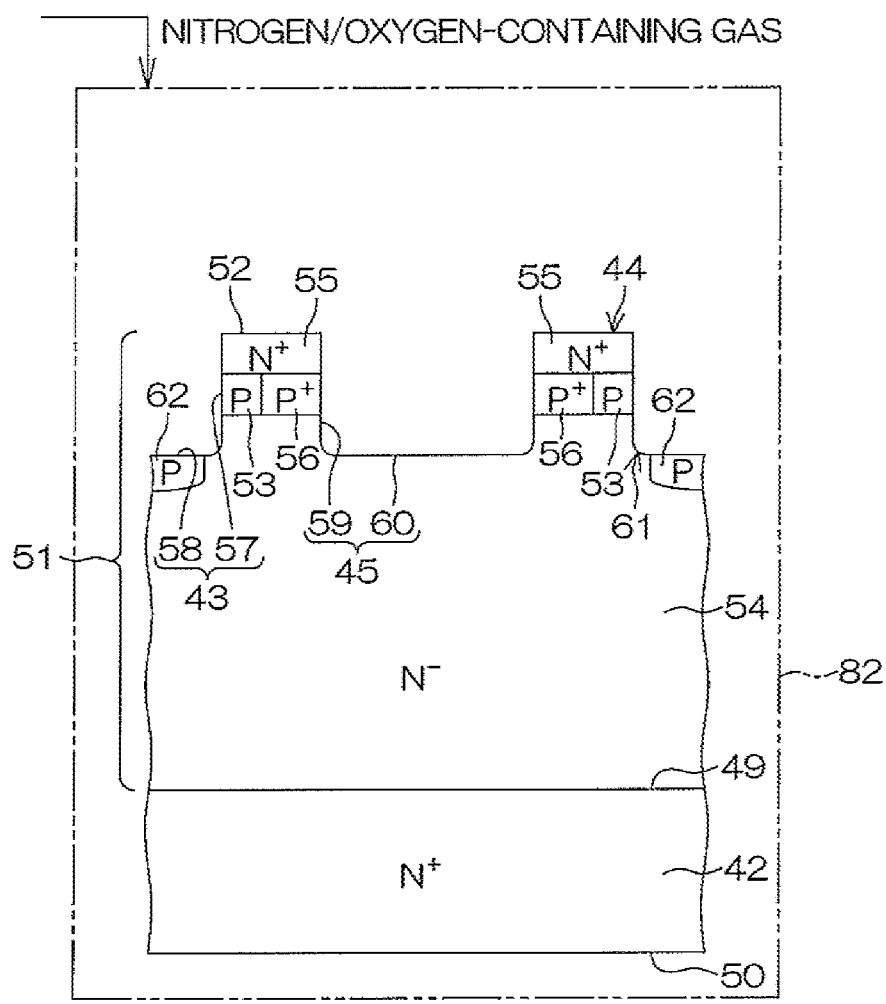
Figure 50:
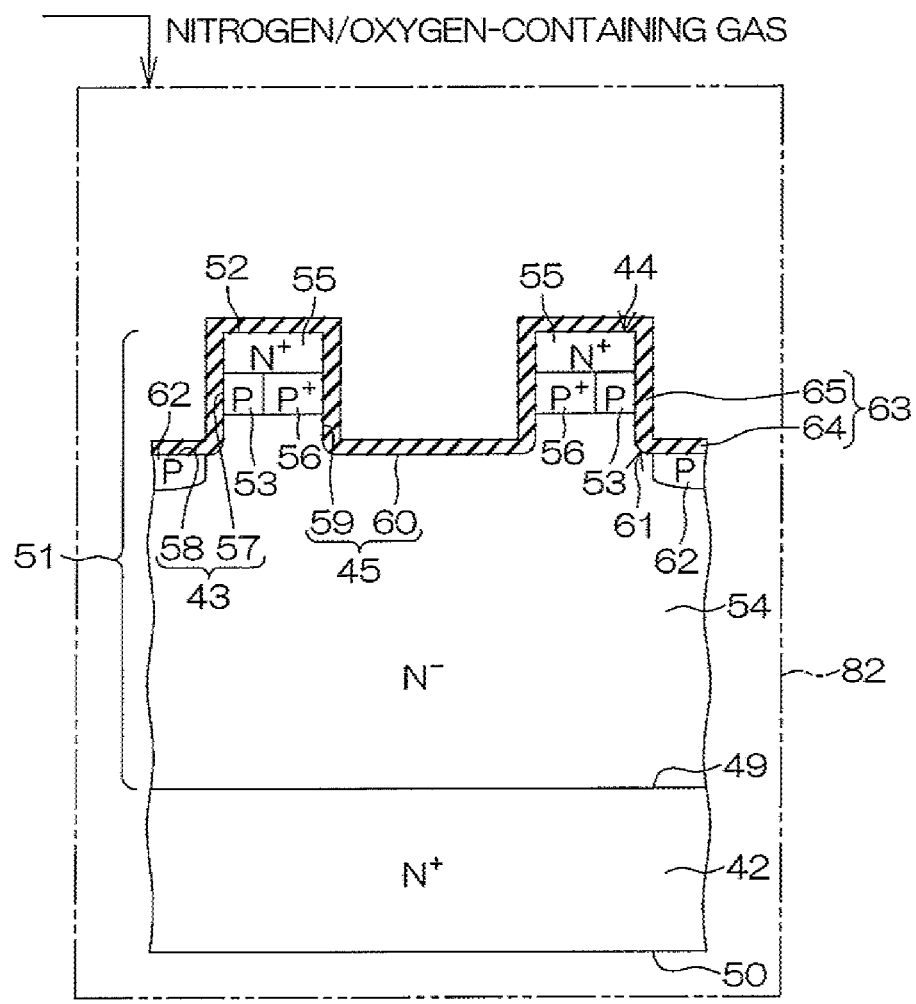

In the temperature-drop control, the heating temperature is controlled (temperature-drop-controlled) to drop from 1600° C. to 1300° C. over 15 to 30 minutes, for example, as shown in FIG. 6. After the temperature drop, nitrogen/oxygen-containing gas is introduced into the resistance heating furnace 82 for 5 to 10 minutes, for example, while the heating temperature is held at 1300° C. (third temperature holding). Due to the introduction of the nitrogen/oxygen-containing gas, the carbon film 83 is oxidized and removed by reacting with oxygen contained in the gas, as shown in FIG. 5N. The introduced nitrogen/oxygen-containing gas can be prepared from gas containing at least $N_2O$ (dinitrogen oxide), and may contain NO (nitrogen monoxide). The $N_2O$ gas is fed at a flow rate of not more than 30%, preferably 1 to 30% with respect to the total flow rate of the introduced gas.

Thereafter the heating temperature is further held at 1300° C. (fourth temperature holding) for 200 to 240 minutes, for example, while the nitrogen/oxygen-containing gas is introduced into the resistance heating furnace 82 at the same flow rate. Thus, the surface 52 of the epitaxial layer 51 is oxidized, and a silicon oxynitride film (the gate insulating film 63) covering the overall region of the surface 52 is formed, as shown in FIG. 5O.

After the formation of the gate insulating film 63, the inert gas ($N_2$, Ar or the like, for example) is reintroduced into the resistance heating furnace 82, while the heating temperature is controlled to drop from 1300° C. to 300° C. After the temperature drop, the SiC substrate 42 is taken out from the resistance heating furnace 82.

Figure 5P:
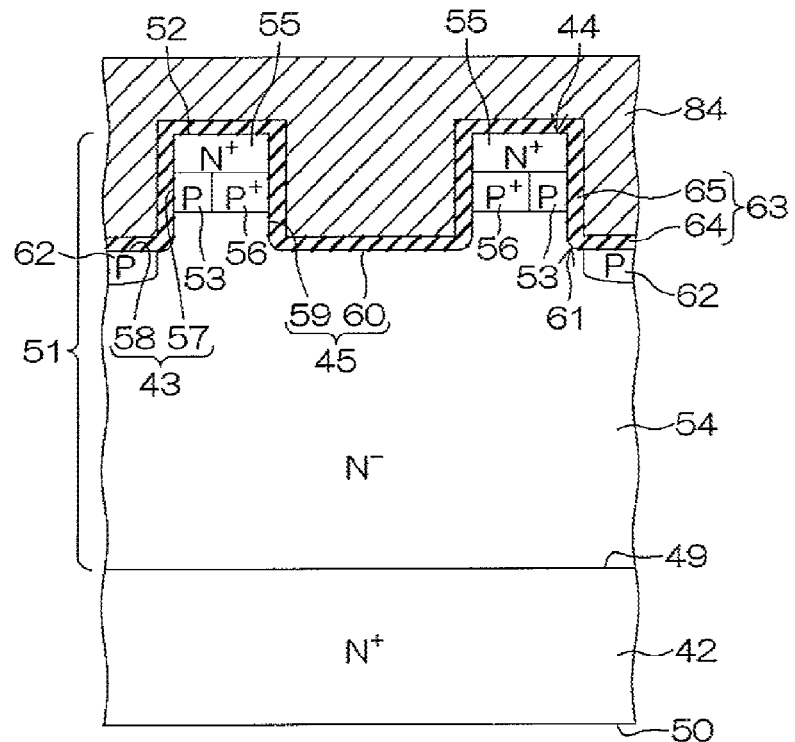

Then, a doped polysilicon material 84 is deposited from above the epitaxial layer 51 by CVD, as shown in FIG. 5P. The polysilicon material 84 is continuously deposited until at least the gate trench 43 and the source trench 45 are filled up therewith.

Figure 5Q:
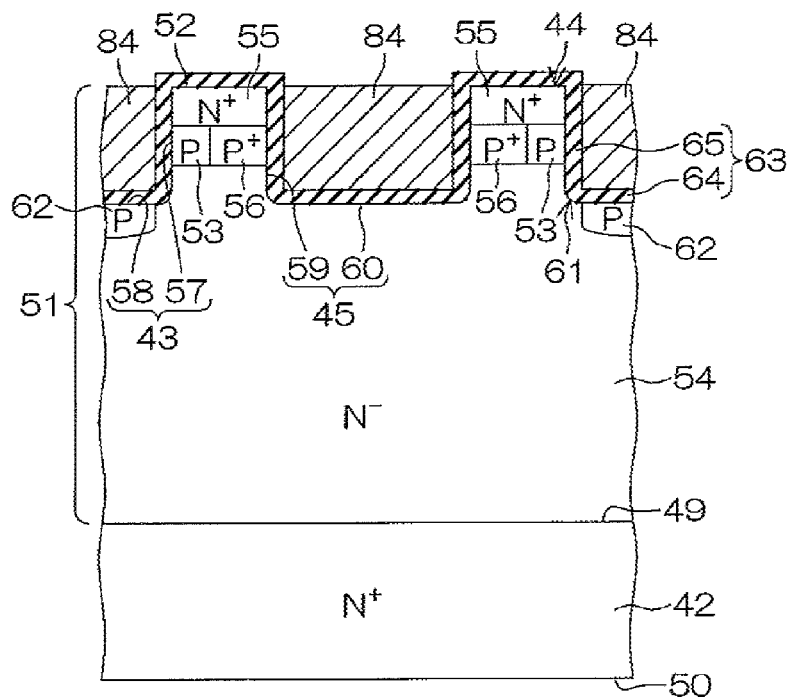

Thereafter the deposited polysilicon material 84 is etched back until the etched-back surface is flush with the surface 52 of the epitaxial layer 51, as shown in FIG. 5Q.

Figure 5R:
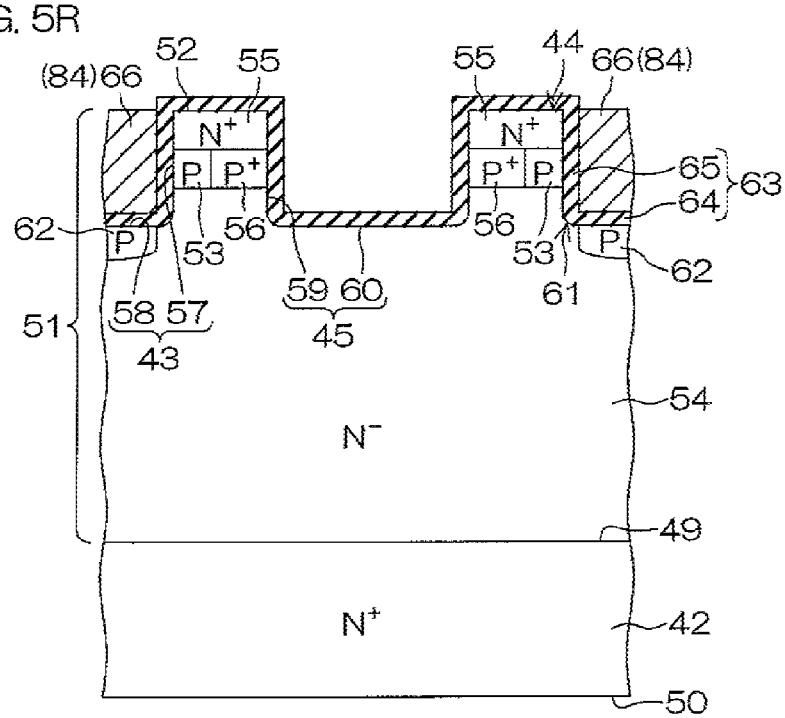

Then, only the portion of the polysilicon material 84 remaining in the source trench 45 is removed by dry etching, as shown in FIG. 5R. Thus, the gate electrode 66 is formed by the polysilicon material 84 remaining in the gate trench 43.

Figure 5S:
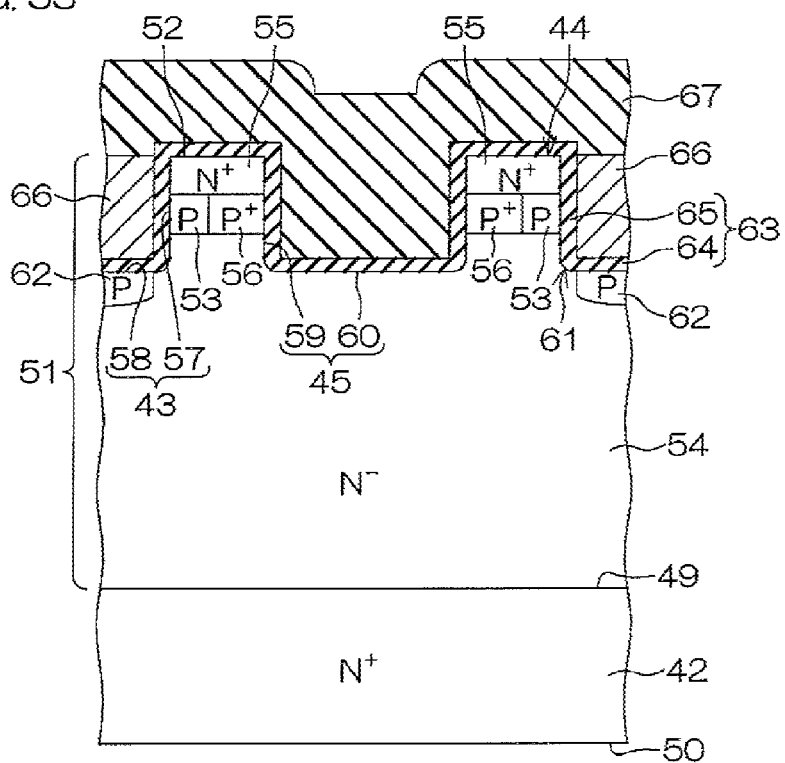

Then, the interlayer dielectric film 67 made of $SiO_2$ is laminated on the epitaxial layer 51 by CVD, as shown in FIG. 5S.

Figure 5T:
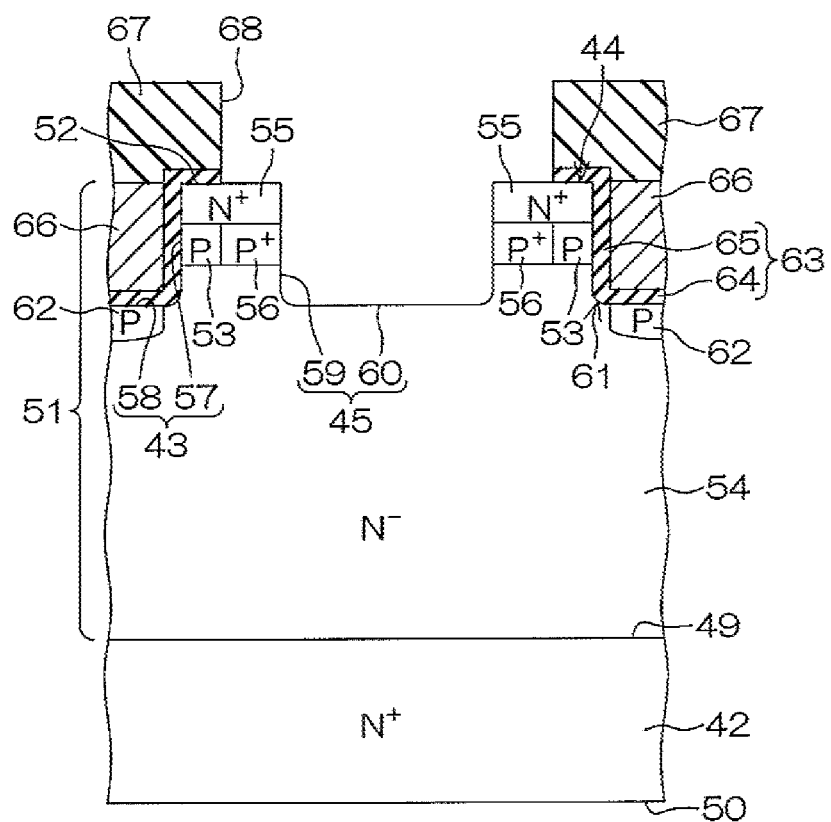

Then, the interlayer dielectric film 67 and the gate insulating film 63 are continuously patterned, whereby the contact hole 68 is formed in the interlayer dielectric film 67 and the gate insulating film 63, as shown in FIG. 5T.

Then, a polysilicon material is deposited by CVD to fill up the contact hole 68, as shown in FIG. 5U. Thereafter an N- or P-type impurity is implanted into the deposited polysilicon material. While the implantation conditions vary with the type of the N- or P-type impurity, acceleration energy is 10 to 100 keV, for example. Thereafter the impurity is diffused at a temperature of 900° C. for 20 minutes, for example. Thus, the polysilicon layer 70 doped with the impurity in a high concentration is formed. Then, Ti and TiN are deposited in this order on the surface of the polysilicon layer 70 by a method such as sputtering or vapor deposition, and the intermediate layer 71 is formed. Then, a metal such as Al is deposited on the surface of the intermediate layer 71 by a method such as sputtering or vapor deposition, and the metal layer 72 is formed. Thus, the source wire 69 is formed. Then, the drain electrode 74 is formed on the rear surface 50 of the SiC substrate 42.

Thereafter the semiconductor device 41 shown in FIG. 4 is obtained by forming the interlayer dielectric film (not shown), the source pad 46 and the gate pad 48.

In the semiconductor device 41, as hereinabove described, the gate trench 43 is dug from the surface 52 (the Si surface) of the epitaxial layer 51 made of SiC, similarly to the semiconductor device 1 according to the first embodiment. Therefore, oxidation of the inner surfaces of the gate trench 43 (see FIG. 5O) progresses under the condition that the oxidation rate for the bottom surface 58 having the Si surface and that for the side surfaces 57 orthogonal to the Si surface satisfy the following relational expression:

Oxidation rate for bottom surface 58/oxidation rate for side surface 57<0

In the aforementioned method, the inner surfaces of the gate trench 43 are oxidized not by thermal oxidation (dry oxidation) employing $O_2$ gas or thermal oxidation (wet oxidation) employing $H_2O$ (water vapor) gas, but by thermal oxidation employing nitrogen/oxygen-containing gas. Further, the implantation active layer 62 into which the P-type impurity has been implanted is formed immediately under the bottom surface 58 of the gate trench 43. Therefore, the ratio (oxidation rate for bottom surface 58/oxidation rate for side surface 57) of the oxidation rate for the bottom surface 58 to that for the side surfaces 57 can be increased as compared with a case where the gate insulating film 63 is formed by dry oxidation or wet oxidation.

In the gate insulating film 63 formed in the aforementioned manner, the ratio (thickness $T_4$/thickness $T_3$) of the thickness $T_4$ of the insulating film bottom portion 64 to the thickness $T_3$ of the insulating film side portions 65 is in the range of 0.3 to 1.0.

In other words, even if the thickness $T_4$ of the insulating film bottom portion 64 is increased so that dielectric breakdown can be suppressed, excessive increase in the thickness $T_3$ of the insulating film side portions 65 can be suppressed due to the lower limit of 0.3 of the ratio (thickness $T_4$/thickness $T_3$). When the thickness $T_4$ of the insulating film bottom portion 64 is designed to a proper value, on the other hand, the thickness $T_3$ of the insulating film side portions 65 is not excessively reduced, due to the upper limit of 1.0. Consequently, dielectric breakdown of the insulating film bottom portion 64 can be suppressed while suppressing increase in the thickness $T_3$ of the insulating film side portions 65 by properly designing the thickness $T_4$ of the insulating film bottom portion 64.

The gate insulating film 63 consists of the silicon oxynitride film formed by thermal oxidation employing nitrogen-containing gas, whereby channel mobility of the VDMOS-FET can be improved.

The implantation active layer 62 is formed immediately under the gate trench 43, whereby an energy barrier formed between the implantation active layer 62 and the epitaxial layer 51 can be enlarged. Therefore, a current can be rendered hardly flowable to the implantation active layer 62. Consequently, the electric field concentration on the bottom surface 58 of the gate trench 43 can be suppressed.

The source trench 45 is formed at the center of each unit cell 44 surrounded by the gate trench 43, whereby congestion of equipotential lines can be suppressed in the vicinity of both end corner portions 61 of the gate trench 43. Consequently, the electric field applied to both end corner portions 61 on the bottom portion of the gate trench 43 can be relaxed, whereby the insulating film bottom portion 64 can be prevented from dielectric breakdown.

The source trench 45 may be deeper than the gate trench 43, as in a semiconductor device 85 shown in FIG. 7. Thus, the electric field applied to both end corner portions 61 on the bottom portion of the gate trench 43 can be further relaxed.

In the semiconductor device 41, the source wire 69 has the polysilicon layer 70 in the portion in contact with the source region 55 and the body contact region 56, whereby the same can be brought into ohmic contact with both of the body contact region 56 and the source region 55, which are high-concentration impurity regions.

When the semiconductor device 41 is manufactured, therefore, a step of forming an Ni layer on the surface 52 of the epitaxial layer 51 can be omitted dissimilarly to a case where a layer made of only a metal such as Al is directly brought into contact with the impurity regions, and a step of silicifying such an Ni layer can also be omitted. Thus, the surface 52 of the epitaxial layer 51 can be prevented from formation of a carbon layer.

Consequently, layer peeling can be suppressed between the source wire 69 and the epitaxial layer 51. Thus, connection reliability of the source wire 69 can be improved.

Further, the layer (the polysilicon layer 70) entering the source trench 45 to come into contact with the drain region 54, the body contact region 56 and the source region 55 is made of polysilicon excellent in coverage, whereby coverage of the source wire 69 can be improved. Consequently, the connection reliability of the source wire 69 can be further improved.

In addition, the intermediate layer 71 having the multilayer structure of the Ti layer and the TiN layer is interposed between the polysilicon layer 70 and the metal layer 72. A material containing Ti has excellent adhesiveness with respect to both of a polysilicon material and a metal material. Therefore, adhesiveness between the polysilicon layer 70 and the metal layer 72 can be improved. Consequently, the connection reliability of the source wire 69 can be further improved.

When the metal layer 72 contains Al, the TiN layer can be utilized as a barrier layer for preventing diffusion of Al from the metal layer 72 into the silicon layer 70, whereby excessive Al can be prevented from diffusing into the polysilicon layer 70. Consequently, the impurity concentration in the polysilicon layer 70 can be stabilized, whereby the resistance of the polysilicon layer 70 can also be stabilized.

An embodiment related to the invention of a method of manufacturing an SiC semiconductor device through a resistance heating furnace is now described.

FIG. 8 is a schematic sectional view of a planar gate semiconductor device.

A semiconductor device 101 has a structure obtained by arranging a plurality of unit cells of a planar gate VDMOS-FET in the form of a matrix. FIG. 8 shows only part of the plurality of unit cells.

The semiconductor device 101 includes an $N^+$-type SiC substrate 102 forming the base of the semiconductor device 101. An $N^-$-type epitaxial layer 103 made of SiC (silicon carbide) doped with an N-type impurity in a lower concentration than the SiC substrate 102 is laminated on a surface 121 of the SiC substrate 102. A surface 131 of the epitaxial layer 103 is constituted of a (0001) plane of SiC, for example.

An N⁻-type drain region 104 maintaining a state after epitaxy is formed on the epitaxial layer 103.

A P-type body region 105 is formed on a surface layer portion of the epitaxial layer 103. A plurality of such body regions 105 (not shown in FIG. 8) are formed at regular intervals to parallelly extend in the same direction (a direction perpendicular to the plane of FIG. 8), and arranged in a striped manner or in the form of a matrix, for example. The drain region 104 is exposed between two body regions 105 adjacent to each other.

On a surface layer portion of the body region 105, an N⁺-type source region 106 is formed at an interval from the peripheral edge thereof.

A gate insulating film 107 extending over the drain region 104, the body region 105 and the source region 106 is formed on the surface 131 of the epitaxial layer 103. The gate insulating film 107 is made of $SiO_2$.

A gate electrode 108 made of polysilicon doped with an N-type impurity in a high concentration is formed on the gate insulating film 107. The gate electrode 108 is opposed to the drain region 104, the body region 105 and the source region 106 through the gate insulating film 107.

An interlayer dielectric film 109 made of $SiO_2$ is laminated on the epitaxial layer 103. A source wire 111 is formed on the interlayer dielectric film 109. The source wire 111 is electrically connected to the body region 105 and the source region 106 through a contact hole 110 formed in the interlayer dielectric film 109.

A gate wire 112 is electrically connected to the gate electrode 108 through a contact hole (not shown) formed in the interlayer dielectric film 109.

A drain electrode 113 is formed on the rear surface of the SiC substrate 102.

When the source wire 111 is grounded and the potential of the gate electrode 108 is controlled while applying a positive voltage of a proper level to the drain electrode 113, a channel can be formed in the vicinity of the interface between the body region 105 and the gate insulating film 107 due to an electric field from the gate electrode 108. Thus, a current can be fed between the source wire 111 and the drain electrode 113.

FIGS. 9A to 9L are schematic sectional views for illustrating a method of manufacturing the semiconductor device 101 shown in FIG. 8 in step order.

Figure 9A:
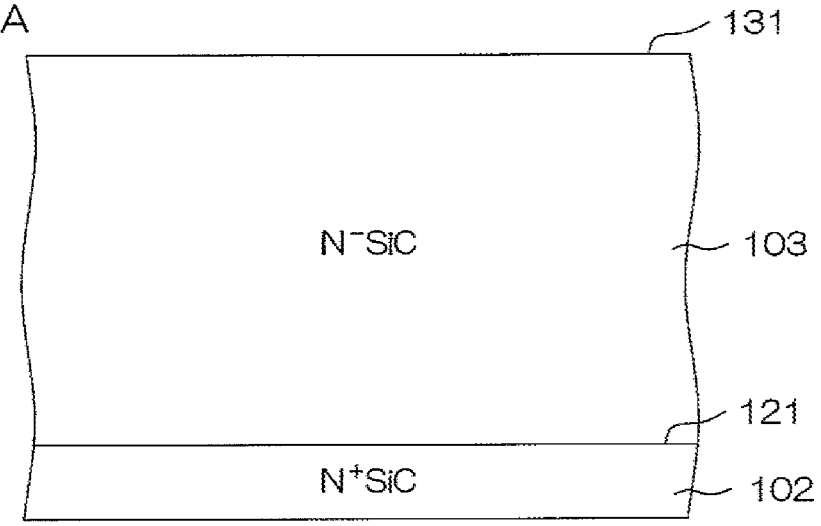

First, the epitaxial layer 103 is formed on the surface 121 of the SiC substrate 102 by epitaxy, as shown in FIG. 9A. At this time, a major growth surface (the surface 121) of the SiC substrate 102 is defined by a (0001) plane. Due to the surface 121 of the SiC substrate 102 defined by the (0001) plane, the epitaxial layer 103 formed on the SiC substrate 102 by epitaxy is grown also with a major surface defined by a (0001) plane. Therefore, the surface 131 of the epitaxial layer 103 parallel to the surface 121 of the SiC substrate 102 is defined by the (0001) plane.

Figure 9B:
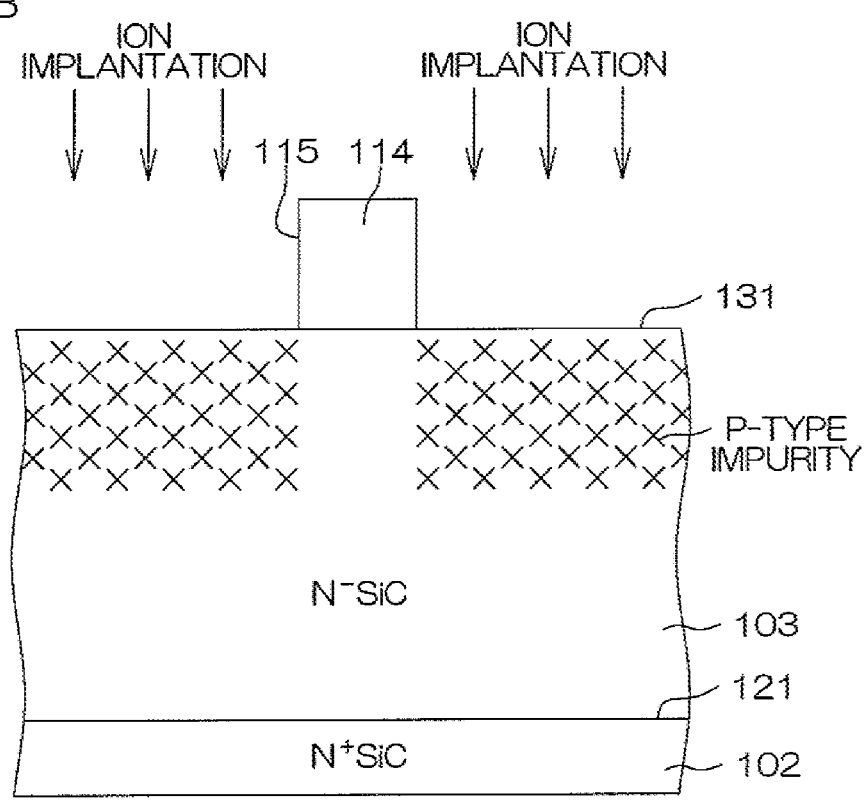

Then, a photoresist film 114 having an opening 115 in a portion opposed to a region for forming the body region 105 is formed on the surface 131 of the epitaxial layer 103 by well-known photolithography. Then, ions (boron ions, for example) of a P-type impurity are introduced into the surface 131 of the epitaxial layer 103 from above the photoresist film 114. Thus, the P-type impurity is implanted into surface layer portions of portions of the epitaxial layer 103 exposed from the opening 115, as shown in FIG. 9B.

Figure 9C:
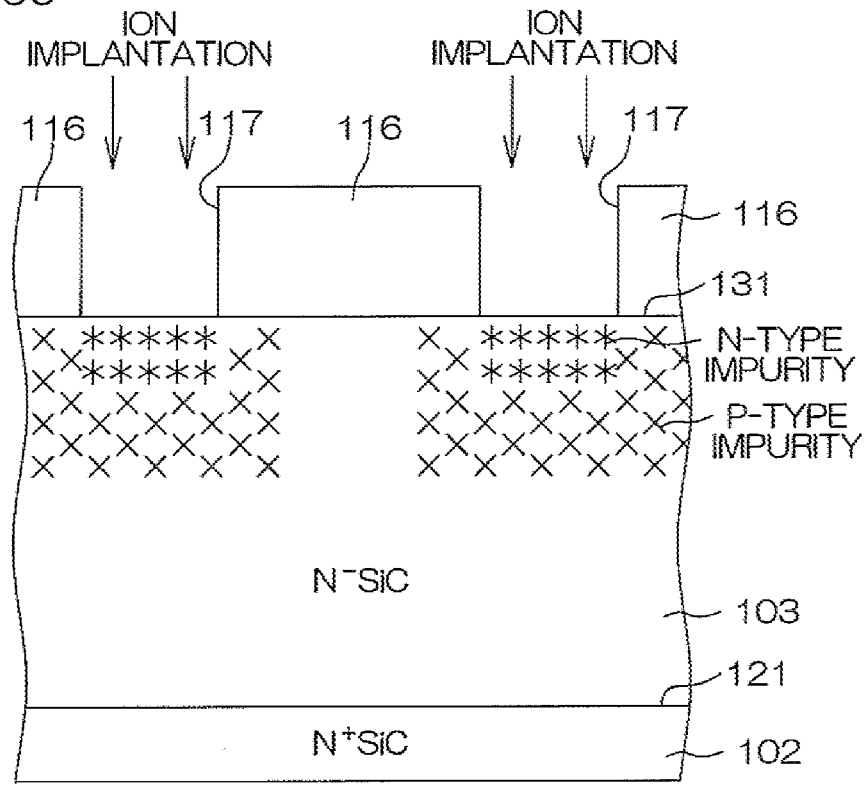

Then, a photoresist film 116 having an opening 117 in a portion opposed to a region for forming the source region 106 is formed on the surface 131 of the epitaxial layer 103 by well-known photolithography. Then, ions (arsenic ions, for example) of an N-type impurity are introduced into the surface 131 of the epitaxial layer 103 from above the photoresist film 116. Thus, the N-type impurity is implanted into a surface layer portion (closer to the surface 131 than the portions into which the P-type impurity has been implanted) of a portion of the epitaxial layer 103 exposed from the opening 117, as shown in FIG. 9C.

Figure 9D:
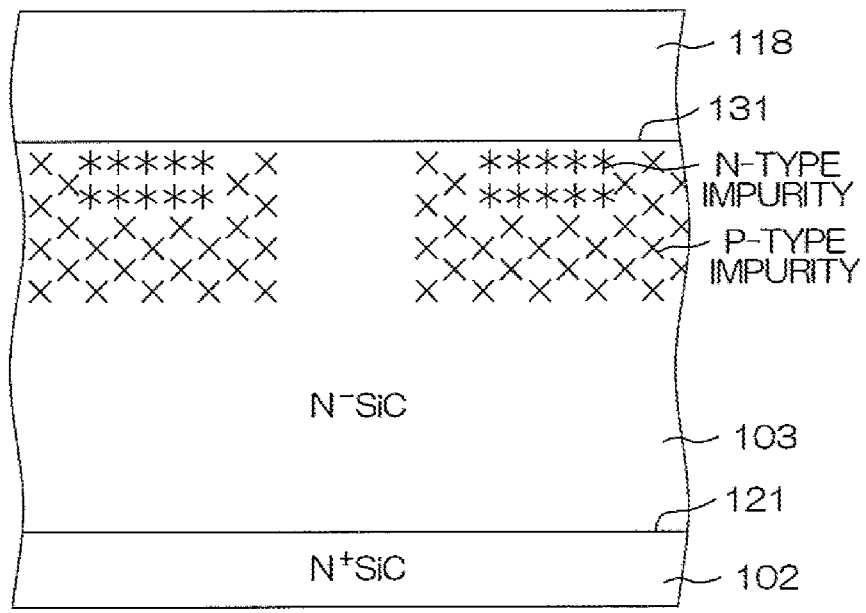

After the implantation of the impurity ions into the surface layer portion of the epitaxial layer 103, an organic material film 118 is formed on the overall region of the surface 131 of the epitaxial layer 103, as shown in FIG. 9D. The organic material film 118 is made of a material containing carbon, to which an organic material (polyimide or the like, for example) employed as a photoresist material or the like can be applied, for example. The organic material film 118 is formed with a spin coater or the like, for example.

After the formation of the organic material film 118, the SiC substrate 102 is charged into a resistance heating furnace 122. The resistance heating furnace 122 is not particularly restricted, so far as airtightness in the resistance heating furnace 122 in which a heated object is set can be ensured and gas can be introduced thereinto. Further, the heating system of the resistance heating furnace 122 may be either direct heating or indirect heating.

When the SiC substrate 102 is set in the resistance heating furnace 122, inert gas ($N_2$, Ar or the like, for example) is introduced into the resistance heating furnace 122, which in turn is subjected to temperature-rise control (first temperature-rise control).

In the first temperature-rise control, the heating temperature is controlled to rise from 100° C. to 1000° C. over 35 to 45 minutes, for example, and thereafter held at 1000° C. (first temperature holding) for 5 to 10 minutes, for example, as shown in FIG. 6. Due to the temperature rise and the temperature holding, elements other than carbon evaporate from the organic material film 118, which in turn is altered into a carbon film 119, as shown in FIG. 9E. Therefore, the overall region of the surface 131 of the epitaxial layer 103 is covered with the carbon film 119.

Then, the resistance heating furnace 122 is subjected to further temperature-rise control (second temperature-rise control) while the inner portion thereof is kept in the inert atmosphere.

In the second temperature-rise control, the heating temperature is controlled to rise from 1000° C. to 1600° C. over 30 to 60 minutes, for example, as shown in FIG. 6. After the temperature rise, the heating temperature is held at 1600° C. (second temperature holding) for 5 to 10 minutes, for example. Due to the temperature rise and the temperature holding, ions of the N- and P-type impurities implanted into the surface layer portion of the epitaxial layer 103 are activated, and the body region 105 and the source region 106 are formed on the surface layer portion of the epitaxial layer 103, as shown in FIG. 9F. Further, the drain region 104 isolated from the body region 105 while maintaining the state after the epitaxy is formed on a base layer portion of the epitaxial layer 103.

Then, the resistance heating furnace 122 is subjected to temperature-drop control while the inner portion thereof is kept in the inert atmosphere.

In the temperature-drop control, the heating temperature is controlled (temperature-drop-controlled) to drop from 1600° C. to 1300° C. over 15 to 30 minutes, for example, as shown in FIG. 6. After the temperature drop, oxygen-containing gas is introduced into the resistance heating furnace 122 for 5 to 10 minutes, for example, while holding the heating temperature at 1300° C. (third temperature holding). Due to the introduction of the oxygen-containing gas, the carbon film 119 is oxidized and removed by reacting with oxygen contained in the oxygen-containing gas, as shown in FIG. 9G. The oxygen-containing gas introduced into the resistance heating furnace 122 is preferably prepared from gas containing oxygen and nitrogen. More specifically, gas containing NO (nitrogen monoxide) or $N_2O$ (dinitrogen oxide) can be employed.

Figure 9H:
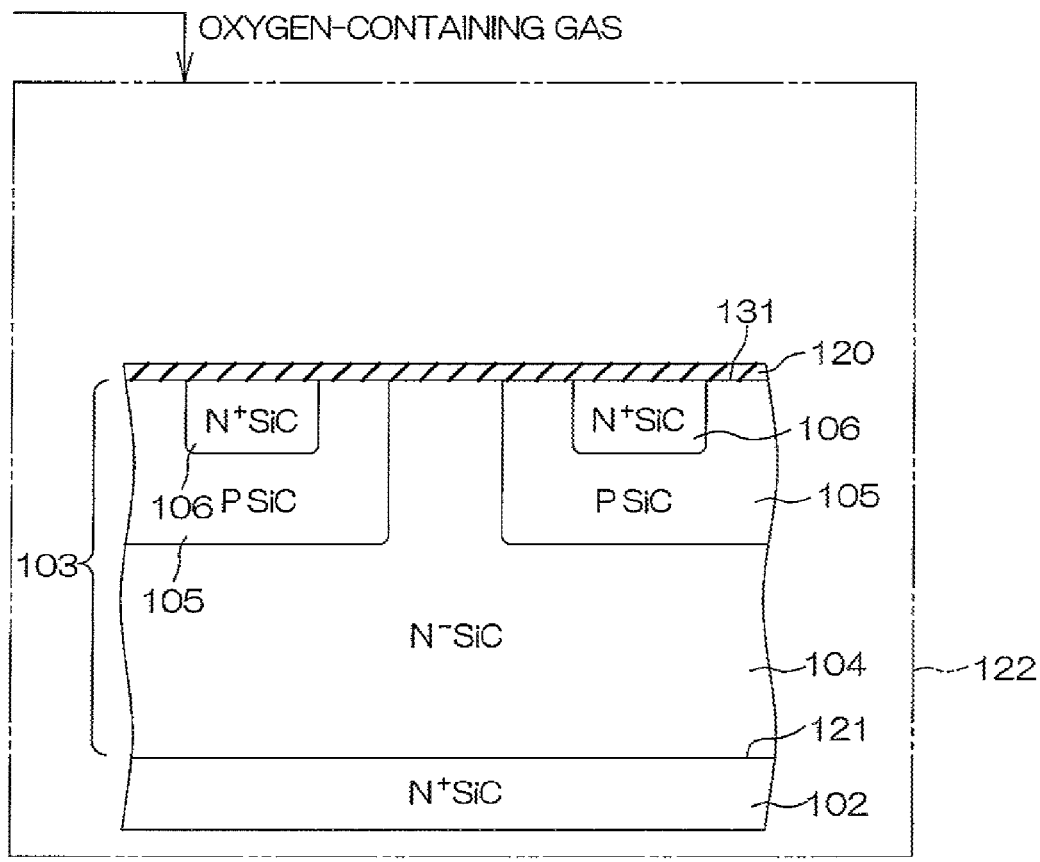

Thereafter the heating temperature is further held at 1300° C. (fourth temperature holding) for 200 to 240 minutes, for example, while the oxygen-containing gas is introduced into the resistance heating furnace 122. Thus, the surface 131 of the epitaxial layer 103 is oxidized, and an oxide film 120 covering the overall region of the surface 131 is formed, as shown in FIG. 9H.

After the formation of the oxide film 120, the inert gas ($N_2$, Ar or the like, for example) is reintroduced into the resistance heating furnace 122, while the heating temperature is controlled to drop from 1300° C. to 300° C. After the temperature drop, the SiC substrate 102 is taken out from the resistance heating furnace 122.

Figure 9I:
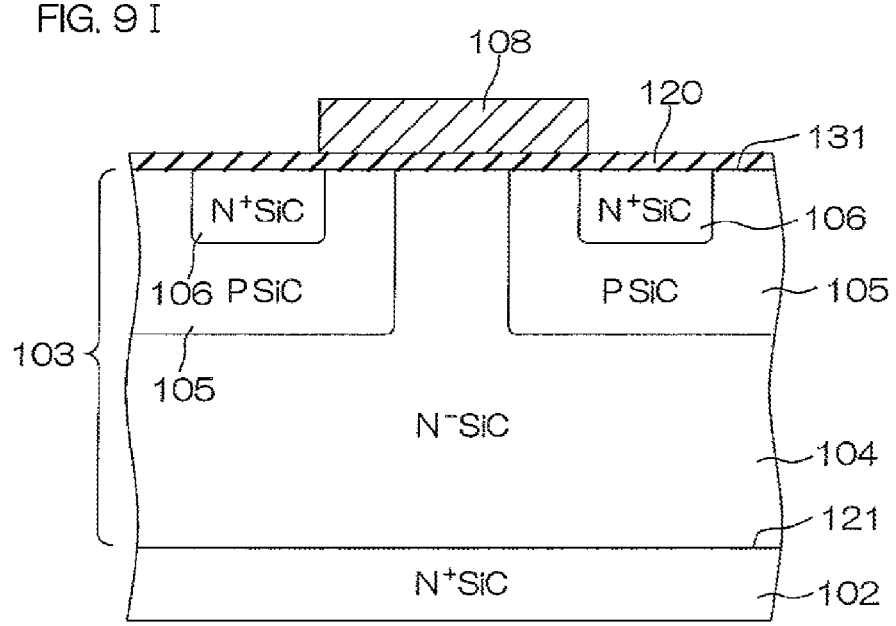

Then, a conductive material film is formed by sputtering. Then, the conductive material film is patterned by well-known photolithography and etching, and the gate electrode 108 is formed on the oxide film 120, as shown in FIG. 9I.

Figure 9J:
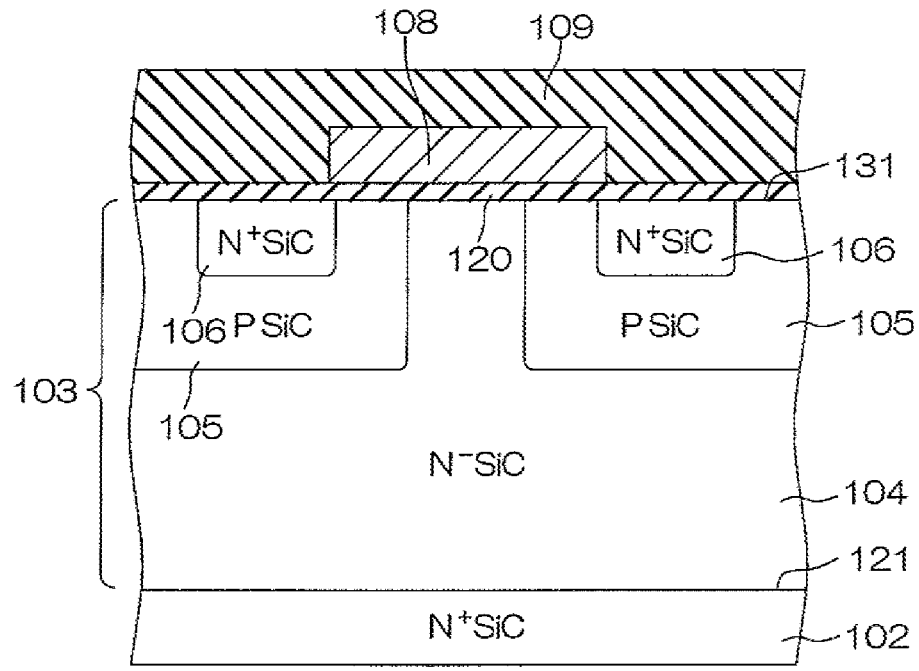

Thereafter the interlayer dielectric film 109 is laminated on the epitaxial layer 103 by CVD (Chemical Vapor Deposition), as shown in FIG. 9J.

Figure 9K:
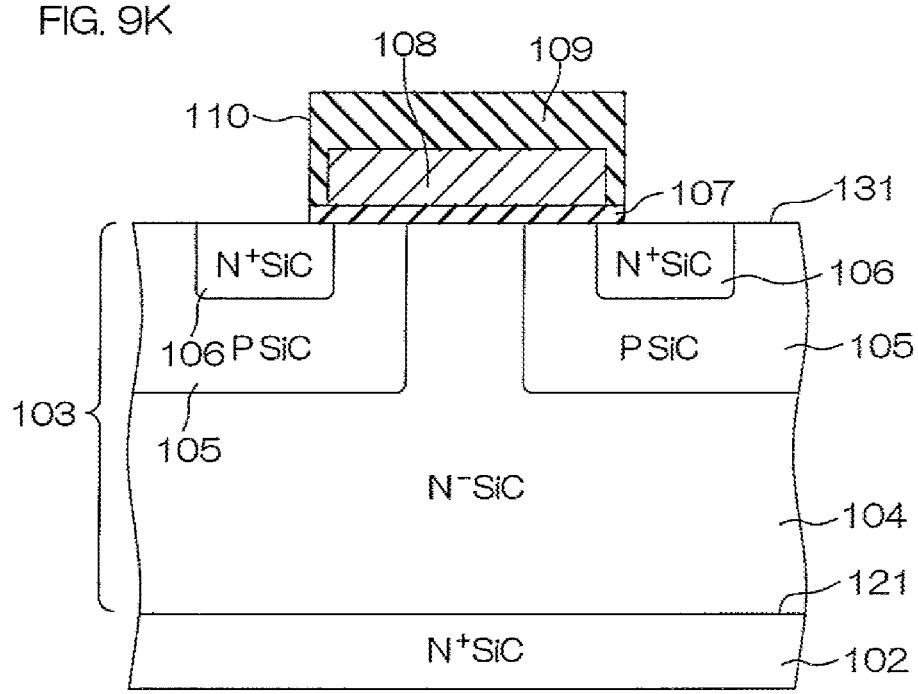

Then, the contact hole 110 is formed in the interlayer dielectric film 109 and the oxide film 120 by well-known photolithography and etching, as shown in FIG. 9K. The remaining portion of the oxide film 120 forms the gate insulating film 107.

Then, a film of a conductive material is formed on the epitaxial layer 103 by sputtering. The conductive material is bonded (deposited) to fill up the contact hole 110 and form a thin film on the interlayer dielectric film 109. Then, the conductive material film formed on the interlayer dielectric film 109 is patterned by well-known photolithography and etching. Thus, the source wire 111 is formed, as shown in FIG. 9L. Further, the gate wire 112 electrically connected with the gate electrode 108 is formed. In addition, the drain electrode 113 is formed on the rear surface of the SiC substrate 102.

The semiconductor device 101 shown in FIG. 8 is obtained through the aforementioned steps.

According to the aforementioned method, the organic material film 118 is heated in the resistance heating furnace 122 by the first temperature-rise control after the formation of the organic material film 118 to be altered into the carbon film 119, which is formed on the surface 131 of the epitaxial layer 103.

After the formation of the carbon film 119, the epitaxial layer 103 is heated due to the second temperature-rise control in the resistance heating furnace 122 while the inner portion thereof is kept in the inert atmosphere, thereby activating the ions of the N- and P-type impurities in the epitaxial layer 103.

Then, the temperature-drop control (temperature drop from 1600° C. to 1300° C., for example) is executed while maintaining the resistance heating furnace 122 in the inert state. Thereafter the oxygen-containing gas is introduced for 5 to 10 minutes, for example, while the heating temperature is held at 1300° C. (the third temperature holding). Thus, the carbon film 119 is oxidized and removed, and the surface 131 of the epitaxial layer 103 is exposed.

After the removal of the carbon film 119, the resistance heating furnace 122 is subjected to the temperature holding (the fourth temperature holding) while the oxygen-containing gas is continuously introduced thereinto, whereby the exposed surface 131 is oxidized and the oxide film 120 is formed.

The carbon film 119 is formed on the surface 131 of the epitaxial layer 103 in advance of the heating (the second temperature-rise control) for activating the ions, whereby Si escape from the surface 131 can be prevented when the epitaxial layer 103 is heated. Therefore, roughening of the surface 131 of the epitaxial layer 103 can be suppressed, and planarity of the surface 131 can be maintained. Consequently, the interface between the epitaxial layer 103 and the gate insulating film 107 can be smoothed, whereby channel mobility of the semiconductor device 101 can be improved.

Further, the four steps of altering the organic material film 118 into the carbon film 119 by heating the same (the first temperature-rise control), activating the ions by heating the epitaxial layer 103 (the second temperature-rise control), oxidizing and removing the carbon film 119 with the oxygen-containing gas (the temperature-drop control and the third temperature holding) and forming the oxide film 120 by oxidizing the surface 131 of the epitaxial layer 103 (the fourth temperature holding) can be continuously carried out in the single resistance heating furnace 122. No apparatus for removing the carbon film 119 or the like is additionally required, whereby increase in the device cost can also be suppressed. Further, the resistance heating furnace 122 is so employed that the first temperature-rise control, the second temperature-rise control, the temperature-drop control as well as the third temperature holding, and the fourth temperature holding can be precisely and simply executed.

In addition, the surface 131 of the epitaxial layer 103 on which the oxide film 120 is formed is defined by the (0001) plane, and the oxygen-containing gas introduced into the resistance heating furnace 122 is prepared from the gas containing oxygen and nitrogen.

When oxide films are formed by oxidizing (0001) planes of SiC layers with $O_2$ gas, $H_2O$ gas (water vapor) and $N_2O$ gas respectively, for example, MOSFETS including the SiC layers exhibit channel mobility values of 1 to 5 $cm^2/V \cdot s$, 5 to 15 $cm^2/V \cdot s$ and 15 to 25 $cm^2/V \cdot s$ respectively, for example. In other words, the MOSFET including the SiC layer having the oxide film formed with the $N_2O$ gas is most excellent in channel mobility.

In the semiconductor device 101 according to the embodiment, the oxide film 120 is formed by oxidizing the (0001) plane (the surface 131) of the epitaxial layer 103 with NO gas or $N_2O$ gas, whereby the channel mobility of the semiconductor device 101 can be further improved.

EXAMPLES

While the present invention is now described with reference to Example and comparative examples, the present invention is not restricted by the following Examples.

Example 1

$N_2O$ Oxidation

First, an epitaxial layer made of SiC was formed by growing an SiC crystal on an Si surface of a wafer-shaped SiC substrate (by Cree Inc.) while doping the same with an N-type impurity. Then, a trench was formed by forming an $SiO_2$ mask of a prescribed pattern on the surface (an Si surface) of the epitaxial layer and introducing $SF_6/O_2$ gas into the surface of the epitaxial layer through the $SiO_2$ mask.

Then, the SiC substrate was introduced into a diffusion furnace, and N₂O gas was fed for 3 hours while heating the diffusion furnace to 1275° C. Thus, an oxide film was formed by oxidizing the inner surface of the trench.

Other oxide films were formed similarly to the above, by setting the times (oxidation times) for feeding N₂O gas to 8 hours and 12 hours respectively.

Comparative Example 1

Dry Oxidation

Steps similar to those in Example 1 were carried out up to a step of forming a trench. After the formation of the trench, an SiC substrate was introduced into a diffusion furnace, and O₂ gas was fed for 4 hours while heating the diffusion furnace to 1150° C. Thus, an oxide film was formed by oxidizing the inner surface of the trench.

Other oxide films were formed similarly to the above, by setting the times (oxidation times) for feeding O₂ gas to 6 hours and 8 hours respectively.

Comparative Example 2

Wet Oxidation

Steps similar to those in Example 1 were carried out up to a step of forming a trench. After the formation of the trench, an SiC substrate was introduced into a diffusion furnace, and water vapor (H₂O gas) was fed for 15 minutes while heating the diffusion furnace to 1275° C. Thus, an oxide film was formed by oxidizing the inner surface of the trench.

Other oxide films were formed similarly to the above, by setting the times (oxidation times) for feeding H₂O gas to 25 minutes and 35 minutes respectively.

1) Measurement of Thickness of Oxide Film

The thicknesses of the oxide films formed according to Example 1 and comparative examples 1 and 2 were measured on portions located on the side surfaces of the trenches and those located on the bottom surfaces of the trenches. FIGS. 10A, 10B and 10C show the results of Example 1 and comparative examples 1 and 2 respectively.

2) Thickness Ratio of Oxide Film

The ratios (bottom surface/side surface) of the thicknesses of the portions of the oxide films located on the bottom surfaces to those of the portions located on the side surfaces were calculated through the thicknesses of the oxide films shown in FIGS. 10A to 10C respectively. FIGS. 10A to 10C also show the results.

Referring to FIG. 10A, it has been confirmed that the ratios (bottom surface/side surface) of the thicknesses of the portions of the oxide films located on the bottom surfaces to those of the portions located on the side surfaces were about 0.54 (feeding time: 3 hours), 0.46 (feeding time: 8 hours) and 0.48 (feeding time: 12 hours) respectively.

Referring to FIG. 10B, it has been confirmed that the ratios (bottom surface/side surface) of the thicknesses of the portions of the oxide films located on the bottom surfaces to those of the portions located on the side surfaces were about 0.20 (feeding time: 4 hours), 0.20 (feeding time: 6 hours) and 0.19 (feeding time: 8 hours) respectively.

Referring to FIG. 10C, it has been confirmed that the ratios (bottom surface/side surface) of the thicknesses of the portions of the oxide films located on the bottom surfaces to those of the portions located on the side surfaces were about 0.23 (feeding time: 15 minutes), 0.21 (feeding time: 25 minutes) and 0.22 (feeding time: 35 minutes) respectively.

While the embodiments of the present invention have been described, the present invention may be embodied in other ways.

For example, the conductivity types of the semiconductor portions of the semiconductor device 1, 41 or 85 may be reversed. In other words, the P-type portions may be replaced with N-type portions and vice versa in the semiconductor device 1, 41 or 85.

Each of the source wire 17 or 69 and the drain wire 23 (the drain electrode 74) may have a multilayer structure formed by a layer prepared by silicifying nickel (Ni) or titanium (Ti) and the aforementioned metal layer.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

What is claimed is:

1. A semiconductor device comprising:
   a semiconductor layer made of SiC;
   a source region formed in the semiconductor layer, the source region forming a surface of the semiconductor layer;
   a body region formed in the semiconductor layer, the body region being in contact with the source region from a side of a back surface of the semiconductor layer;
   a drain region formed in the semiconductor layer, the drain region being in contact with the body region from the side of the back surface of the semiconductor layer;
   a gate trench dug down in the semiconductor layer from the surface thereof, the gate trench passing through the source region and the body region and the deepest portion thereof reaching the drain region;
   a gate insulating film formed on an inner surface of the gate trench, the gate insulating film having a bottom portion located on the bottom surface thereof and a side portion located on the side surface thereof, the thickness of the bottom portion and the thickness of the side portion being different from each other;
   a gate electrode embedded in the gate trench on the gate insulating film;
   a source wiring formed on the semiconductor layer and in contact with the source region, the source wiring having a laminating structure a first source layer formed on the semiconductor layer and a second source layer formed on the first source layer, the first source layer and the second source layer made of conductive materials different from each other; and
   a source trench dug down in the semiconductor layer from the surface thereof, wherein
   the first source layer is conformal to a side surface and a bottom surface of the source trench,
   wherein the source wiring selectively forms a first junction with respect to the semiconductor layer, the first junction having a smaller junction barrier than the diffusion potential of a body diode intrinsic in the semiconductor device.

2. The semiconductor device according to claim 1, wherein a non-ohmic contact is selectively formed between the source wiring and the semiconductor layer.

3. The semiconductor device according to claim 1, wherein the gate trench and the source trench have the same depth.

4. The semiconductor device according to claim 2, wherein the source trench is deeper than the gate trench.

5. The semiconductor device according to claim 2, wherein the source region is an n⁺-type source region, the drain region is an n-type drain region, and the body region has a p-type region forming the side surface of the gate trench, and a $p^+$-type region forming the side surface of the source trench and having an impurity concentration larger than that of the p-type region.

6. The semiconductor device according to claim 5, wherein an ohmic contact is selectively formed between the source wiring and the $n^+$-type source region.

7. The semiconductor device according to claim 1, wherein the gate trench is formed to surround the source trench in plan view.

8. The semiconductor device according to claim 1, wherein the gate insulating film is a silicon oxynitride film formed by thermal oxidation with nitrogen-containing gas and the nitrogen content in the gate insulating film is 0.1 to 10%.

9. The semiconductor device according to claim 1, wherein the thickness of the bottom portion of the gate insulating film is 150 to 500 Å.

10. The semiconductor device according to claim 1, wherein the thickness of the side portion of the gate insulating film is 300 to 1000 Å.

* * * * *